US012757643B2

(12) United States Patent
Chu et al.

(10) Patent No.: US 12,757,643 B2
(45) Date of Patent: Oct. 6, 2026

(54) ELECTROSTATIC DISCHARGE PATH FOR PREVENTING PLASMA-INDUCED DAMAGE DURING PATTERNING OF PHASE CHANGE MATERIAL AND METHOD FOR FORMING THE SAME

(71) Applicant: Taiwan Semiconductor Manufacturing Company Limited, Hsinchu (TW)

(72) Inventors: Yen-Liang Chu, Hsinchu (TW); Hung-Ju Li, Hsinchu City (TW); Yi Ching Ong, Hsinchu (TW); Kuo-Chyuan Tzeng, Chu-Pei City (TW); Kuo-Ching Huang, Hsinchu City (TW); Harry-Hak-Lay Chuang, Zhubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 295 days.

(21) Appl. No.: 18/643,192

(22) Filed: Apr. 23, 2024

(65) Prior Publication Data

US 2025/0212705 A1 Jun. 26, 2025

Related U.S. Application Data

(60) Provisional application No. 63/612,551, filed on Dec. 20, 2023.

(51) Int. Cl.
*H10N 70/20* (2023.01)
*H10N 70/00* (2023.01)
(Continued)

(52) U.S. Cl.
CPC ......... *H10N 70/231* (2023.02); *H10N 70/021* (2023.02); *H10N 70/041* (2023.02);
(Continued)

(58) Field of Classification Search
None
See application file for complete search history.

(56) References Cited

U.S. PATENT DOCUMENTS

2022/0328474 A1* 10/2022 Or-Bach ............... G03F 9/7076
2023/0180644 A1* 6/2023 Gong ................... H10N 70/231
365/163
2023/0402241 A1 12/2023 Ting et al.

FOREIGN PATENT DOCUMENTS

CN 106601706 A 4/2017
CN 114650044 A 6/2022
TW 202324732 A 6/2023

OTHER PUBLICATIONS

Jianq Chyun Intellectual Property Office; Tw Application No. 113122031 Office Action mailed Mar. 11, 2025; 12 pages.

* cited by examiner

*Primary Examiner* — Nduka E Ojeh
(74) *Attorney, Agent, or Firm* — The Marbury Law Group, PLLC

(57) ABSTRACT

Dielectric material layers and an insulating layer may be formed over a semiconductor substrate containing a semiconductor region. A via opening may be etched through at least the insulating layer. A metal layer may be deposited and patterned to provide a heater element of a phase change memory (PCM) switch and an electrostatic discharge metal structure that fills the via opening. A phase change material layer may be deposited over the heater element and the electrostatic discharge metal structure. The phase change material layer may be patterned into a phase change material portion by performing an anisotropic etch process. An electrostatic discharge path including the electrostatic discharge metal structure and the doped semiconductor region discharges electrostatic charges that accumulate in the insu-
(Continued)

lating layer into the semiconductor substrate during the anisotropic etch process.

20 Claims, 47 Drawing Sheets

(51) Int. Cl.
*H10W 20/00* (2026.01)
*H10W 20/42* (2026.01)
*H10W 42/60* (2026.01)

(52) U.S. Cl.
CPC ......... *H10N 70/063* (2023.02); *H10N 70/066* (2023.02); *H10N 70/841* (2023.02); *H10N 70/8613* (2023.02); *H10W 20/081* (2026.01); *H10W 20/42* (2026.01); *H10W 42/60* (2026.01)

ELECTROSTATIC DISCHARGE PATH FOR PREVENTING PLASMA-INDUCED DAMAGE DURING PATTERNING OF PHASE CHANGE MATERIAL AND METHOD FOR FORMING THE SAME

RELATED APPLICATIONS

This application claims the benefit of priority from U.S. Provisional Application Ser. No. 63/612,551 entitled "Structure for Preventing Plasma Induced Damage (PID) During Semiconductor Process" and filed on Dec. 20, 2023, the entire contents of which are incorporated herein by reference for all purposes.

BACKGROUND

Phase change memory switches are useful devices that may mitigate interferences from external electromagnetic radiation, and may be used for various applications such as radio-frequency applications. Plasma-induced damage to a phase change material during patterning of the phase change material may adversely impact the performance of phase change memory switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
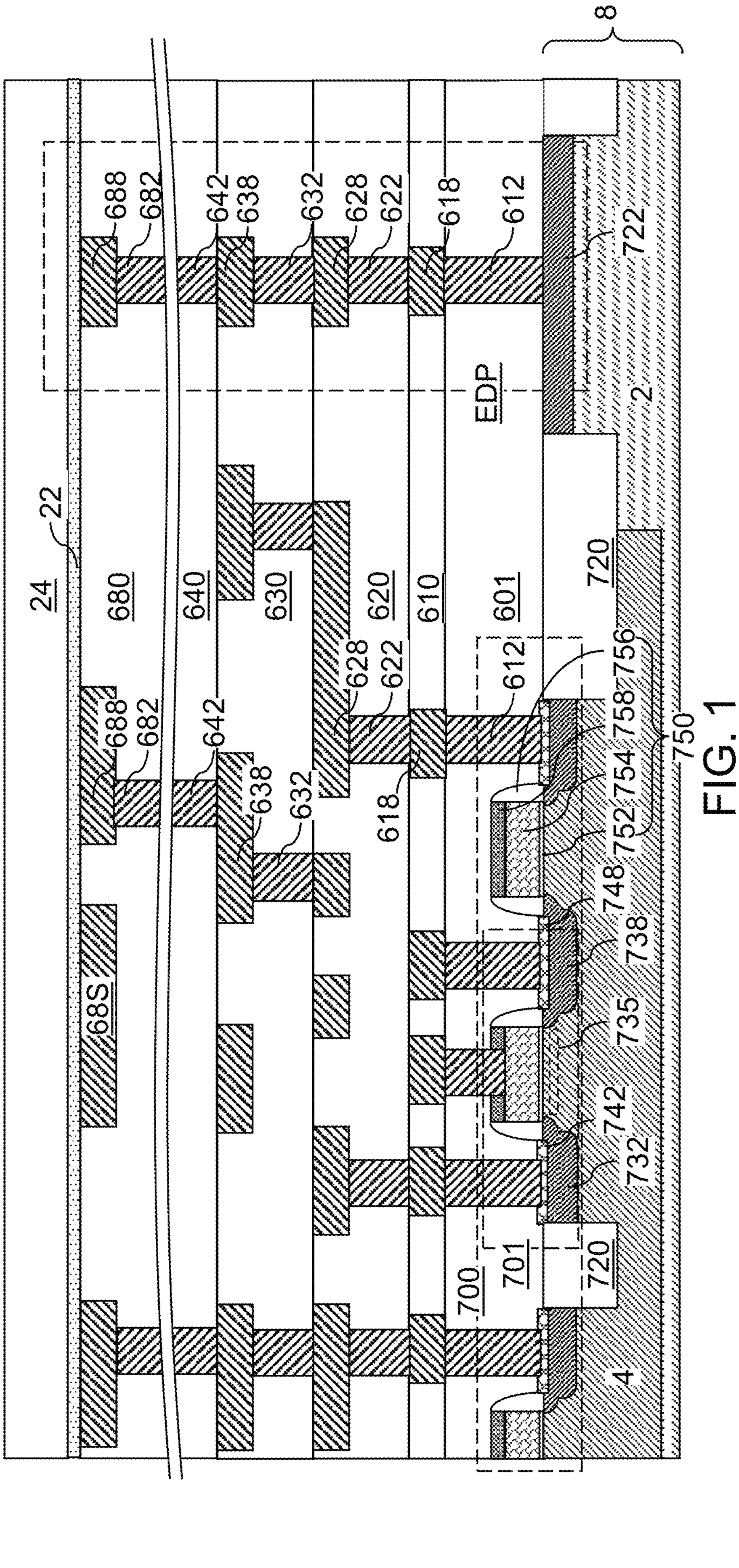
FIG. 1 is a vertical cross-sectional view of a first embodiment structure after formation of complementary metal-oxide-semiconductor (CMOS) transistors, metal interconnect structures and dielectric material layers, an optional dielectric capping layer, and an insulating layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device structure may be rotated as needed, and the spatially relative descriptors used herein may likewise be interpreted accordingly. Elements with the same reference numerals refer to the same element, and are presumed to have the same material composition and the same thickness range unless expressly indicated otherwise.

The various embodiments disclosed herein are related to the field of semiconductor device protection through electrostatic discharge paths during manufacturing processes, and particularly during plasma-based semiconductor manufacturing processes such as dry etch processes, physical vapor deposition (PVD) processes, plasma-enhanced chemical vapor deposition (PECVD) processes, and plasma-assisted cleaning processes. Various embodiments of the present disclosure use electrostatic discharge metal structures that function as lightning rods to establish electrostatic discharge paths, thereby preventing local charge accumulation during such plasma-based semiconductor manufacturing processes. Various embodiments of the present disclosure may be used to mitigate plasma-induced damage (PID) during the deposition and patterning of various materials such as phase change materials.

The various embodiment electrostatic discharge metal structures may be compatible with plasma-based processes using strong electrical bias conditions on a semiconductor wafer, and thus, provides enhanced routing and process flexibility for the design of various structural components such as heater elements, phase change material portions, and contact via structures thereupon. Thus, the various embodiment electrostatic discharge metal structures provide a reduction of plasma-induced damages, provides compatibility with processes using strong electrical bias conditions, and allows improvement of overall routing efficiency by reducing limitations on the metal routing layout.

In one embodiment, the various embodiment electrostatic discharge metal structures may be used for radio-frequency switch (RFS) devices using a phase change material. While the present disclosure describes embodiments in the context of radio-frequency switch (RFS) devices using a phase change material, the present disclosure is not limited to these applications. The described electrostatic discharge metal structures, acting as "lightning rods," are applicable in a variety of device structures and manufacturing processes involving plasma-enhanced processes. These include deposition and patterning of thick and dense metals where plasma-induced damage (PID) is a concern, demonstrating the versatility and broad applicability of these structures in mitigating electrostatic discharge across different semiconductor fabrication processes.

Generally, the electrostatic discharge metal structures of the present disclosure may be formed concurrently with, or prior to, formation of a heater element of a phase change material (PCM) switch device. The various embodiment electrostatic discharge metal structures may provide protection from various plasma-based processes. Dimensions of the electrostatic discharge metal structures may be optimized depending on the process conditions of the plasma-based processes. The various embodiments of the present disclosure are now described with reference to accompanying drawings.

Referring to FIG. 1, a first embodiment structure of the present disclosure is illustrated. The structure includes a semiconductor substrate 8, which may be a commercially available silicon substrate. The semiconductor substrate 8 may include a semiconductor material layer 2 at least at an upper portion thereof. The semiconductor material layer 2 may be a surface portion of a bulk semiconductor substrate, or may be a top semiconductor layer of a semiconductor-on-insulator (SOI) substrate. In one embodiment, the semiconductor material layer 2 includes a single crystalline semiconductor material such as single crystalline silicon. In one embodiment, the semiconductor substrate 8 may include a single crystalline silicon substrate including a single crystalline silicon material.

Shallow trench isolation structures 720 including a dielectric material such as silicon oxide may be formed in an upper portion of the semiconductor material layer 2. Suitable doped semiconductor wells 4, such as p-type wells and n-type wells, may be formed within each area that is laterally enclosed by a portion of the shallow trench isolation structures 720. In one embodiment, the semiconductor material layer 2 may have a doping of a first conductivity type (which may be p-type or n-type), and the doped semiconductor wells 4 may have a doping of the first conductivity type or a doping of a second conductivity type, which may be the opposite of the first conductivity type.

Semiconductor devices 701 may be formed on the semiconductor substrate 8. The semiconductor devices 701 may be formed on, and/or in, the doped semiconductor wells 4 and/or on, and/or in, the semiconductor material layer 2. The semiconductor devices 701 may include field effect transistors and optionally additional semiconductor devices (such as resistors, diodes, capacitor structures, etc.), and may collectively form a CMOS circuitry 700.

In one embodiment, each field effect transistor may include a source contact electrode 732, a drain contact electrode 738, a semiconductor channel 735 that includes a surface portion of the semiconductor substrate 8 extending between the source contact electrode 732 and the drain contact electrode 738, and a gate structure 750. The source contact electrodes 732 and the drain contact electrodes 738 may be doped with a conductivity type that is the opposite of the underlying doped semiconductor well 4. The semiconductor channel 735 may include a single crystalline semiconductor material. Each gate structure 750 may include a gate dielectric layer 752, a gate contact electrode 754, a gate cap dielectric 758, and a dielectric gate spacer 756. A source-side metal-semiconductor alloy region 742 may be formed on each source contact electrode 732, and a drain-side metal-semiconductor alloy region 748 may be formed on each drain contact electrode 738.

One or more of the field effect transistors in the CMOS circuitry 700 may include a semiconductor channel 735 that contains a portion of the semiconductor material layer 2 in the semiconductor substrate 8. In embodiments in which the semiconductor material layer 2 includes a single crystalline semiconductor material such as single crystalline silicon, the semiconductor channel 735 of each field effect transistor in the CMOS circuitry 700 may include a single crystalline semiconductor channel such as a single crystalline silicon channel.

In one embodiment, the semiconductor substrate 8 may include a single crystalline silicon substrate, and the field effect transistors may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

According to an aspect of the present disclosure, a doped semiconductor region 722 may be formed in an upper portion of the semiconductor substrate 8. In one embodiment, the semiconductor material layer 2 may have a doping of a first conductivity type, and the doped semiconductor region 722 may have a doping of a second conductivity type that is the opposite of the first conductivity type. In one embodiment, the atomic concentration of dopants of the first conductivity type in the semiconductor material layer 2 may be in a range from $1.0\times10^{14}/cm^{3}$ to $3.0\times10^{17}/cm^{3}$, such as from $3.0\times10^{14}/cm^{3}$ to $1.0\times10^{17}/cm^{3}$, although lesser and greater atomic concentrations may also be used. In one embodiment, the atomic concentration of dopants of the second conductivity type in the doped semiconductor region 722 may be in a range from $5.0\times10^{19}/cm^{3}$ to $2.0\times10^{21}/cm^{3}$, such as from $1.0\times10^{20}/cm^{3}$ to $1.0\times10^{21}/cm^{3}$, although lesser and greater atomic concentrations may also be used. Generally, the doped semiconductor well 4 is optional, and may be omitted as long as suitable doping can be provide for the source contact electrodes 732 and the drain contact electrodes 738 relative to an underlying semiconductor material that includes a channel region of a field effect transistor. In some embodiments, a subset of the source contact electrodes 732 and the drain contact electrodes 738 may have a same type of doping as the doped semiconductor region 722. In this embodiment, the doped semiconductor region 722 may be formed concurrently with formation of a subset of the source contact electrodes 732 and the drain contact electrodes 738 during an ion implantation process.

The doped semiconductor region 722 may be formed by implantation of dopants of the second conductivity type into a surface portion of the semiconductor material layer 2 that is laterally surrounded by the shallow trench isolation structure 720. Thus, each doped semiconductor region 722 may be formed directly on the semiconductor material layer 2 (i.e., a remaining unconverted portion of the semiconductor material layer 2) to provide a respective p-n junction with the semiconductor material layer 2. The area of the doped semiconductor region 722 is selected based on the intensity of plasma to be subsequently used plasma-related processes. A plurality of doped semiconductor regions 722 may be formed to provide protection from plasma over a large area including the CMOS circuitry 700. In this embodiment, the ratio of the total area of the doped semiconductor regions 722 to the area of the CMOS circuitry 700 may be in a range from 0.00001 to 0.1, such as from 0.0001 to 0.01, although lesser and greater ratios may also be used.

Various metal interconnect structures (612, 618, 622, 628, 632, 638, 642, 682, 688) formed within dielectric material layers (601, 610, 620, 630, 640, 680) may be subsequently formed over the semiconductor substrate 8 and the semiconductor devices 701. In an illustrative example, the dielectric material layers may include, for example, a contact-level dielectric material layer 601 that surrounds various device contact via structures 612 that contact the electrical nodes of the semiconductor devices 701, a first interconnect-level dielectric material layer 610, a second interconnect-level dielectric material layer 620, a third interconnect-level dielectric material layer 630, a fourth interconnect-level dielectric material layer 640, etc. In the illustrated example, an eighth interconnect-level dielectric material layer 680 is illustrated, and intervening dielectric material layers such as a fifth-level dielectric material layer, a sixth-level dielectric material layer, and a seventh-level dielectric material layer are not shown for clarity.

The metal interconnect structures may include device contact via structures 612 formed in the first dielectric material layer 601 and contact a respective component of the CMOS circuitry 700, first metal line structures 618 formed in the first interconnect-level dielectric material layer 610, first contact via structures 622 formed in a lower portion of the second interconnect-level dielectric material layer 620, second metal line structures 628 formed in an upper portion of the second interconnect-level dielectric material layer 620, second contact via structures 632 formed in a lower portion of the third interconnect-level dielectric material layer 630, third metal line structures 638 formed in an upper portion of the third interconnect-level dielectric material layer 630, third contact via structures 642 formed in a lower portion of the fourth interconnect-level dielectric material layer 640, etc. Seventh contact via structures 682 formed in a lower portion of the eighth interconnect-level dielectric material layer 680, and eighth metal line structures 688 formed in an upper portion of the eighth interconnect-level dielectric material layer 680 are also illustrated. While the present disclosure is described using an embodiment in which eight levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640, 680) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 682, 688) may include at least one conductive material, which may be a combination of a metallic liner (such as a metallic nitride or a metallic carbide) and a metallic fill material. Each metallic liner may include TiN, TaN, WN, TIC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first contact via structures 622 and the second metal line structures 628 may be formed as integrated line and via structures by a dual damascene process. Generally, any contiguous set of a metal line structure (628, 638, 688) and at least one underlying contact via structure (622, 632, 642) may be formed as an integrated line and via structure.

Generally, semiconductor devices 701 may be formed on a semiconductor substrate 8, and metal interconnect structures (612, 618, 622, 628, 632, 638, 642, 682, 688) and dielectric material layers (601, 610, 620, 630, 640, 680) may be formed over the semiconductor devices 701. The metal interconnect structures (612, 618, 622, 628, 632, 638, 642, 682, 688) may be formed in the dielectric material layers (601, 610, 620, 630, 640, 680), and may be electrically connected to the semiconductor devices. Thus, a semiconductor substrate 8 with a doped semiconductor region 722 therein and with metal interconnect structures (612, 618, 622, 628, 632, 638, 642, 682, 688) formed within dielectric material layers (601, 610, 620, 630, 640, 680) thereupon may be provided. In some embodiments, a heat-spreading structure 68S for effectively spreading heat may be provided in an upper portion of the topmost dielectric layer selected from the dielectric material layers (601, 610, 620, 630, 640, 680). The heat-spreading structure 68S may comprise a metal plate, which may have the same material composition as, but has a greater area than, the eighth metal line structures 688. Such a heat-spreading structure may be formed in an area in which a heater element of a phase change memory (PCM) switch is to be subsequently formed (e.g., a heater element will be formed directly above the heat-spreading structure 68S such that the heat spreader 68S can effectively spread heat generated from the heater element).

Generally, a plurality of doped semiconductor regions 722 may be formed. A subset of the metal interconnect structures (612, 618, 622, 628, 632, 638, 642, 682, 688) may be formed as a contiguous assembly of metal interconnect structures (612, 618, 622, 628, 632, 638, 642, 682, 688) that extend through each of the dielectric material layers (601, 610, 620, 630, 640, 680) and electrically connected to the a respective one of the doped semiconductor regions 722. Each such contiguous assembly of metal interconnect structures (612, 618, 622, 628, 632, 638, 642, 682, 688) functions as an electrostatic discharge path EDP that may discharge electrostatic charges that accumulate at a topmost dielectric layer during each anisotropic etch process that is used to form the various via cavities and line cavities within which a respective one of the metal interconnect structures (612, 618, 622, 628, 631, 638, 642, 682, 688) is formed. In one embodiment, an electrostatic discharge path EDP may be formed for each doped semiconductor region 722.

An optional dielectric capping layer 22 may be deposited over the metal interconnect structures (612, 618, 622, 628, 632, 638, 642, 682, 688) and dielectric material layers (601, 610, 620, 630, 640, 680). The optional dielectric capping layer 22 includes a dielectric capping material such as silicon carbide, silicon nitride, or silicon carbide nitride. Other suitable dielectric capping materials are within the contemplated scope of disclosure. The thickness of the optional dielectric capping layer 22, in embodiments in which the dielectric capping layer 22 is present, may be in a range from 2 nm to 100 nm, although lesser and greater thicknesses may also be used.

An insulating layer 24 may be deposited over the optional dielectric capping layer 22 and over the metal interconnect structures (612, 618, 622, 628, 632, 638, 642, 682, 688) and dielectric material layers (601, 610, 620, 630, 640, 680). The insulating layer 24 comprises a dielectric material. In one embodiment, the insulating layer 24 may function as an auxiliary heat conductor while being electrically insulating. In this embodiment, the insulating layer 24 may provide a thermal management function, particularly to provide additional heat dissipation generated from a heater element to be subsequently formed above. The material of the insulating layer 24 may be selected based on their ability to conduct heat effectively while maintaining electrical insulation. For example, the insulating layer 24 may include aluminum nitride, boron nitride, or silicon carbide, undoped silicate glass, or a doped silicate glass. The material of the insulating layer 24 may facilitate removal of heat from the heater element to enhance the overall performance and reliability of the device of the present disclosure. The insulating layer 24 may comprise a planar top surface, i.e., a top surface located entirely within a horizontal plane. The thickness of the insulating layer 24 may be in a range from 10 nm to 500 nm, such as from 50 nm to 300 nm, and/or from 120 nm to 200 nm, although lesser and greater thicknesses may also be used.

Figure 2:
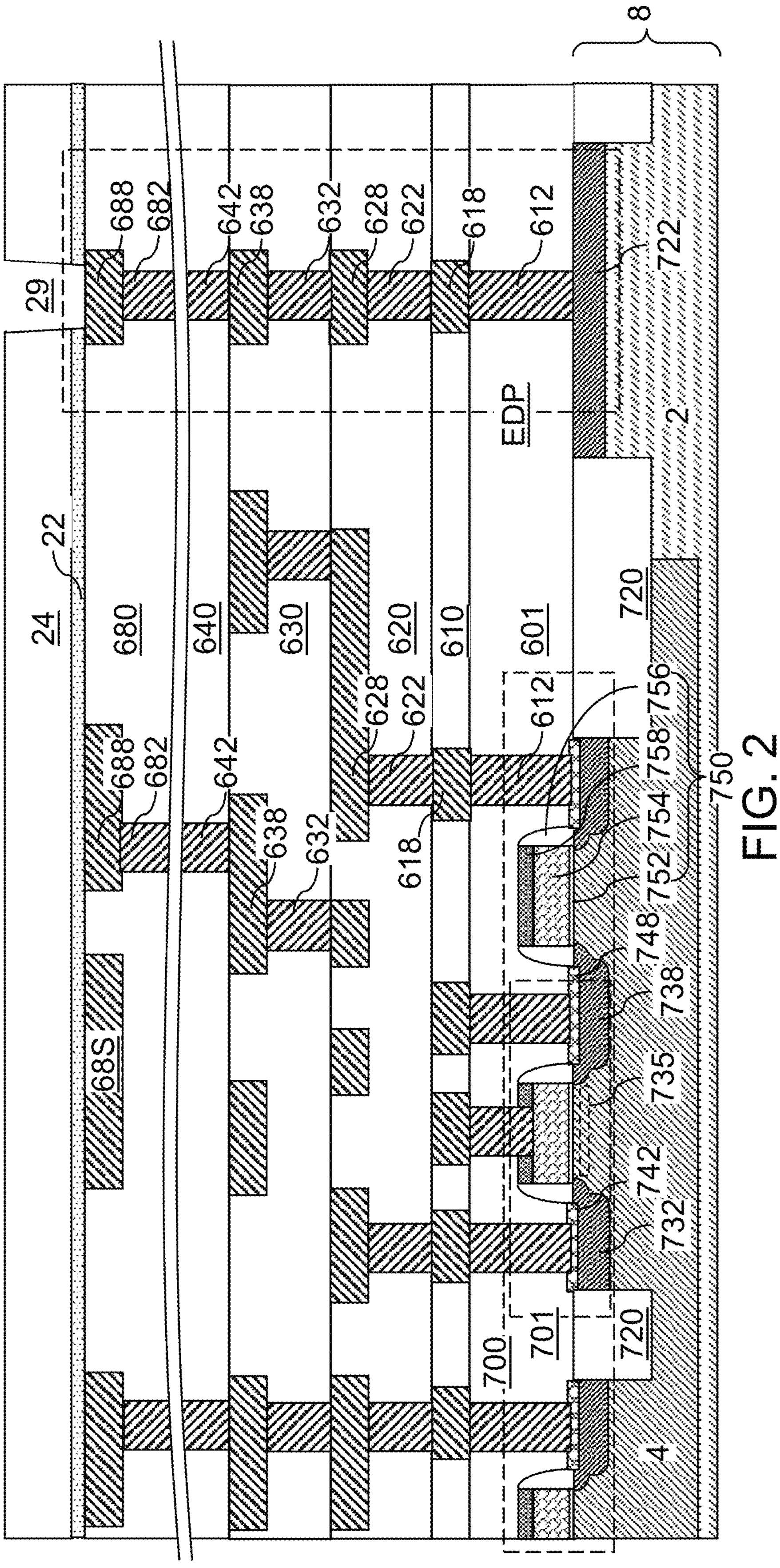
FIG. 2 is a vertical cross-sectional view of the first embodiment structure after formation of via openings according to an embodiment of the present disclosure.

Referring to FIG. 2, a photoresist layer (not shown) may be applied over the insulating layer 24, and may be lithographically patterned to form an array of openings. Each opening in the photoresist layer may be formed within the area of a topmost metal interconnect structure (such as an eighth metal line structure 688) within a respective electrostatic discharge path EDP. An anisotropic etch process may be performed to transfer the pattern of the openings in the photoresist layer through the insulating layer 24 and the dielectric capping layer 22. Via openings 29 may be etched through the insulating layer 24 and the dielectric capping layer 22 underneath the openings in the photoresist layer.

A top surface of a respective one of the metal interconnect structures (612, 618, 622, 628, 632, 638, 642, 682, 688), such as a top surface of a respective one of the eighth metal line structures 688, may be physically exposed at a bottom of each via opening 29. The via openings 29 may have a circular shape, or may have an elongated shape. The diameter of the via openings 29 (in embodiments in which the via openings 29 have circular horizontal cross-sectional shapes) or the width of the via opening 29 (in embodiments in which the via openings 29 are elongated) may be in a range from 1 nm to 1,000 nm, such as from 10 nm to 300 nm, and/or from 50 nm to 200 nm, although lesser and greater lateral dimensions (e.g., diameters or widths) may also be used. The photoresist layer may be subsequently removed, for example, by ashing.

Figure 3:
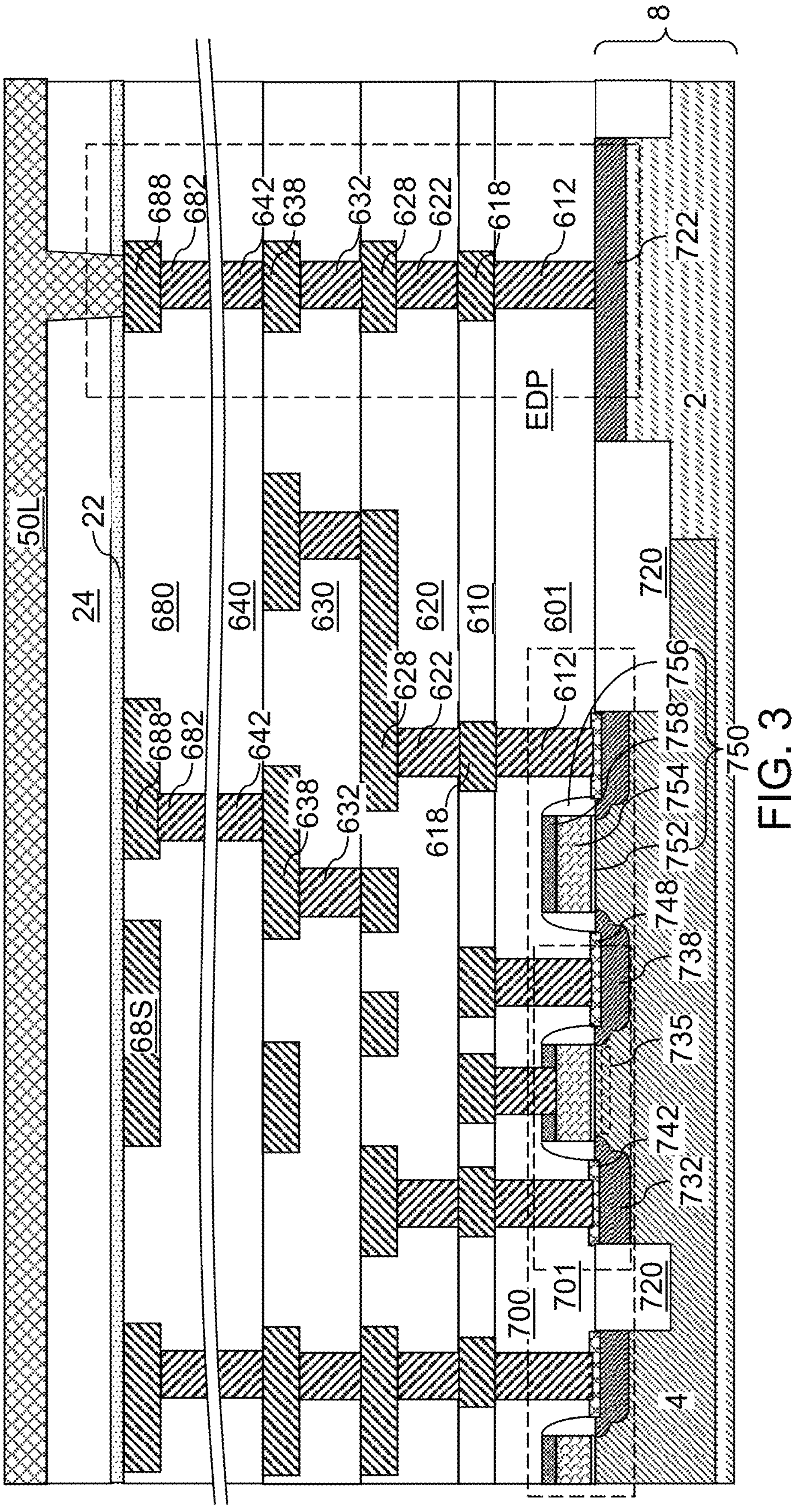
FIG. 3 is a vertical cross-sectional view of the first embodiment structure after deposition of a metal layer according to an embodiment of the present disclosure.

Referring to FIG. 3, a metal layer 50L may be deposited directly on the top surface of the insulating layer 24 and in each of the via openings 29. The metal layer 50L may be deposited directly on each physically exposed surface of the metal interconnect structures (612, 618, 622, 628, 632, 638, 642, 682, 688) that underlie the via openings 29. For example, the metal layer 50L may be deposited directly on each physically exposed top surface of the eighth metal line structures 688. The metal layer 50L is subsequently patterned into components of electrostatic discharge paths (EDPs), which act as "lightening rods" during subsequent plasma processing steps. Without the patterned portions of the metal layer 50L as ESD components, electrical charges can accumulate at the level of the insulating layers 24 during the subsequent plasma processes, and arcing may be induced during the subsequent processes.

The metal layer 50L comprises a material that may withstand an elevated temperature that is sufficiently high to induce melting of a phase change material. For example, the metal layer 50L comprise a material having a melting point higher than 1,500 degrees Celsius, and preferably higher than 1,750 degrees Celsius, and more preferably higher than 2,000 degrees Celsius. In one embodiment, the metal layer 50L consists essentially of a set of at least one metallic material that is selected from tungsten, tantalum, molybdenum, niobium, rhenium, tungsten nitride, tantalum nitride, titanium nitride, and molybdenum nitride. In one embodiment, the metal layer 50L may consist essentially of a metallic nitride material that is selected from tungsten nitride, tantalum nitride, titanium nitride, and molybdenum nitride, and a refractive elementary metal that is selected from tungsten, tantalum, molybdenum, niobium, and rhenium. Alternatively, the metal layer 50L may consist essentially of a refractive elementary metal that is selected from tungsten, tantalum, molybdenum, niobium, and rhenium.

The metal layer 50L may be deposited by physical vapor deposition (PVD) or chemical vapor deposition (CVD). The thickness of the metal layer 50L may be selected such that the entire volumes of the via openings 29 are filled with the metal layer 50L. In one embodiment, the diameter of the via openings 29 (in embodiments in which the via openings 29 have circular horizontal cross-sectional shapes) or the width of the via opening 29 (in embodiments in which the via openings 29 are elongated) may be in a range from 1 nm to 1,000 nm, such as from 10 nm to 300 nm, and/or from 50 nm to 200 nm. In this embodiment, the thickness of the metal layer 50L may be in a range from 20 nm to 500 nm, such as from 60 nm to 150 nm, although lesser and greater thicknesses may also be used. Generally, the thickness of the metal layer 50L may be greater than one half of the diameter of the via openings 29 (in embodiments in which the via openings 29 have circular horizontal cross-sectional shapes) or the width of the via opening 29 (in embodiments in which the via openings 29 are elongated).

Figure 4A:
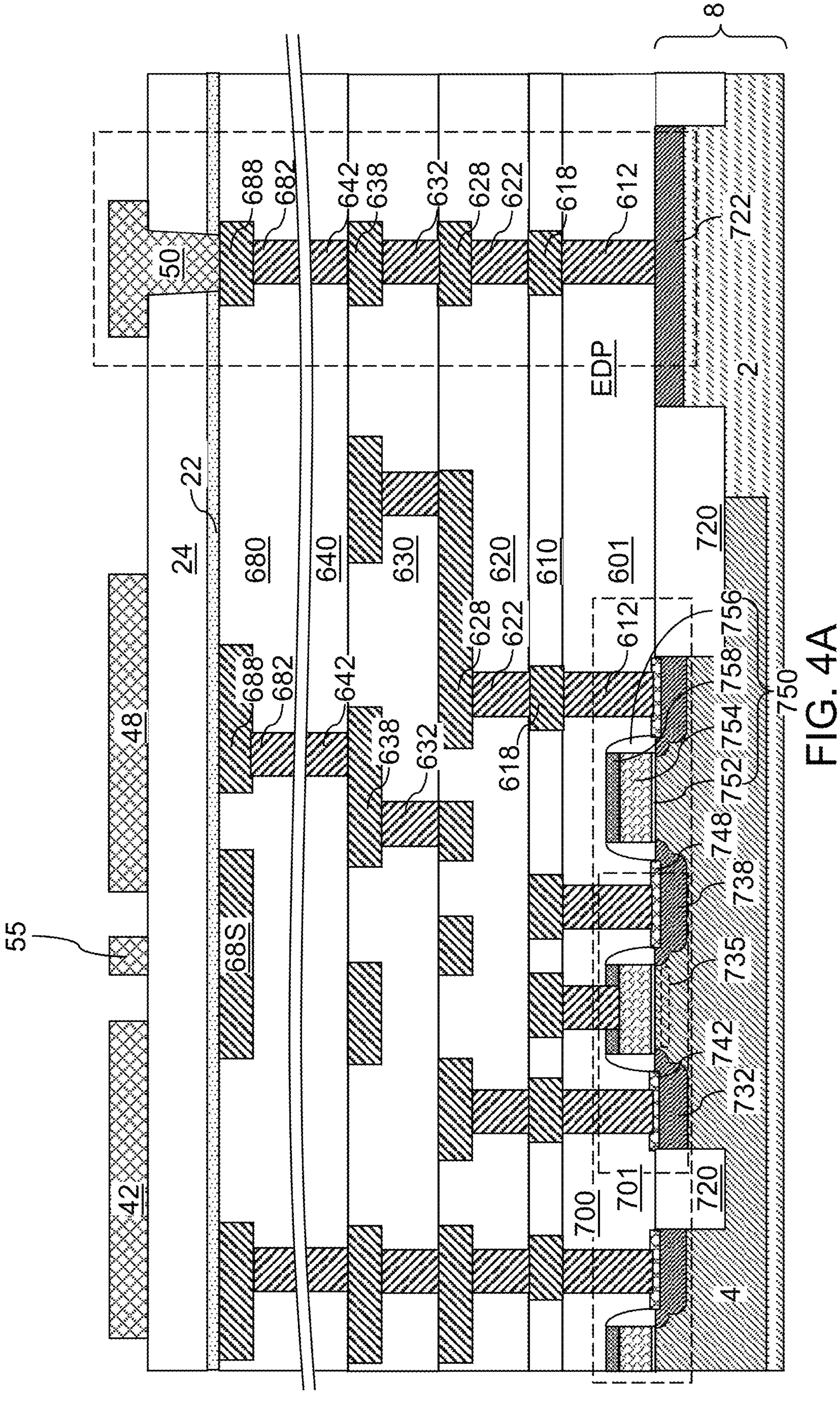
FIG. 4A is a vertical cross-sectional view of the first embodiment structure after formation of a heater element, a first electrode, a second electrode, and an electrostatic discharge metal structure according to embodiments of the present disclosure.
Figure 4B:
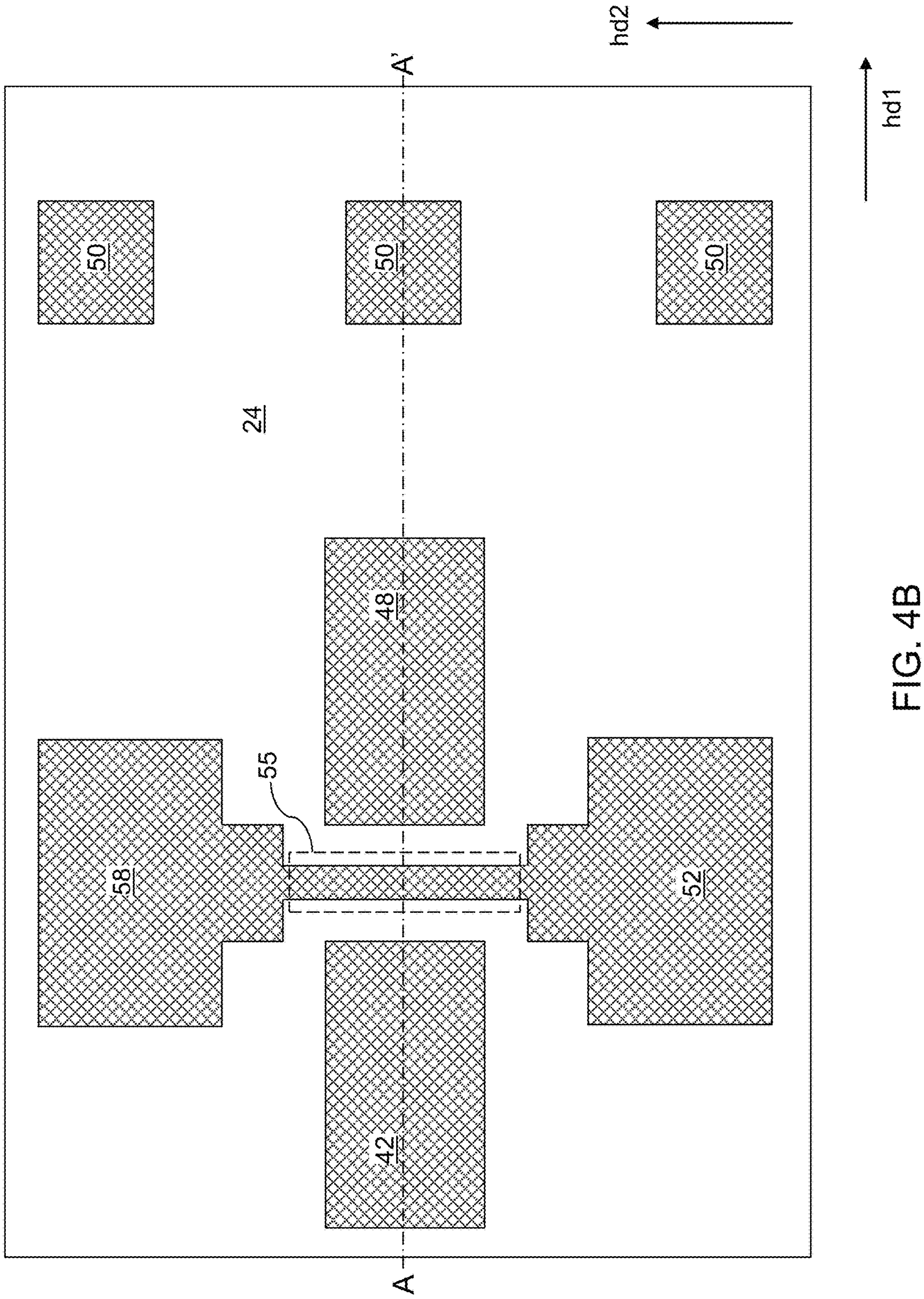
FIG. 4B is a top-down view of the first embodiment structure of FIG. 4A.

Referring to FIGS. 4A and 4B, an etch mask layer (such as a patterned photoresist layer) may be applied over the metal layer 50L, and may be lithographically patterned to form a patterned etch mask layer (not illustrated). An anisotropic etch process (such as a reactive ion etch process) may be performed to transfer the pattern in the patterned etch mask layer through the metal layer 50L. The pattern in the patterned etch mask layer may be selected such that patterned remaining portions of the metal layer 50L comprises a heater element (52, 55, 58) of a phase change material (PCM) switch, a first electrode 42 of the PCM switch, a second electrode 48 of the PCM switch, and electrostatic discharge metal structures 50. For example, the electrostatic discharge metal structures 50 may comprise first patterned portions of the metal layer 50L, the heater element (52, 55, 58) may comprise a second patterned portion of the metal layer 50L, the first electrode 42 of the PCM switch may comprise a third patterned portion of the metal layer 50L, and the second electrode 48 of the PCM switch may comprise a fourth patterned portion of the metal layer 50L.

Generally, the heater element (52, 55, 58) comprises a strip portion 55 having a narrow uniform width along a first horizontal direction hd1 and laterally extending along a second horizontal direction hd2 that is perpendicular to the first horizontal direction hd1, a first terminal portion 52 adjoined to a first end of the strip portion 55, and a second terminal portion 58 adjoined to a second end of the strip portion 55 and laterally spaced from the first terminal portion 52 along the second horizontal direction hd2. The uniform width of the strip portion 55 along the first horizontal direction may be a critical dimension, i.e., the smallest dimension that may be printed using a single lithographic exposure with the lithography tool used to pattern the etch mask layer (such as the patterned photoresist layer). For example, the uniform width of the strip portion 55 may be in a range from 10 nm to 60 nm, such as from 20 nm to 40 nm, although lesser and greater dimensions may also be used. The ratio of the length of the strip portion 55 to the width of the strip portion 55 may be in a range from 3 to 60, such as from 6 to 30, although lesser and greater ratios may also be used.

In one embodiment, the strip portion 55 of each heater element (52, 55, 58) may be formed over the area of a respective one of the heat-spreading structures 68S. In this embodiment, excessive heat generated from the strip portions 55 of the heater elements (52, 55, 58) may be spread outward through the heat-spreading structures 68S, and may be dissipated over a wider area than the area of a respective strip portion 55.

Each of the first terminal portion 52 and the second terminal portion 58 may comprise a respective pad region, which may have a shape of a respective rectangle or a rounded rectangle. Each pad region may be adjoined to the strip portion 55 by an respective intermediate region having a lesser width along the first horizontal direction than the pad region. Each intermediate region may have a shape of a respective rectangle or a respective trapezoid. In one embodiment, the first terminal portion 52 adjoined to a first end of the strip portion 55, and a second terminal portion 58 adjoined to a second end of the strip portion 55.

The entirety of the heater element (52, 55, 58) of the phase change memory (PCM) switch may be formed over the top surface of the insulating layer 24. The entirety of the first electrode 42 of the phase change memory (PCM) switch may be formed over the top surface of the insulating layer 24. The entirety of the second electrode 48 of the phase change memory (PCM) switch may be formed over the top surface of the insulating layer 24.

In one embodiment, the metal layer 50L may consist essentially of a set of at least one metallic material selected from tungsten, tantalum, molybdenum, niobium, rhenium, tungsten nitride, tantalum nitride, titanium nitride, and molybdenum nitride. The electrostatic discharge metal structures 50, the heater element (52, 55, 58), the first electrode 42, and the second electrode 48 may have the same material composition. Each of the electrostatic discharge metal structure 50 may comprise, and/or may consist essentially of, a respective first portion of the set of at least one metallic material. The heater element (52, 55, 58) may comprise, and/or may consist of, a second portion of the set of at least one metallic material. The first electrode 42 may comprise, and/or may consist essentially of, a third portion of the set of at least one metallic material, and may be laterally spaced from the strip portion 55 of the heater element (52, 55, 58) along the first horizontal direction hd1. The second electrode 48 may comprise, and/or may consist essentially of, a fourth portion of the set of at least one metallic material, and may be laterally spaced from the heater element (52, 55, 58) along the first horizontal direction hd1.

Each of the electrostatic discharge metal structures 50 may fill a respective one of the via opening 29. In one embodiment, the patterned etch mask layer may be formed over the metal layer 50L such that the patterned etch mask layer comprises portions that cover the area of a respective via opening 29. In one embodiment, the entire area of each via opening 29 may be covered with a respective discrete portion of the patterned etch mask layer. In this embodiment, each electrostatic discharge metal structure 50 comprises a lower portion that fills a via opening 29 and an upper portion that overlies the horizontal plane including the top surface of the insulating layer 24 and having a greater lateral extent than the via portion. In this embodiment, the top surface of each electrostatic discharge metal structure 50 may be formed within the horizontal plane that contains the top surface of the heater element (52, 55, 58).

The strip portion 55 of the heater element (52, 55, 58) laterally extends between the first electrode 42 and the second electrode 48 along the second horizontal direction hd2. Each of the first electrode 42 and the second electrode 48 may have a respective rectangular shape. The width of each of the first electrode 42 and the second electrode 48 along the second horizontal direction hd2 may be in a range from 50% to 96%, such as from 70% to 90%, of the length of the strip portion 55 of the heater element (52, 55, 58). The length of each of the first electrode 42 and the second electrode 48 along the first horizontal direction hd1 may be in a range from 50% to 300% of the width of each of the first electrode 42 and the second electrode 48 along the second horizontal direction hd2, although lesser and greater lengths may also be used.

In one embodiment, the top surface of the heater element (52, 55, 58), the top surfaces of the electrostatic discharge metal structure 50, the top surface of the first electrode 42, and the top surface of the second electrode 48 may be formed within a first horizontal plane. The bottom surface of the heater element (52, 55, 58), the bottom surface of the first electrode 42, and the bottom surface of the second electrode 48 may be formed within a second horizontal plane that includes the top surface of the insulating layer 24.

The bottom surface of each electrostatic discharge metal structure 50 contacts a top surface of a respective one of the metal interconnect structures (612, 618, 622, 628, 632, 638, 642, 682, 688), such as a top surface of a respective eighth metal line structure 688. Each electrostatic discharge metal structure 50 is formed directly on a top surface of a pre-existing electrostatic discharge path EDP, and becomes a component of a new electrostatic discharge path EDP that includes the pre-existing electrostatic discharge path EDP and the electrostatic discharge metal structure 50. Thus, each electrostatic discharge path EDP after the processing steps of FIGS. 4A and 4B may comprise a respective electrostatic discharge metal structure 50, a respective doped semiconductor region 722, and a contiguous set of metal interconnect structures (612, 618, 622, 628, 632, 638, 642, 682, 688) that vertically extends between the respective electrostatic discharge metal structure 50 and the respective doped semiconductor region 722. In one embodiment, the top surface of one of the metal interconnect structures (612, 618, 622, 628, 632, 638, 642, 682, 688) (such as an eighth metal line structure 688) in an electrostatic discharge path EDP is located within a horizontal plane that contains a top surface of a topmost layer of the dielectric material layers (601, 610, 620, 630, 640, 680), such as the eighth interconnect-level dielectric material layer 680.

While the present disclosure is described using an embodiment in which the electrostatic discharge metal structures 50, the heater element (52, 55, 58), the first electrode 42, and the second electrode 48 are formed by depositing and patterning a metal layer 50L, it is possible to form only the electrostatic discharge metal structures 50 through patterning of the metal layer 50L. In this embodiment, the heater element (52, 55, 58), the first electrode 42, and the second electrode 48 may be formed after formation of the electrostatic discharge metal structures 50 on the top surface of the insulating layer 24. In this embodiment, the heater element (52, 55, 58), the first electrode 42, and the second electrode 48 may have a different material composition and/or a different thickness than the portions of the electrostatic discharge metal structures 50 overlying the horizontal plane including the top surface of the insulating layer 24.

Such an embodiment increases the total number of processing steps for forming the combination of the electrostatic discharge metal structures 50, the heater element (52, 55, 58), the first electrode 42, and the second electrode 48, but provides the flexibility in the material composition of the electrostatic discharge metal structures 50.

In some embodiments, the heater element (52, 55, 58) may comprise a metal with a higher melting point than the metal of the electrostatic discharge metal structures 50. For example, the heater element (52, 55, 58) may be composed of tungsten, which has a melting point of approximately 3420° C., to ensure that the heater element (52, 55, 58) can withstand the temperatures typically associated with phase change material operations. The electrostatic discharge metal structures 50 may utilize a metal with a lower melting point, such as titanium, which has a melting point of about 1668° C. This design consideration ensures that both the heater element (52, 55, 58) and the electrostatic discharge metal structures 50 maintain their structural and compositional integrity under operational temperatures, with the heater element (52, 55, 58) being capable of enduring higher temperatures due to its function as a heat source for manipulation of the phase of the phase change material.

Figure 5:
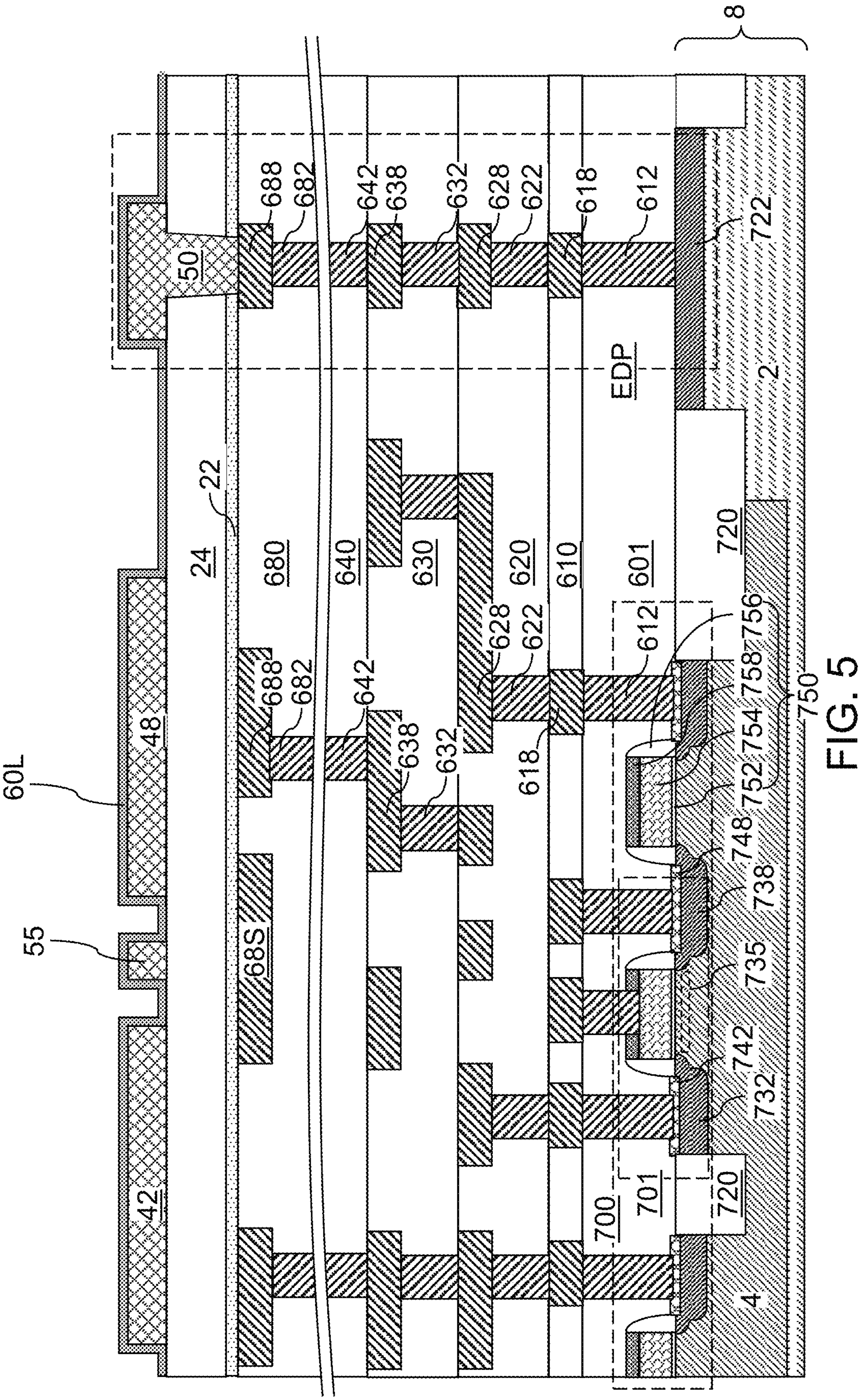
FIG. 5 is a vertical cross-sectional view of the first embodiment structure after deposition of a continuous thermally-conductive and electrically-insulating layer according to an embodiment of the present disclosure.

Referring to FIG. 5, a continuous thermally-conductive and electrically-insulating layer 60L may be deposited over, and directly on, the electrostatic discharge metal structures 50, the heater element (52, 55, 58), the first electrode 42, and the second electrode 48. The continuous thermally-conductive and electrically-insulating layer 60L comprise a material that is a thermal conductor and is an electrical insulator. In one embodiment, the thermally-conductive and electrically-insulating layer 60L comprises, and/or consists essentially of aluminum nitride.

Aluminum nitride has a thermal conductivity in a range from 70 W/m·K to 220 W/m·K at room temperature depending on the crystalline state of the material. This level of thermal conductivity is on the same order of magnitude as the thermal conductivity of copper, which is about 398 W/m·K at room temperature. Electrical conductivity of pure aluminum nitride (i.e., aluminum nitride in the absence of doping) is in a range from $1.0\times10^{-13}$ S/m to $1.0\times10^{-11}$ S/m at room temperature. This level of electrical conductivity is lower than the electrical conductivity of a semiconducting material, which is in a range from $1.0\times10^{-5}$ S/m to $1.0\times10^{5}$ S/m. As such, aluminum nitride (without doping) is an electrically insulating material. It is noted that even doped aluminum nitride is an insulating material with an electrical conductivity at about $1.0\times10^{-6}$ S/m.

The thermally-conductive and electrically-insulating layer 60L may be deposited by physical vapor deposition, atomic layer deposition, and/or a chemical vapor deposition. The thickness of the thermally-conductive and electrically-insulating layer 60L may be in a range from 5 nm to 100 nm, such as from 10 nm to 50 nm, although lesser and greater thicknesses may also be used.

Figure 6A:
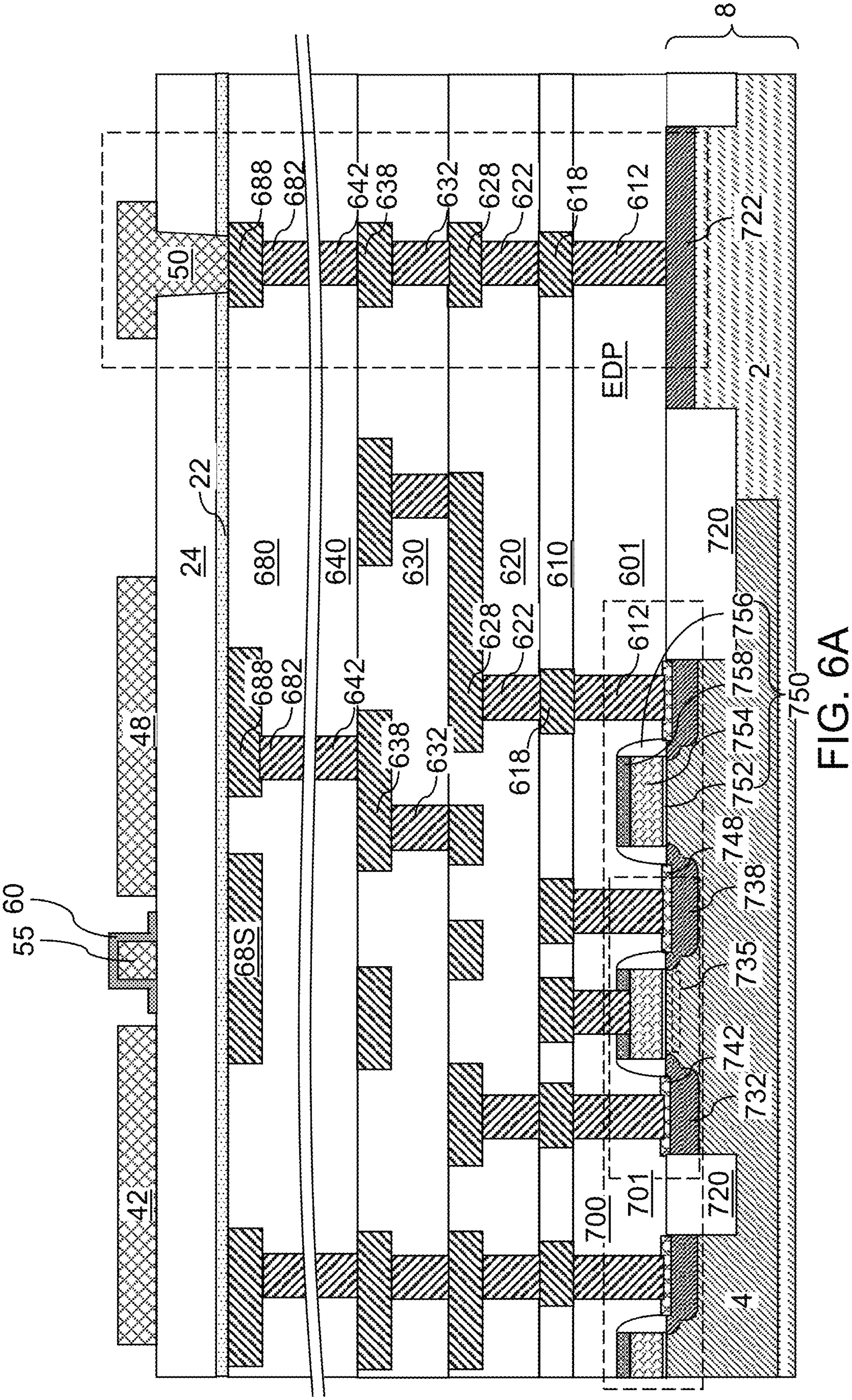
FIG. 6A is a vertical cross-sectional view of the first embodiment structure after patterning the continuous thermally-conductive and electrically-insulating layer into a thermally-conductive and electrically-insulating layer according to an embodiment of the present disclosure.
Figure 6B:
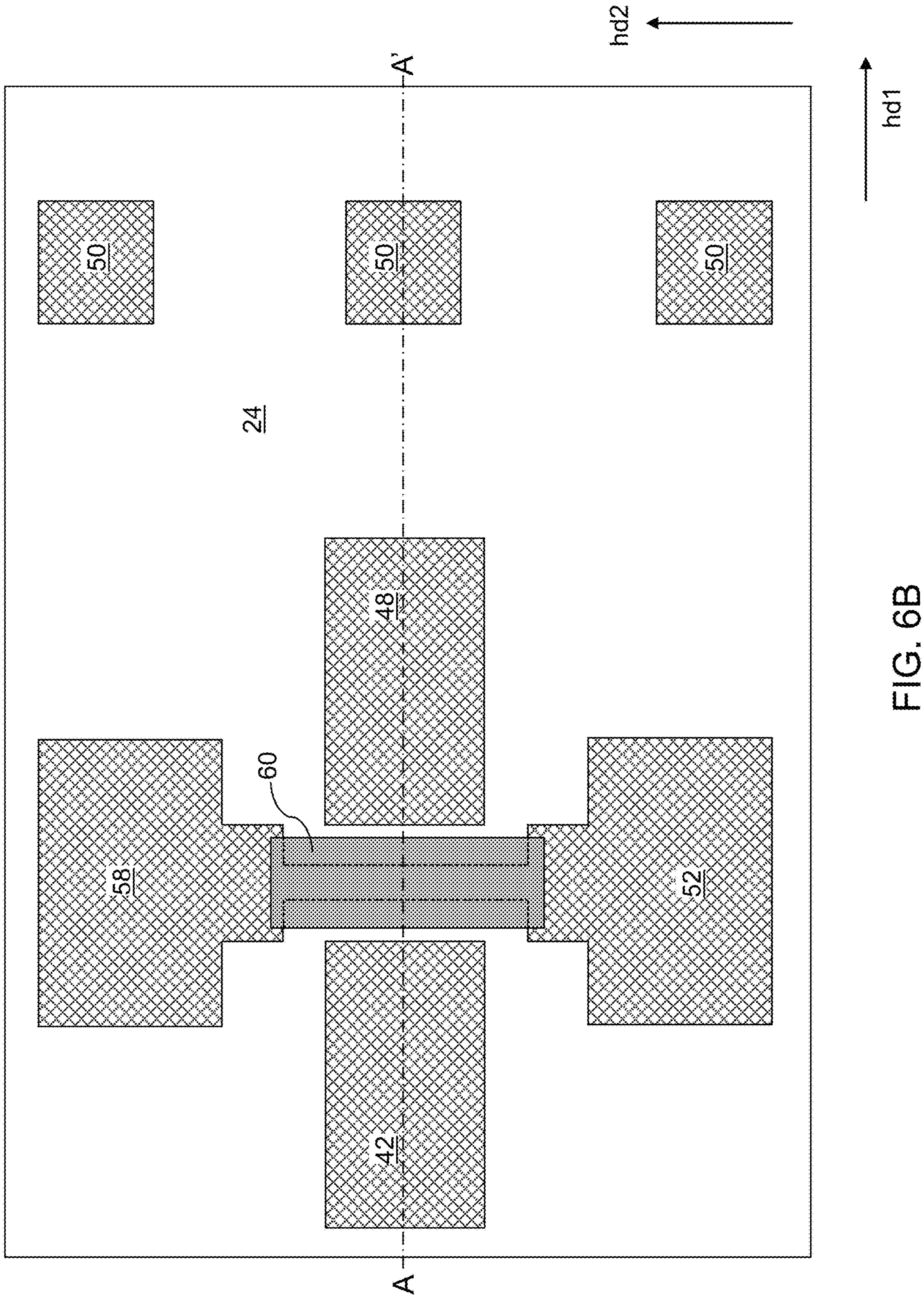
FIG. 6B is a top-down view of the first embodiment structure of FIG. 6A.

Referring to FIGS. 6A and 6B, a portion of the continuous thermally-conductive and electrically-insulating layer 60L may be masked with a patterned etch mask (not shown). For example, a photoresist layer may be applied over the continuous thermally-conductive and electrically-insulating layer 60L, and may be lithographically patterned to cover at least a predominant portion of the strip portion 55 of the heater element (52, 55, 58). In this embodiment, a patterned portion of the photoresist layer may cover at least the entire area of the heater element (52, 55, 58) that will be covered by a phase change material portion of the PCM switch to be formed. The area of the heater element (52, 55, 58) to be covered by the phase change material portion of the PCM switch includes a center region of the strip portion 55 of the heater element (52, 55, 58).

A selective etch process may be performed to etch the material of the continuous thermally-conductive and electrically-insulating layer 60L selective to the material of the electrostatic discharge metal structures 50, the heater element (52, 55, 58), the first electrode 42, and the second electrode 48 and optionally selective to the material of the insulating layer 24. Unmasked portion of the continuous thermally-conductive and electrically-insulating layer 60L may be etched by the selective etch process. In one embodiment, the selective etch process may comprise an anisotropic etch process. In this embodiment, the electrostatic discharge path EDP may be used to discharge electrostatic charges that accumulate in the insulating layer 24 into the semiconductor substrate 8 during an initial step of the anisotropic etch process to the extent that accumulated charges in the insulating layer 24 may flow to the electrostatic discharge path EDP, thereby protecting the semiconductor devices 701 on the semiconductor substrate 8 during the anisotropic etch process. The effectiveness of the electrostatic charge dissipation may depend on the proximity of the charge accumulation region to the electrostatic discharge metal structures 50. Alternatively, the selective etch process may comprise a wet etch process. For example, if the continuous thermally-conductive and electrically-insulating layer 60L comprises aluminum nitride, a wet etch using phosphoric acid may be performed.

A remaining portion of the continuous thermally-conductive and electrically-insulating layer 60L comprises a thermally-conductive and electrically-insulating layer 60 that covers a predominant portion (which includes the center portion) of the strip portion 55 of the heater element (52, 55, 58). In one embodiment, the thermally-conductive and electrically-insulating layer 60 may contact a top surface and sidewalls of the strip portion 55 of the heater element (52, 55, 58), and not directly contact the first electrode 42 or the second electrode 48. In one embodiment, the entirety of the strip portion 55 of the heater element (52, 55, 58) may be covered by the thermally-conductive and electrically-insulating layer 60L. The patterned etch mask layer (such as the patterned photoresist layer) may be subsequently removed, for example, by ashing.

Figure 7:
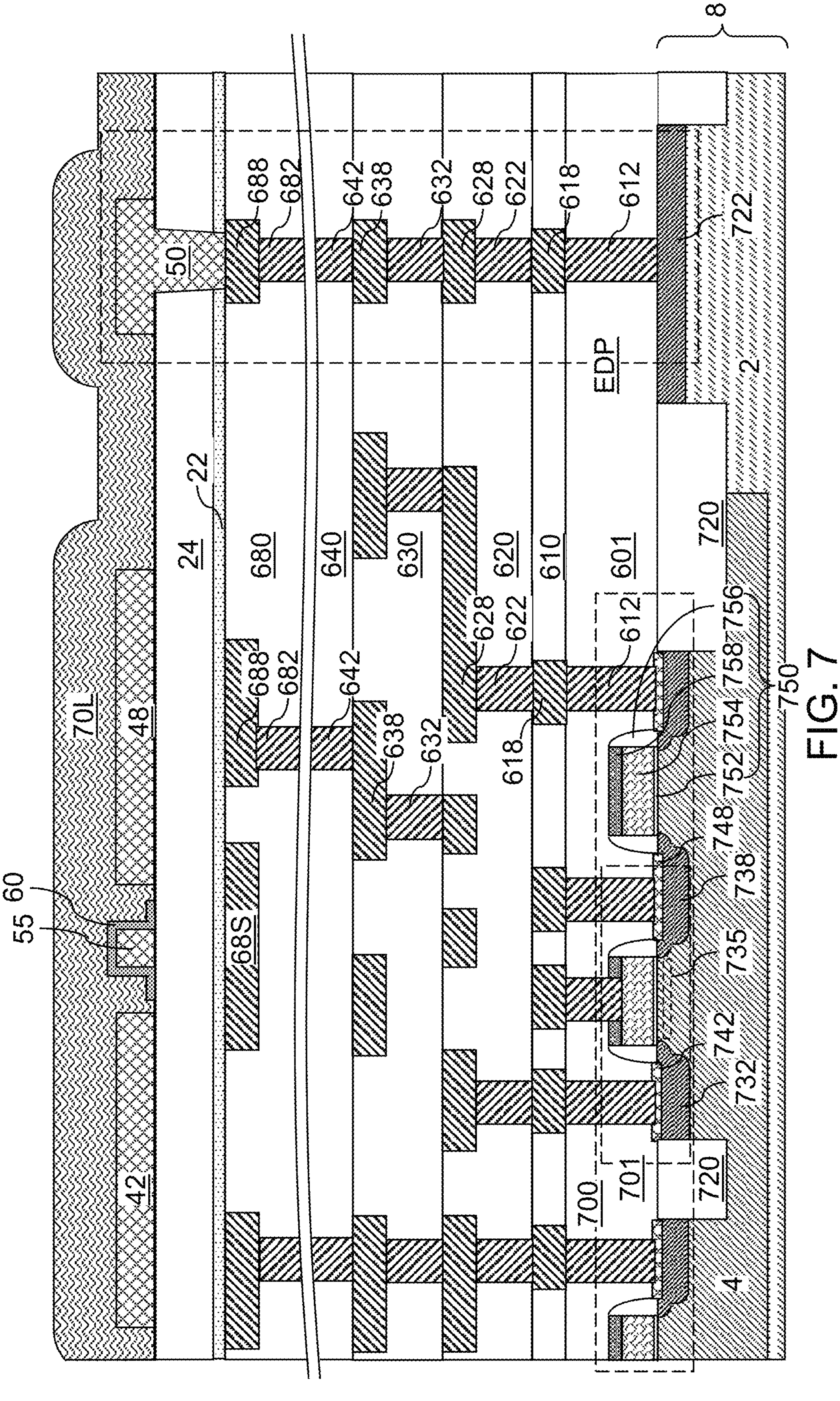
FIG. 7 is a vertical cross-sectional view of the first embodiment structure after deposition of a phase change material layer according to an embodiment of the present disclosure.

Referring to FIG. 7, a phase change material layer 70L (which is also referred to as a PCM layer) may be deposited over the heater element (52, 55, 58), the electrostatic discharge metal structure 50, the first electrode 42, and the second electrode 48. The phase change material layer 70L may be deposited directly on the top surface and all sidewalls of the first electrode 42, and directly on the a top surface and all sidewalls of the second electrode 48. Further, the phase change material layer 70L may be formed directly on the thermally-conductive and electrically-insulating layer 60, the first terminal portion 52 of the heater element (52, 55, 58), the second terminal portion 58 of the heater element (52, 55, 58) and the electrostatic discharge metal structures 50.

The phase change material layer 70L comprises, and/or consists essentially of, a phase change material. As used herein, a "phase change material" refers to a material having at least two different phases providing different resistivity. A phase change material (PCM) may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. The phase change material may be doped (e.g., nitrogen doped GST) or undoped to enhance resistance-switching characteristics. The phase change material layer 70L may be deposited by physical vapor deposition. The thickness of the phase change material layer 70L may be in a range from 30 nm to 600 nm, such as from 60 nm to 300 nm, although lesser and greater thicknesses may also be used.

Figure 8A:
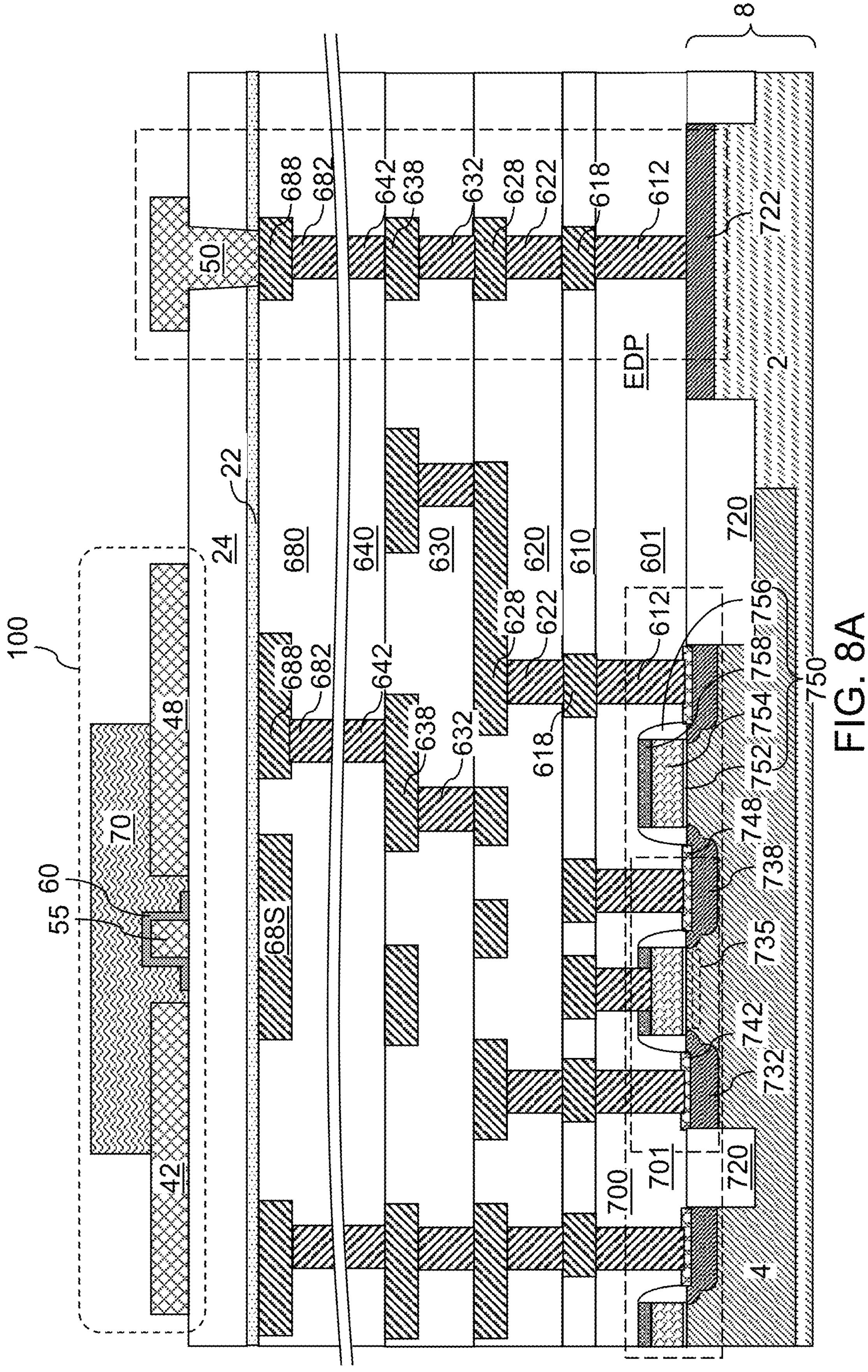
FIG. 8A is a vertical cross-sectional view of the first embodiment structure after patterning the phase change material layer into a phase change material portion according to an embodiment of the present disclosure.
Figure 8B:
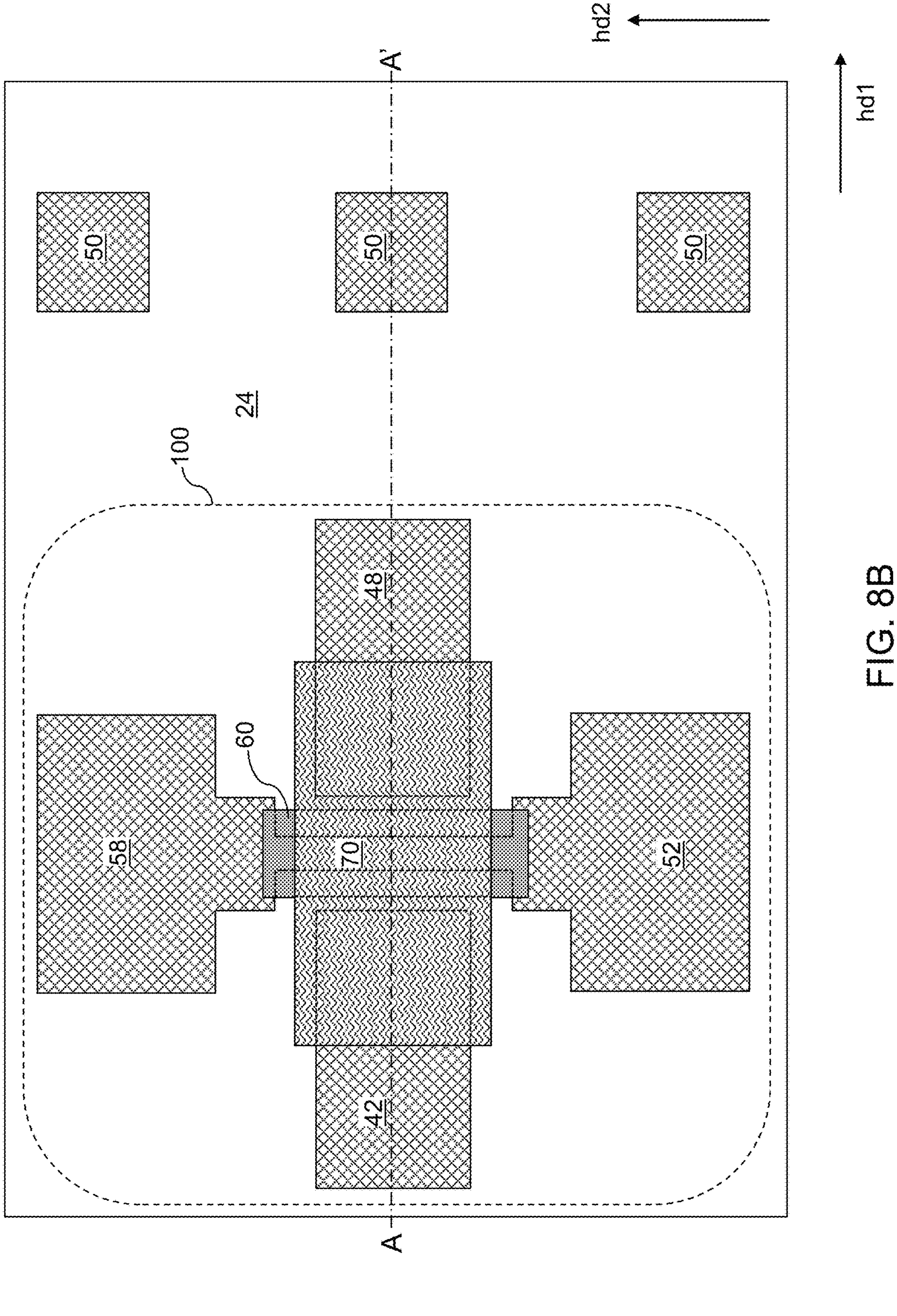
FIG. 8B is a top-down view of the first embodiment structure of FIG. 8A.

Referring to FIGS. 8A and 8B, a photoresist layer (not shown) may be applied over the phase change material layer 70L, and may be lithographically patterned to provide elongated photoresist material portions that straddle the thermally-conductive and electrically-insulating layer 60 along the first horizontal direction hd1 and covers at least partly each of the first electrode 42 and the second electrode 48.

Unmasked portions of the phase change material layer 70L may be etched by performing an anisotropic etch process (which may be referred to as a first anisotropic etch process) that uses the patterned photoresist material portion as an etch mask. According to an aspect of the present disclosure, the electrostatic discharge paths EDP discharge electrostatic charges that accumulate in the insulating layer 24 into the semiconductor substrate 8 during the first anisotropic etch process, thereby protecting the semiconductor devices 701 on the semiconductor substrate 8 during the first anisotropic etch process. As discussed above, each electrostatic discharge path EDP may comprise a respective electrostatic discharge metal structure 50, a respective contiguous set of metal interconnect structures (612, 618, 622, 628, 632, 638, 642, 682, 688), and a respective doped semiconductor region 722.

A remaining portion of the phase change material layer 70L comprises a phase change material portion 70, which may also be referred to as a PCM portion 70. The phase change material portion 70 and the thermally-conductive and electrically-insulating layer 60 straddle the strip portion 55 of the heater element (52, 55, 58). The phase change material portion 70 contacts, and extends over, portions of the first electrode 42 and the second electrode 48 that are proximal to the strip portion 55 of the heater element (52, 55, 58). The photoresist layer may be subsequently removed, for example, by ashing.

The phase change material portion 70 covers, and directly contacts, a first segment of the top surface of the first electrode 42 and a first segment of the top surface of the second electrode 48. The phase change material portion 70 is spaced from the strip portion 55 of the heater element (52, 55, 58) by the thermally-conductive and electrically-insulating layer 60. A second segment of the top surface of the first electrode 42 and a second segment of the top surface of the second electrode 48 are not covered by the phase change material portion 70 after performing the first anisotropic etch process. In one embodiment, the phase change material portion 70 contacts an entirety of a widthwise sidewall (which extends along the second horizontal direction hd2 and is proximal to the strip portion 55 of the heater element (52, 55, 58)) and first segments of lengthwise sidewalls of the first electrode 42. In one embodiment, the phase change material portion 70 contacts an entirety of a widthwise sidewall (which extends along the second horizontal direction hd2 and is proximal to the strip portion 55 of the heater element (52, 55, 58)) and first segments of lengthwise sidewalls of the second electrode 48. The widthwise sidewalls of the first electrode 42 and the second electrode 48 are parallel to lengthwise sidewalls of the strip portion 55 of the heater element (52, 55, 58).

The combination of the heater element (52, 55, 58), the thermally-conductive and electrically-insulating layer 60, the first electrode 42, the second electrode 48, and the phase change material portion 70 constitutes a phase change material (PCM) switch 100. The PCM switch 100 may be used as a radio-frequency (RF) signal switch. In this embodiment, one of the first electrode 42 and the second electrode 48 may be used as an input node of an RF signal, and another of the first electrode 42 and the second electrode 48 may be used as an output node of the RF signal. The phase change material portion 70 functions as a component that provides a variable resistance between the first electrode 42 and the second electrode 48. Specifically, the phase change material portion 70 may provide an insulating state while the portion of the phase change material that overlies the strip portion 55 of the heater element (52, 55, 58) is in an amorphous phase, and may provide a conducting state while the portion of the phase change material that overlies the strip portion 55 of the heater element (52, 55, 58) is in a polycrystalline phase. Generally, portions of the phase change material portion 70 that are not proximal to the strip portion 55 of the heater element (52, 55, 58) remain polycrystalline, and thus, maintain a conducting state throughout operation of the PCM switch 100.

Figure 9A:
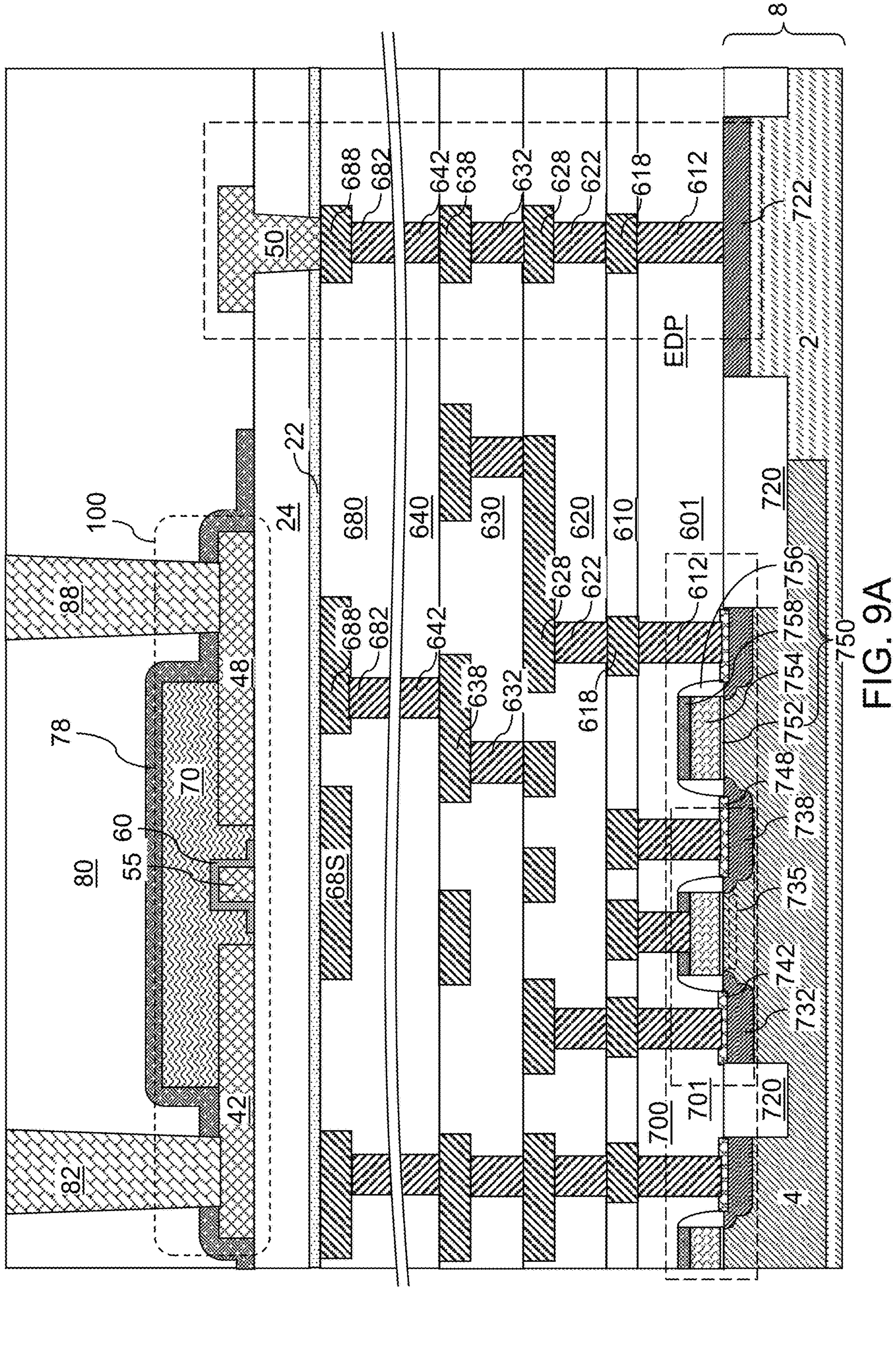
FIG. 9A is a vertical cross-sectional view of the first embodiment structure after formation of a conformal dielectric capping layer, a via-level dielectric layer, and contact via structures according to an embodiment of the present disclosure.
Figure 9B:
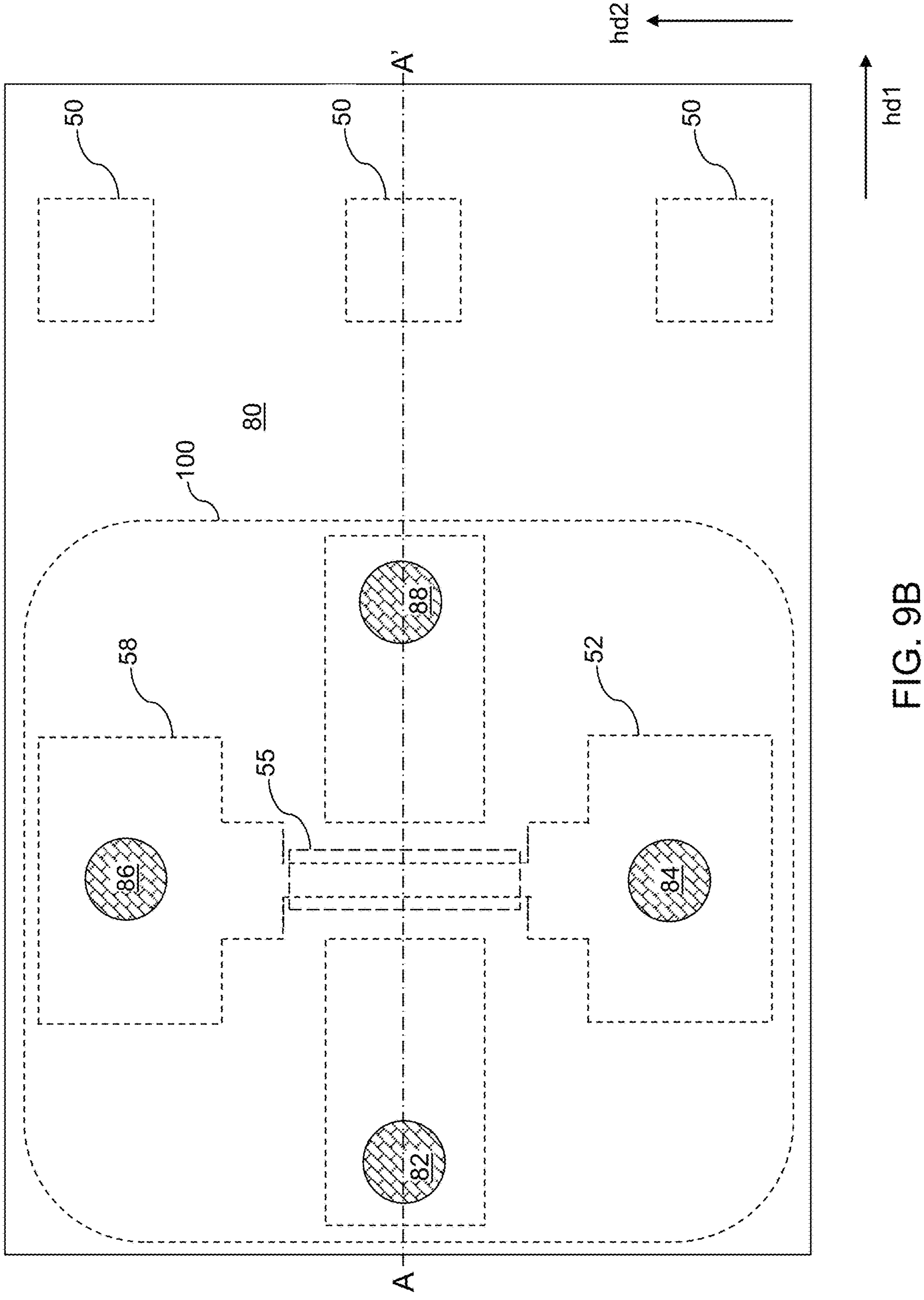
FIG. 9B is a top-down view of the first embodiment structure of FIG. 9A.

Referring to FIGS. 9A and 9B, a continuous conformal dielectric capping layer may be deposited over the phase change material portion 70, the first electrode 42, the second electrode 48, and the electrostatic discharge metal structures 50. The continuous conformal dielectric capping layer functions as a diffusion barrier layer to protect underlying structures from oxidation and impurity diffusion during subsequent processing steps. The material composition of the continuous conformal dielectric capping layer can differ from the material composition of the thermally-conductive and electrically-insulating layer 60 (which requires high thermal conductivity for efficient device operation). The continuous conformal dielectric capping layer comprises a dielectric capping material that caps the phase change material portion 70, the first electrode 42, the second electrode 48, and subsequently functions as a diffusion barrier layer. The continuous conformal dielectric capping layer comprises a diffusion barrier dielectric material such as silicon nitride, silicon carbide nitride, silicon oxynitride, diamond-like carbon, and/or a dielectric metal oxide. The continuous conformal dielectric capping layer may be deposited by chemical vapor deposition, atomic layer deposition, or physical vapor deposition. The thickness of the continuous conformal dielectric capping layer may be in a range from 5 nm to 100 nm, such as from 10 nm to 50 nm, although lesser and greater thicknesses may also be used.

A patterned etch mask layer, such as a patterned photoresist layer, may be formed to cover a portion of the continuous conformal dielectric capping layer that overlies the phase change material portion 70, the first electrode 42, the second electrode 48, without covering portions of the continuous conformal dielectric capping layer that overlie the electrostatic discharge metal structures 50. A second anisotropic etch process may be performed to etch unmasked portions of the continuous conformal dielectric capping layer. According to an aspect of the present disclosure, the electrostatic discharge paths EDP discharge electrostatic charges that accumulate in the insulating layer 24 into the semiconductor substrate 8 during the second anisotropic etch process, thereby protecting the semiconductor devices 701 on the semiconductor substrate 8 during the second anisotropic etch process.

A remaining portion of the continuous conformal dielectric capping layer that underlie the patterned etch mask layer comprises a conformal dielectric capping layer 78. The conformal dielectric capping layer 78 covers the phase change material portion 70, the first electrode 42, and the second electrode 48, and does not cover the electrostatic discharge metal structures 50. The conformal dielectric capping layer 78 may contact the top surface and sidewalls of the phase change material portion 70, a portion of the top surface of the first electrode 42, and a portion of the top surface of the second electrode 48. The conformal dielectric capping layer 78 does not contact the electrostatic discharge metal structures 50. The patterned etch mask layer, such as the patterned photoresist layer, may be subsequently removed, for example, by ashing.

A via-level dielectric layer 80 may be subsequently deposited over the conformal dielectric capping layer 78 and the electrostatic discharge metal structures 50. The via-level dielectric layer 80 comprises an interlayer dielectric (ILD) material such as undoped silicate glass, a doped silicate glass, porous or non-porous organosilicate glass, etc. The thickness of the via-level dielectric layer 80 may be in a range from 200 nm to 800 nm, although lesser and greater thicknesses may also be used.

Via cavities may be formed through the via-level dielectric layer 80 over each of the first electrode 42, over the second electrode 48, over a first terminal portion 52 of the heater element (52, 55, 58), and over a second terminal portion 58 of the heater element (52, 55, 58). For example, a photoresist layer may be applied over the via-level dielectric layer 80, and may be lithographically patterned to form discrete openings. Each of the discrete openings may be formed within the area of a respective one of the first electrode 42, over the second electrode 48, over a first terminal portion 52 of the heater element (52, 55, 58), and over a second terminal portion 58 of the heater element (52, 55, 58) in a plan view, such as a top-down view.

A third anisotropic etch process may be performed to transfer the pattern of the discrete openings in the photoresist layer through the via-level dielectric layer 80 and the conformal dielectric capping layer 78. Via cavities may be formed through the via-level dielectric layer 80 and the conformal dielectric capping layer 78 over each of the first electrode 42, the second electrode 48, the first terminal portion 52 of the heater element (52, 55, 58), and the second terminal portion 58 of the heater element (52, 55, 58). According to an aspect of the present disclosure, the electrostatic discharge path EDP may discharge electrostatic charges that accumulate in the insulating layer 24 into the semiconductor substrate 8 during the third anisotropic etch process, thereby protecting the semiconductor devices 701 on the semiconductor substrate 8 during the third anisotropic etch process. Segments of the top surfaces of the first electrode 42, the second electrode 48, the first terminal portion 52 of the heater element (52, 55, 58), and the second terminal portion 58 of the heater element (52, 55, 58) may be physically exposed at the bottom of the via cavities. The photoresist layer may be subsequently removed, for example, by ashing.

At least one conductive material, such as a combination of a metallic barrier material and a metallic fill material, may be deposited in the via cavities. The metallic barrier material may comprise one of more of TiN, TaN, WN, and MoN. The metallic fill material may comprise copper or a refractory metal such as tungsten. Excess portions of the at least one conductive material may be removed from above the horizontal plane including the top surface of the via-level dielectric layer 80 by performing a planarization process, which may comprise a chemical mechanical polishing process and/or a recess etch process. Contact via structures (82, 88, 84, 86) vertically extending through the via-level dielectric layer 80 and the conformal dielectric capping layer 78 may be formed in the via cavities. Each of the contact via structures (82, 88, 84, 86) may contact a respective structure that is selected from the first electrode 42, the second electrode 48, a first terminal portion 52 of the heater element (52, 55, 58), and a second terminal portion 58 of the heater element (52, 55, 58). For example, the contact via structures (82, 88, 84, 86) may comprise a first electrode contact via structure 82 that contacts the first electrode 42, a second electrode contact via structure 88 that contacts the second electrode 48, a first heater contact via structure 84 that contacts the first terminal portion 52 of the heater element (52, 55, 58), and a second heater contact via structure 86 that contacts a second terminal portion 58 of the heater element (52, 55, 58).

Figure 10A:
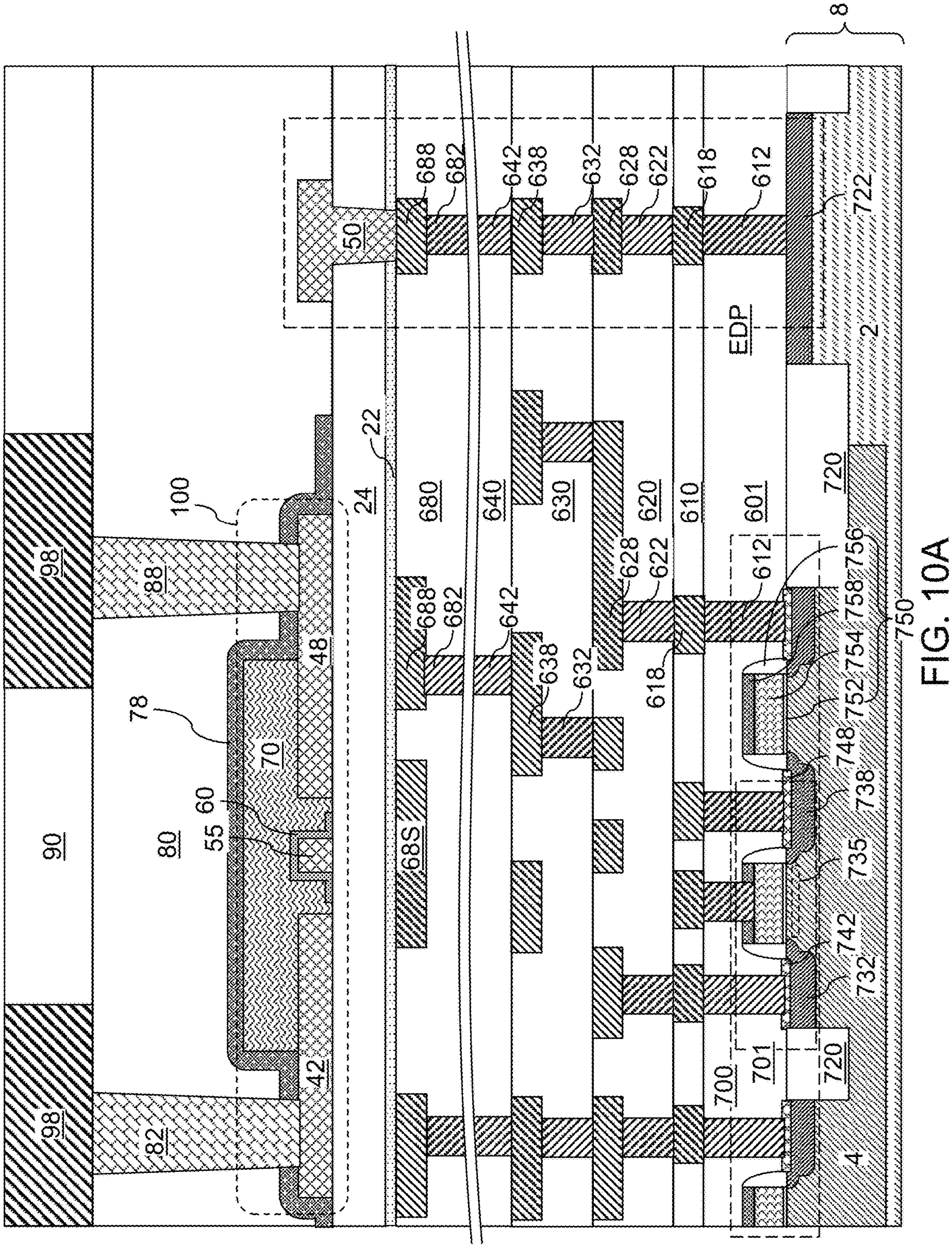
FIG. 10A is a vertical cross-sectional view of the first embodiment structure after formation of a line-level dielectric layer and metal line structures according to an embodiment of the present disclosure.
Figure 10B:
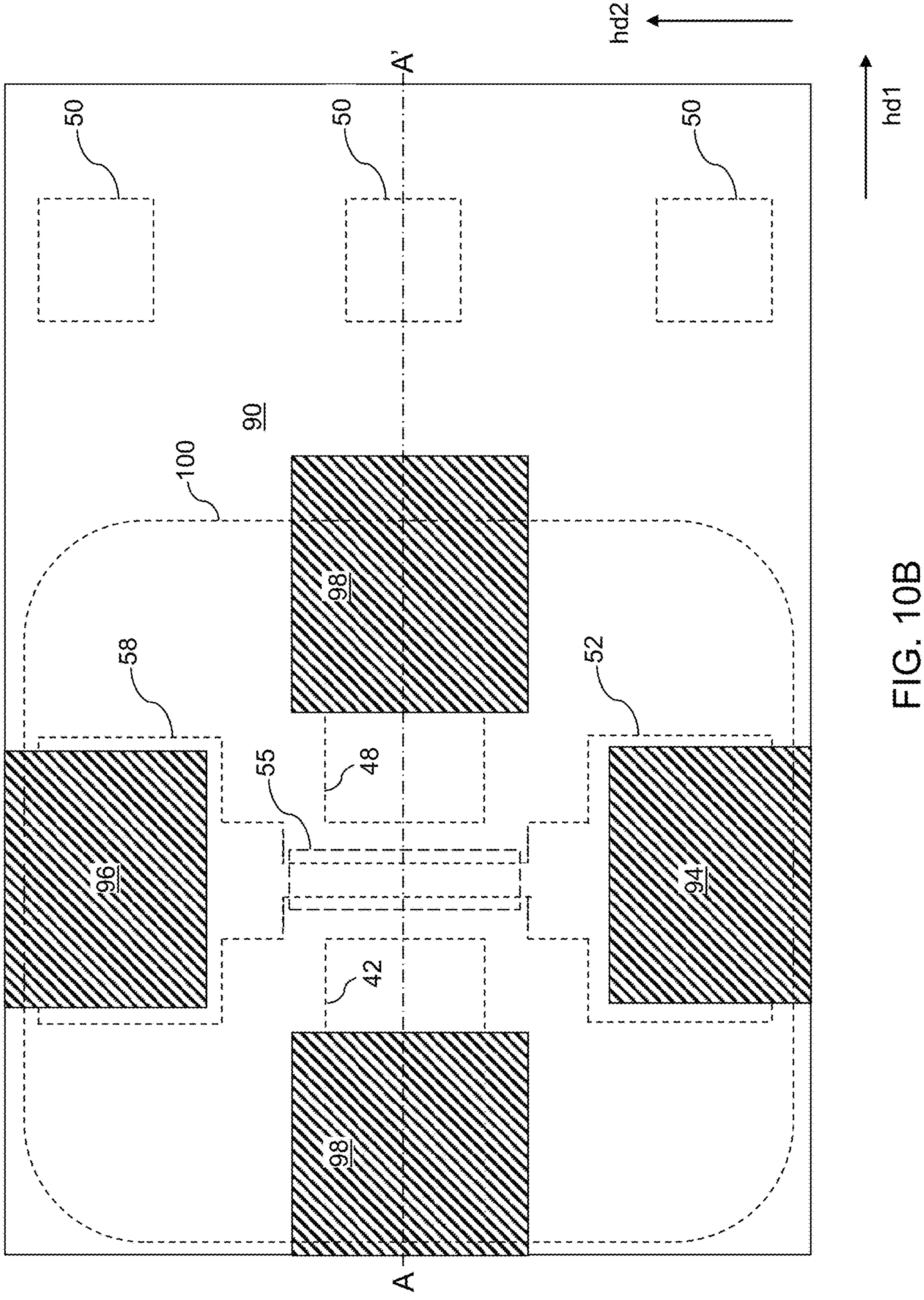
FIG. 10B is a top-down view of the first embodiment structure of FIG. 10A.

Referring to FIGS. 10A and 10B, a line-level dielectric layer 90 may be formed over the via-level dielectric layer 80. Metal line structures 98 may be formed in the line-level dielectric layer 90 to provide interconnections to and from various contact via structures (82, 88, 84, 86) and additional contact via structures (not illustrated) that are formed outside the region of the phase change memory switches 100. The metal line structures 94, 96, 98 may be formed by forming line cavities through the line-level dielectric layer 90 using a fourth anisotropic etch process. The electrostatic discharge path EDP may discharge electrostatic charges that accumulate in the via-level dielectric layer 80 and in the insulating layer 24 into the semiconductor substrate 8 during the fourth anisotropic etch process, thereby protecting the semiconductor devices 701 on the semiconductor substrate 8 during the fourth anisotropic etch process. At least one metallic material may be deposited in the line cavities, and excess portions of the at least one metallic material may be removed from above the horizontal plane including the top surface of the line-level dielectric layer 90. Remaining portions of the at least one metallic material comprise the metal line structures 94, 96, 98.

Alternatively, a combination of the contact via structures (82, 88, 84, 86) and the metal line structures 98 may be formed as integrated metal interconnect structures by patterning the least one conductive material that is deposited at the processing steps of FIGS. 9A and 9B with line patterns above the horizontal plane including the top surface of the via-level dielectric layer 80. In this embodiment, a fourth anisotropic etch process may be performed to pattern the portion of the at least one conductive material that overlies the top surface of the via-level dielectric layer 80 into the metal line structures 98. The electrostatic discharge path EDP may discharge electrostatic charges that accumulate in the via-level dielectric layer 80 and in the insulating layer 24 into the semiconductor substrate 8 during the fourth anisotropic etch process, thereby protecting the semiconductor devices 701 on the semiconductor substrate 8 during the fourth anisotropic etch process. The line-level dielectric layer 90 may be subsequently deposited to fill gaps between the metal line structures (94, 96, 98).

The pattern of the electrostatic discharge metal structures 50 may be selected to provide effective protection from plasma-induced damage for all components of the PCM switches 100. Further, the pattern of the metal line structures (94, 96, 98) may be selected to provide efficient electrical connections to and from various PCM switches 100 used to provide a radio-frequency (RF) switching circuit.

Figure 11:
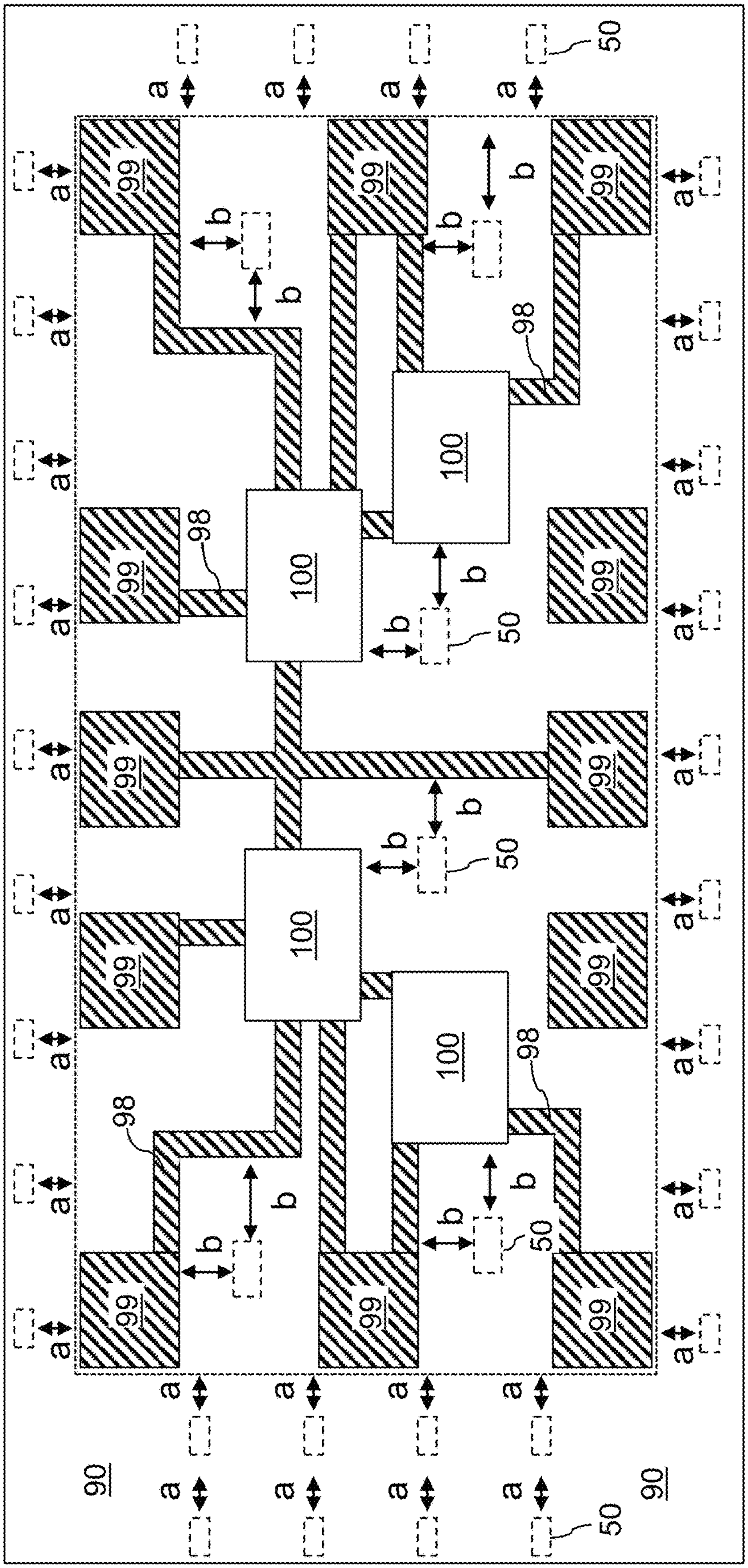
FIG. 11 is a top-down view of the first embodiment structure of the present disclosure.

Referring to FIG. 11, a top-down view of an example of such an RF switching circuit is illustrated. In some embodiments, various metal pad structures 99 may be connected to, a respective subset of the metal line structures 98. In one embodiment, the various metal pad structures 99 may be formed at the level of the line-level dielectric layer 90 concurrently with formation of the metal line structures 98. In one embodiment, each contiguous set of a metal pad structure 99 and at least one metal line structure 98 may be formed as a respective integral structure, i.e., a single continuous structure. For example, each contiguous set of a metal pad structure 99 and at least one metal line structure 98 may be formed by patterning at least one conductive material that is deposited after formation of the contact via structures (82, 88, 84, 86). In an alternative example, each contiguous set of a metal pad structure 99, at least one metal line structure 98, and at least one contact via structures (82, 88, 84, 86) may be formed by depositing at least one conductive material in the contact via cavities in the via-level dielectric layer 80 and over the via-level dielectric layer 80, and by patterning the portion of the at least one conductive material from above the horizontal plane including the top surface of the via-level dielectric layer 80.

In one embodiment, the metal pad structures 99 may be bonding pad structures, such as solder bonding pads to which a solder ball may be directly attached, or metal-to-metal bonding pads that may be bonded to another metal-to-metal bonding pad in a different semiconductor die or package by metal-to-metal bonding (such as copper-to-copper bonding) without any intermediate solder material portions.

The layout of the electrostatic discharge metal structures 50 may be selected such that at least partial protection from plasma-induced damage is provided during one or more of the first anisotropic etch process, the second anisotropic etch process, the third anisotropic etch process, the fourth anisotropic etch process, and during the anisotropic etch process that patterns the continuous thermally-conductive and electrically-insulating layer 60L. Generally, the effectiveness of the electrostatic charge dissipation may depend on the proximity of the charge accumulation region to the electrostatic discharge metal structures 50 during each of the anisotropic etch processes, and tends to be most effective during the first anisotropic etch process and becomes less effective as more material portions are interposed between an etched material layer and the electrostatic discharge metal structures 50.

For example, a combination of a first maximum lateral offset distance a and a second maximum lateral offset distance b may be used in the layout of the electrostatic discharge metal structures 50. In this example, a first subset of the electrostatic discharge metal structures 50 may be formed around, and outside, the area of the RF switch circuit such that the first subset of the electrostatic discharge metal structures 50 is formed at a respective lateral distance from the periphery of the area of the RF switch circuit that does not exceed the first maximum lateral offset distance a. Further, the second subset of the electrostatic discharge metal structures 50 may be formed inside the area of the RF switch circuit such that an electrostatic discharge metal structure 50 is provided at a lateral distance that does not exceed the second maximum lateral offset distance b from a most proximal one of the phase change memory switches 100. Each phase change memory switch 100 may be provided with at least one electrostatic discharge metal structure 50 that is located within the second maximum lateral offset distance b. Optionally, a subset of the electrostatic discharge metal structures 50 may be formed as an array.

Figure 12B:
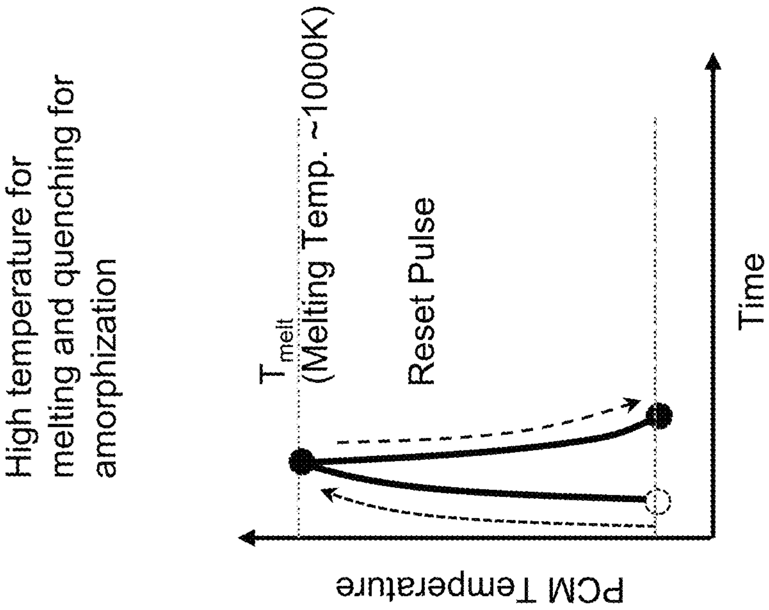
FIG. 12B illustrates a pulse pattern of a reset pulse for inducing a high-resistance state in the phase change material portion.
Figure 12A:
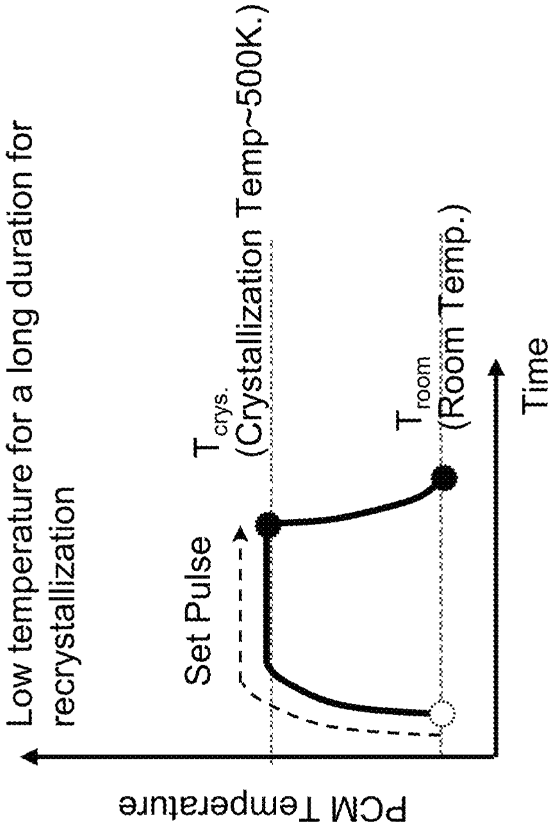
FIG. 12A illustrates a pulse pattern of a set pulse for inducing a low-resistance state in a phase change material portion.

FIG. 12A illustrates a pulse pattern of a set pulse for inducing a low-resistance state in a phase change material portion 70. FIG. 12B illustrates a pulse pattern of a reset pulse for inducing a high-resistance state in the phase change material portion 70. The programming of the phase change material portion 70 in the phase change memory switches 100 of the present disclosure may be performed using the scheme of crystallization and amorphization of the phase change material as known in the art. Generally, a phase change memory switch 100 may be programmed into a low-resistance state using a set pulse that crystallizes a phase change material portion by raising the temperature of the phase change material portion to a first elevated temperature of about 500 degrees Celsius, and holding the phase change material portion at the elevated temperature for a time duration of about 1 microsecond. A phase change memory switch 100 may be programmed into a high-resistance state using a reset pulse that melts a phase change material portion by raising the temperature of the phase change material portion to a second elevated temperature of about 1,000 degrees Celsius, and by immediately turning off the electrical current through the heater element (52, 55, 58) for fast quenching of the phase change material into an amorphous state which provides high electrical resistance. The duration of the reset pulse is typically about 150 nanoseconds. A phase change memory switch 100 is turned off, i.e., is in an off-state, if the phase change material is in the high electrical resistance state. A phase change memory switch 100 is turned on, i.e., is in an on-state, if the phase change material is in the low electrical resistance state.

Figure 13A:
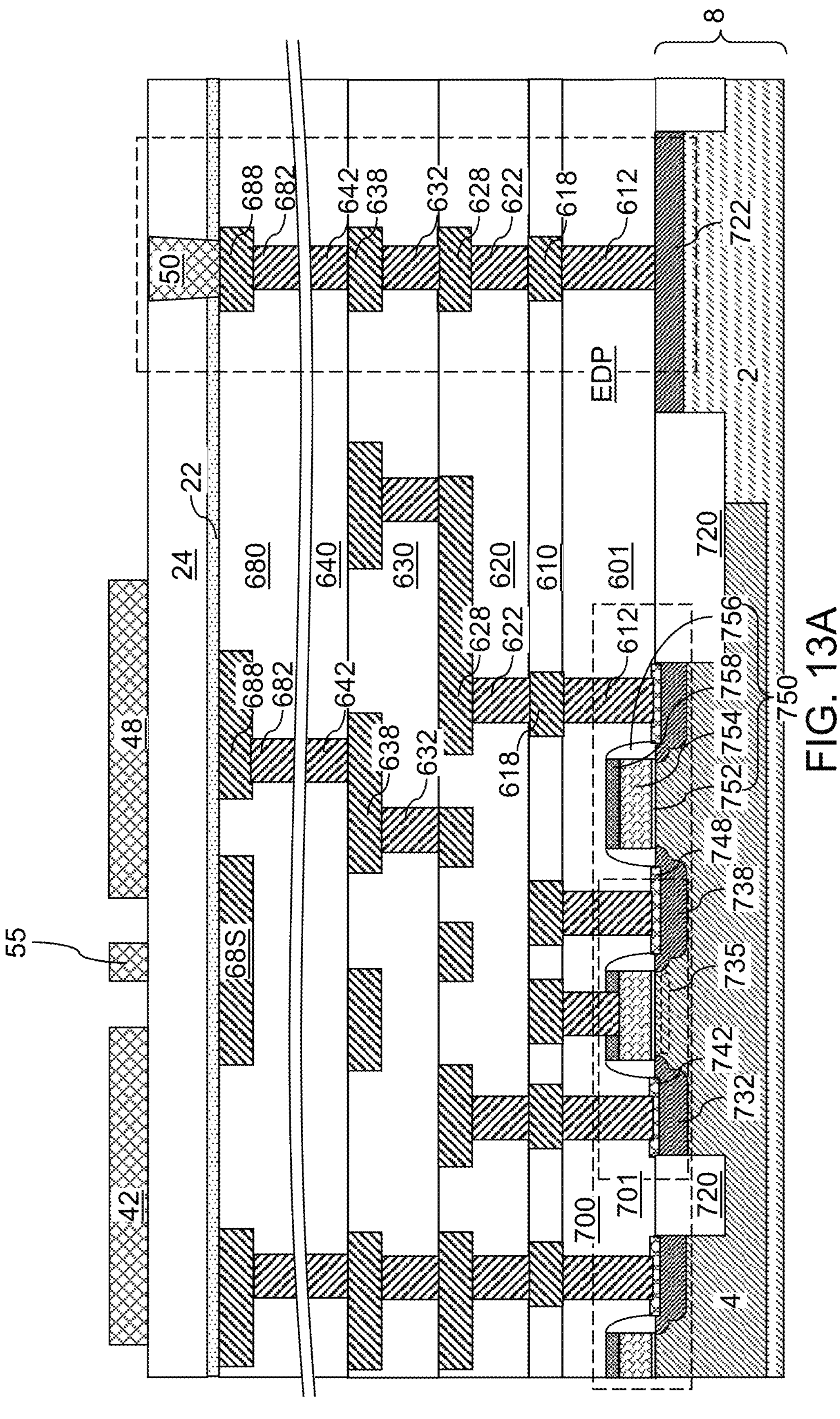
FIG. 13A is a vertical cross-sectional view of a second embodiment structure after formation of a heater element, a first electrode, a second electrode, and an electrostatic discharge metal structure according to embodiments of the present disclosure.
Figure 13B:
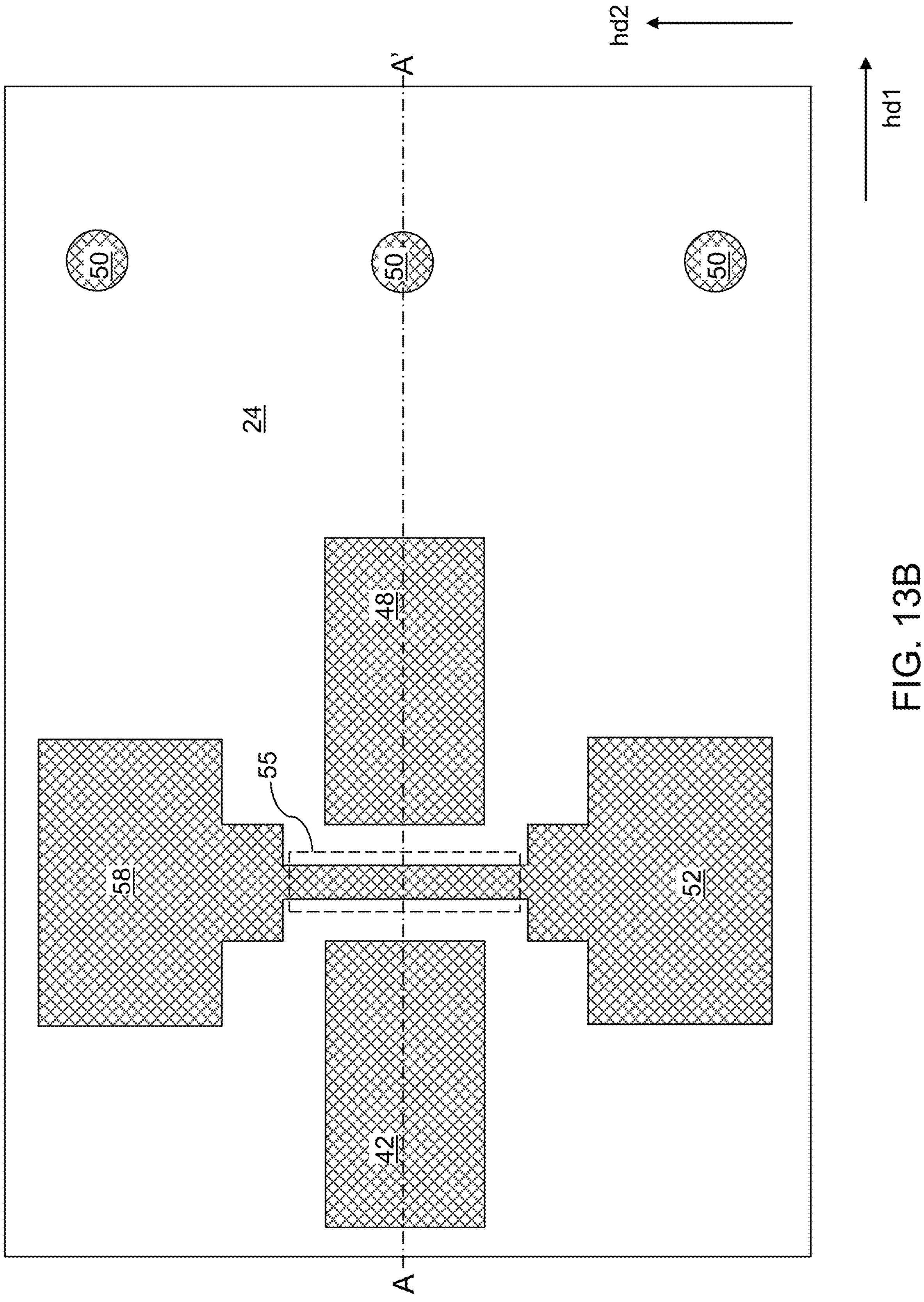
FIG. 13B is a top-down view of the second embodiment structure of FIG. 13A.

Referring to FIGS. 13A and 13B, a second embodiment structure may be derived from the first embodiment structure illustrated in FIG. 3 by alternating the pattern of the patterned etch mask layer that is used to pattern the metal layer 50L. Specifically, the patterned etch mask layer does not cover the areas of the via openings 29 during the anisotropic etch process that patterns the metal layer 50L. Thus, portions of the metal layer 50L that overlie the horizontal plane that contains the top surface of the insulating layer 24 are removed from the region in which the electrostatic discharge metal structures 50 are formed. In this embodiment, the top surface of each electrostatic discharge metal structure 50 may be formed within the horizontal plane that contains the bottom surface of the heater element (52, 55, 58).

Figure 14A:
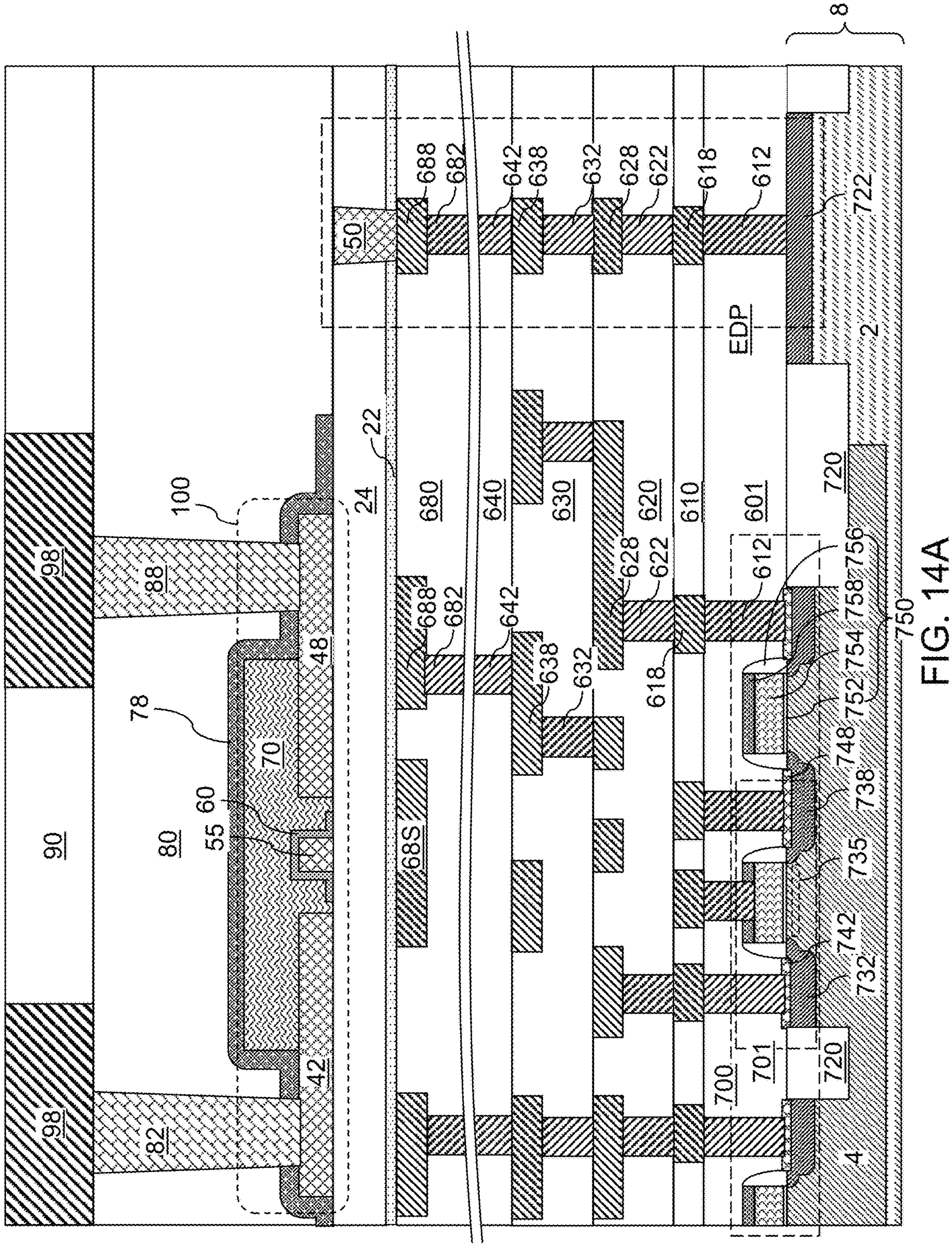
FIG. 14A is a vertical cross-sectional view of the second embodiment structure after formation of a line-level dielectric layer and metal line structures according to an embodiment of the present disclosure.
Figure 14B:
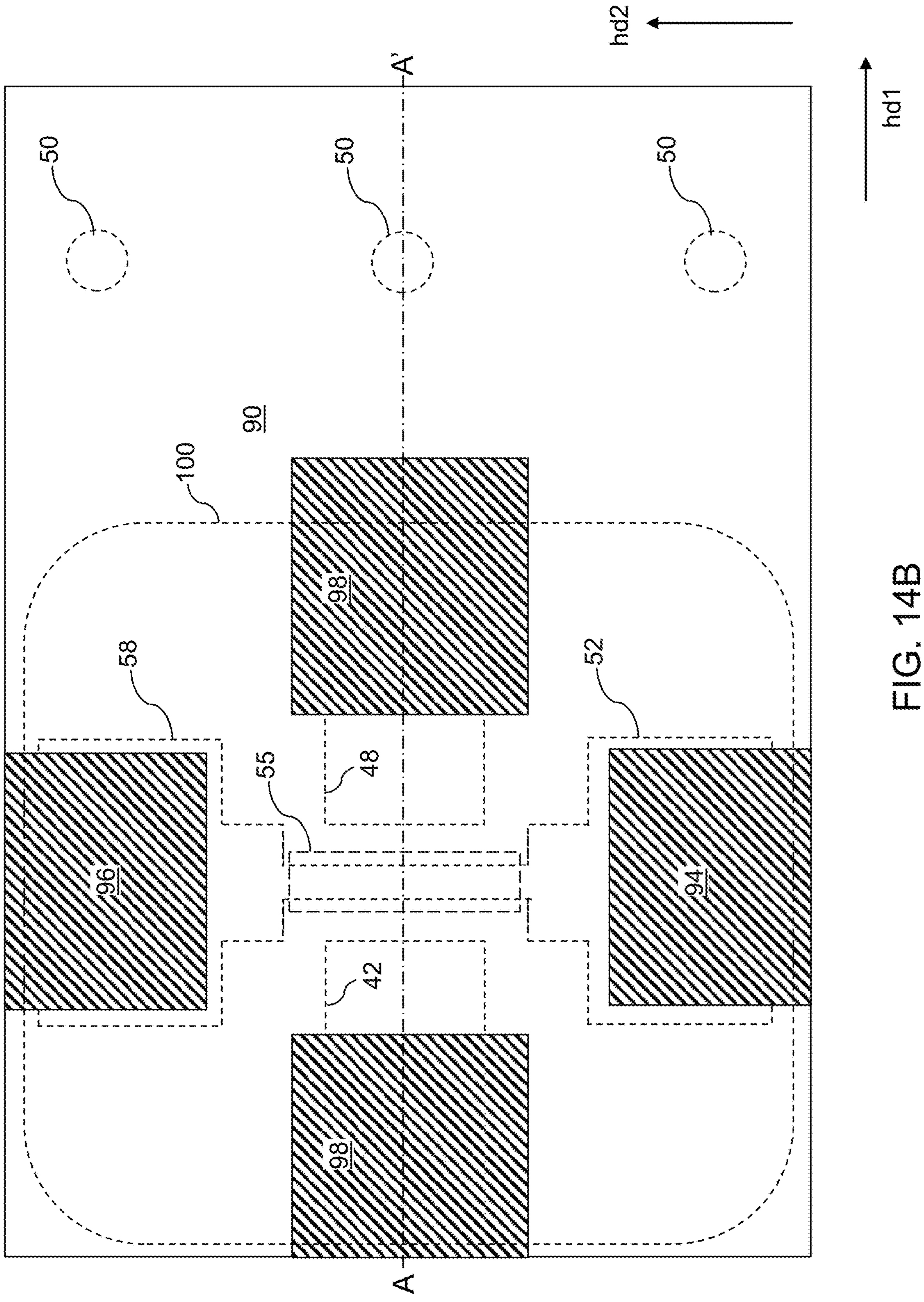
FIG. 14B is a top-down view of the second embodiment structure of FIG. 14A.

Referring to FIGS. 14A and 14B, the processing steps described with reference to FIGS. 5-11 may be performed to provide an RF switching circuit including phase change memory switches 100.

Figure 15A:
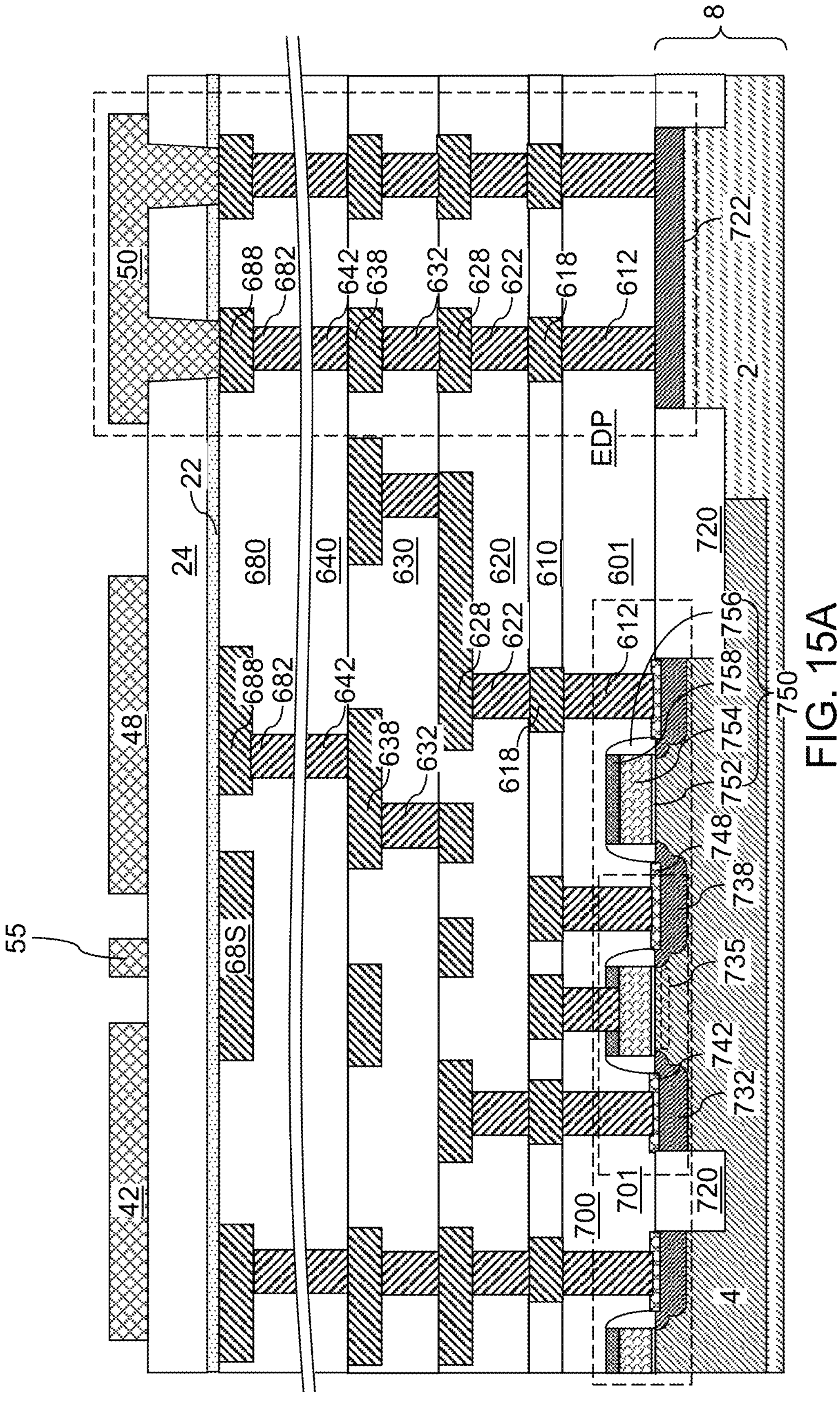
FIG. 15A is a vertical cross-sectional view of a third embodiment structure after formation of a heater element, a first electrode, a second electrode, and an electrostatic discharge metal structure according to embodiments of the present disclosure.
Figure 15B:
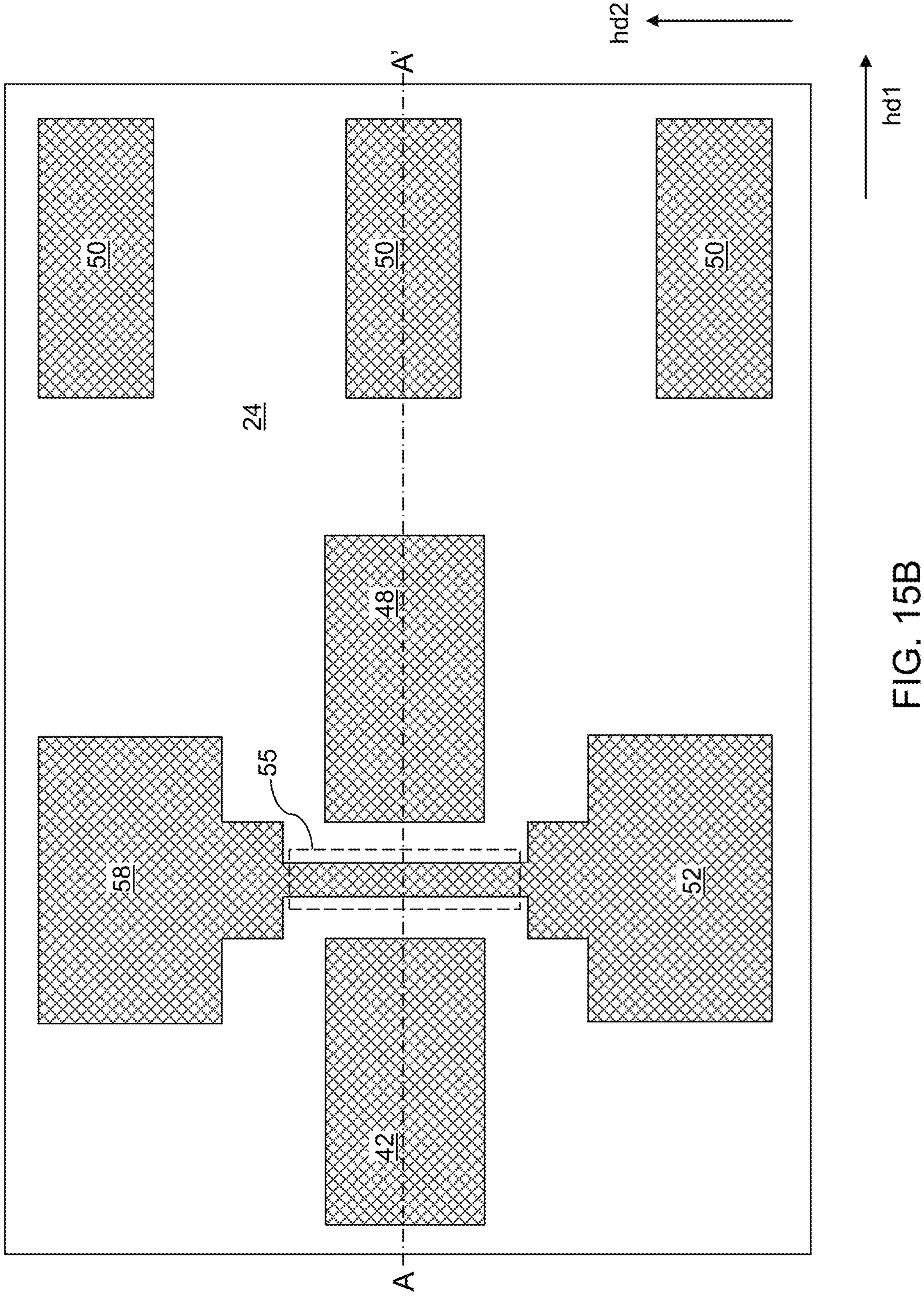
FIG. 15B is a top-down view of the third embodiment structure of FIG. 15A.

Referring to FIGS. 15A and 15B, a third embodiment structure may be derived from the first embodiment structure illustrated in FIG. 2 by etching at least one additional via opening 29 through at least the insulating layer 24 adjacent to the via opening 29 that is formed on an electrostatic discharge path EDP. Multiple top surface segments of the metal interconnect structures (612, 618, 622, 628, 632, 638, 642, 682, 688) are exposed underneath multiple via openings 29 that are formed as a cluster of via openings 29. Multiple top surface segments of a single metal interconnect structure (612, 618, 622, 628, 632, 638, 642, 682, or 688), or multiple top surface segments of multiple metal interconnect structures (612, 618, 622, 628, 632, 638, 642, 682, and/or 688) may be exposed underneath the multiple via openings 29 that overlie an electrostatic discharge path EDP. Subsequently, the processing steps described with reference to FIGS. 3 and 4A may be performed to deposit and pattern a metal layer 50L.

In one embodiment, the patterned etch mask layer used to pattern the metal layer 50L may cover clusters of multiple via openings 29. Patterned portions of the metal layer 50L comprise electrostatic discharge metal structures 50. At least one electrostatic discharge metal structure 50 may comprise at least two via portions that fill a respective one of multiple via opening 29, and may further comprise a plate portion that overlies each of the at least two via portions. In other words, at least one electrostatic discharge metal structure 50 may comprise a plurality of via portions that vertically extend through the insulating layer 24, and a plate portion that overlies the insulating layer 24 and each of the plurality of via portions.

The electrostatic discharge metal structure 50 may be incorporated into an electrostatic discharge path EDP that includes a doped semiconductor region 722 and at least one contiguous set of metal interconnect structures (612, 618, 622, 628, 632, 638, 642, 682, 688) that is electrically connected to the doped semiconductor region 722. In one embodiment, an electrostatic discharge path EDP may comprise a doped semiconductor region 722, multiple contiguous sets of metal interconnect structures (612, 618, 622, 628, 632, 638, 642, 682, 688) that are electrically connected to the doped semiconductor region 722, and an electrostatic discharge metal structure 50 that contacts each of the multiple contiguous sets of metal interconnect structures (612, 618, 622, 628, 632, 638, 642, 682, 688). In this embodiment, the multiple contiguous sets of metal interconnect structures (612, 618, 622, 628, 632, 638, 642, 682, 688) are connected to the doped semiconductor region 722 and the electrostatic discharge metal structure 50 in a parallel connection to one another.

Figure 16A:
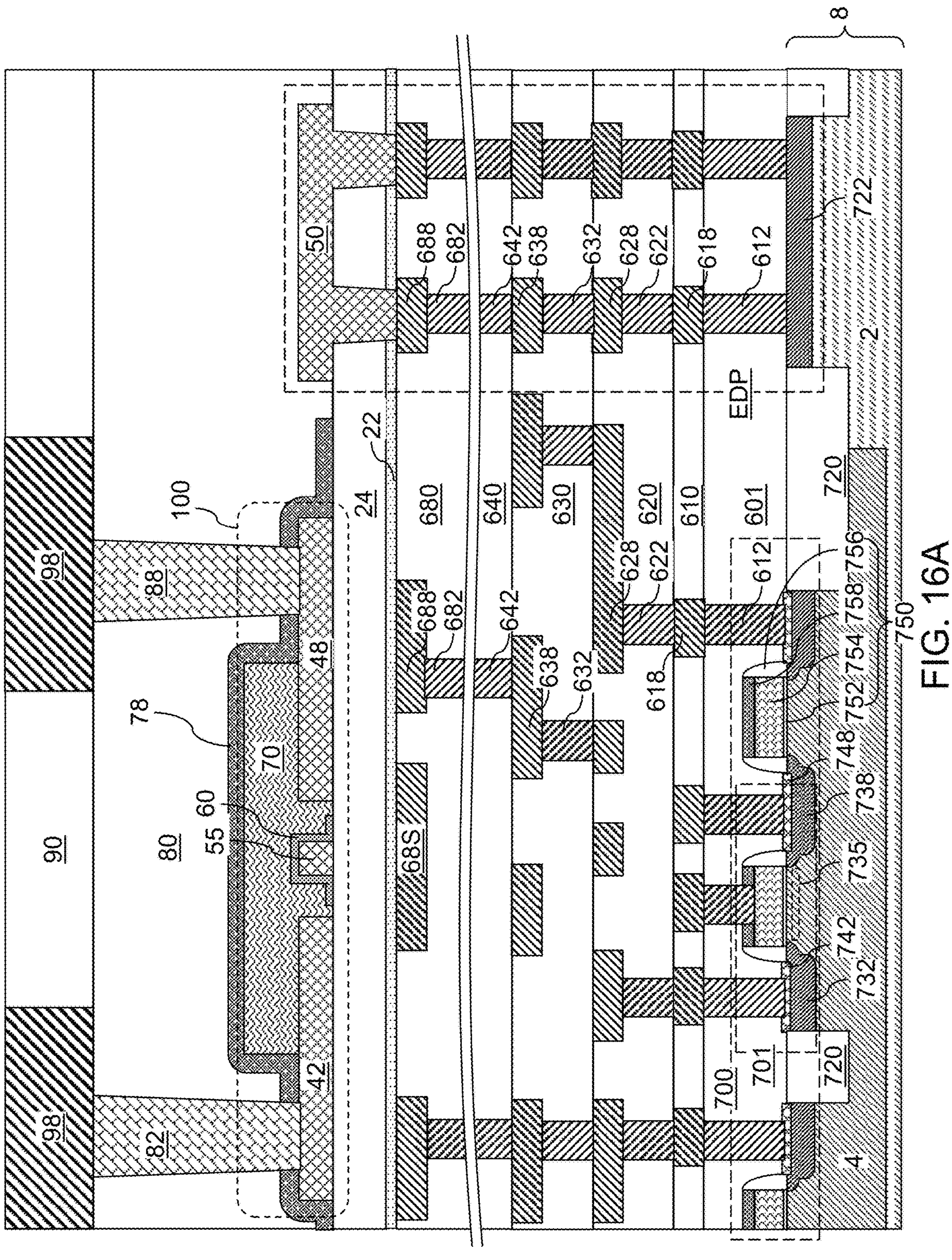
FIG. 16A is a vertical cross-sectional view of the third embodiment structure after formation of a line-level dielectric layer and metal line structures according to an embodiment of the present disclosure.
Figure 16B:
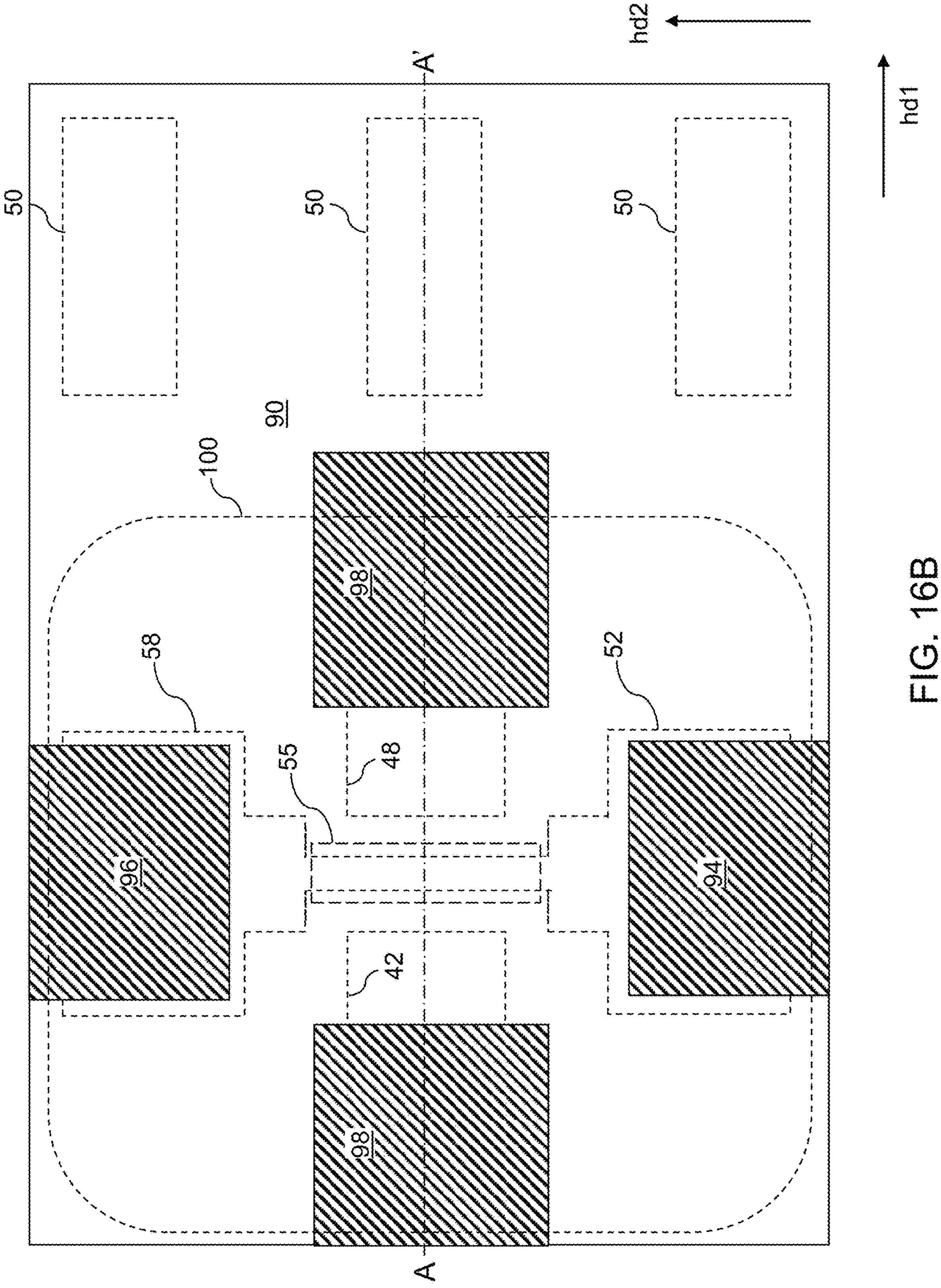
FIG. 16B is a top-down view of the third embodiment structure of FIG. 16A.

Referring to FIGS. 16A and 16B, the processing steps described with reference to FIGS. 5-11 may be performed to provide an RF switching circuit including phase change memory switches 100.

Figure 17:
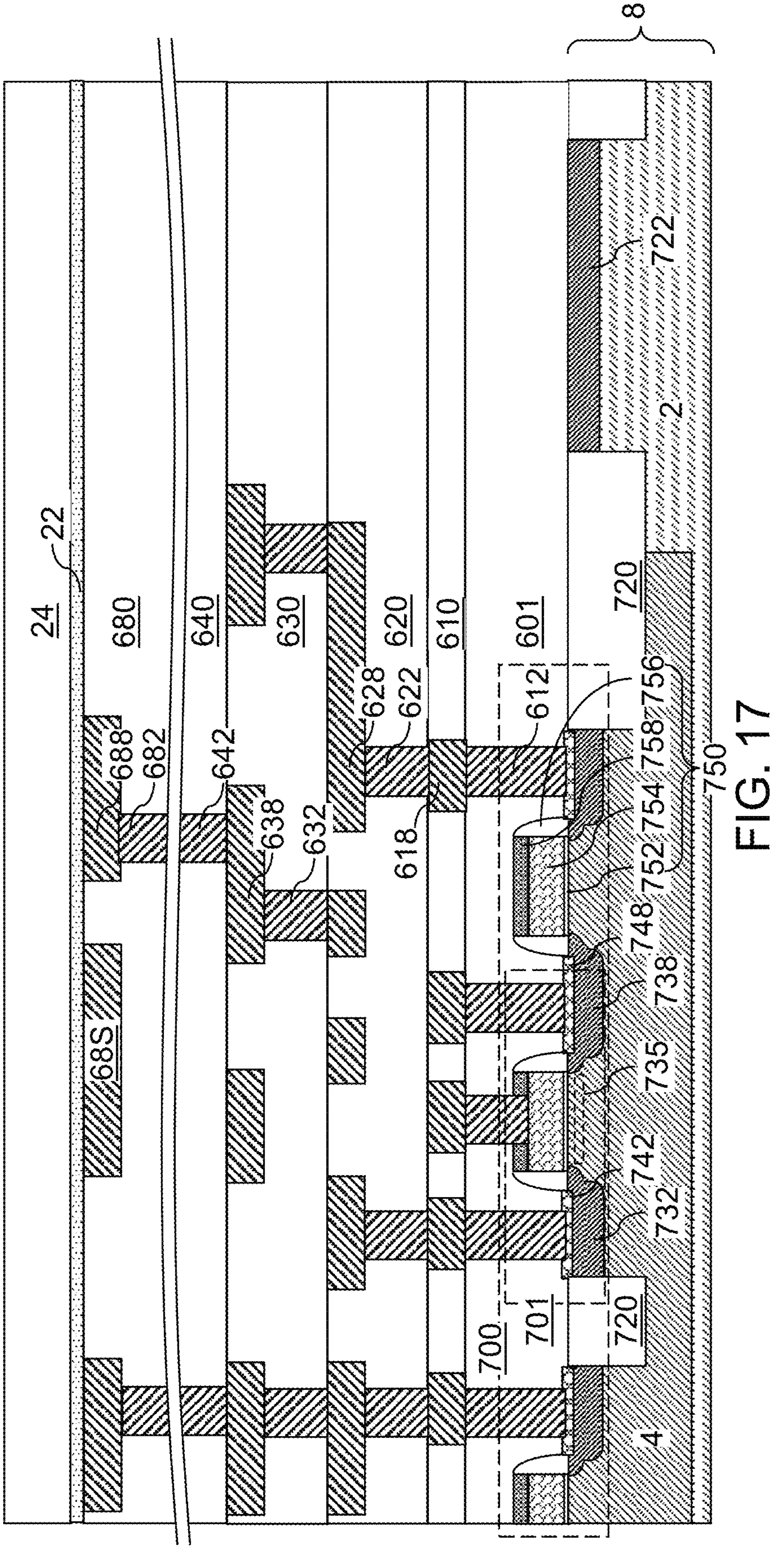
FIG. 17 is a vertical cross-sectional view of a fourth embodiment structure after formation of complementary metal-oxide-semiconductor (CMOS) transistors, metal interconnect structures and dielectric material layers, an optional dielectric capping layer, and an insulating layer according to an embodiment of the present disclosure.

Referring to FIG. 17, a fourth embodiment structure of the present disclosure may be derived from the first embodiment structure illustrated in FIG. 1 by omitting formation of a subset of the metal interconnect structures (612, 618, 622, 628, 632, 638, 642, 682, 688) that is electrically connected to the doped semiconductor region 722.

Figure 18:
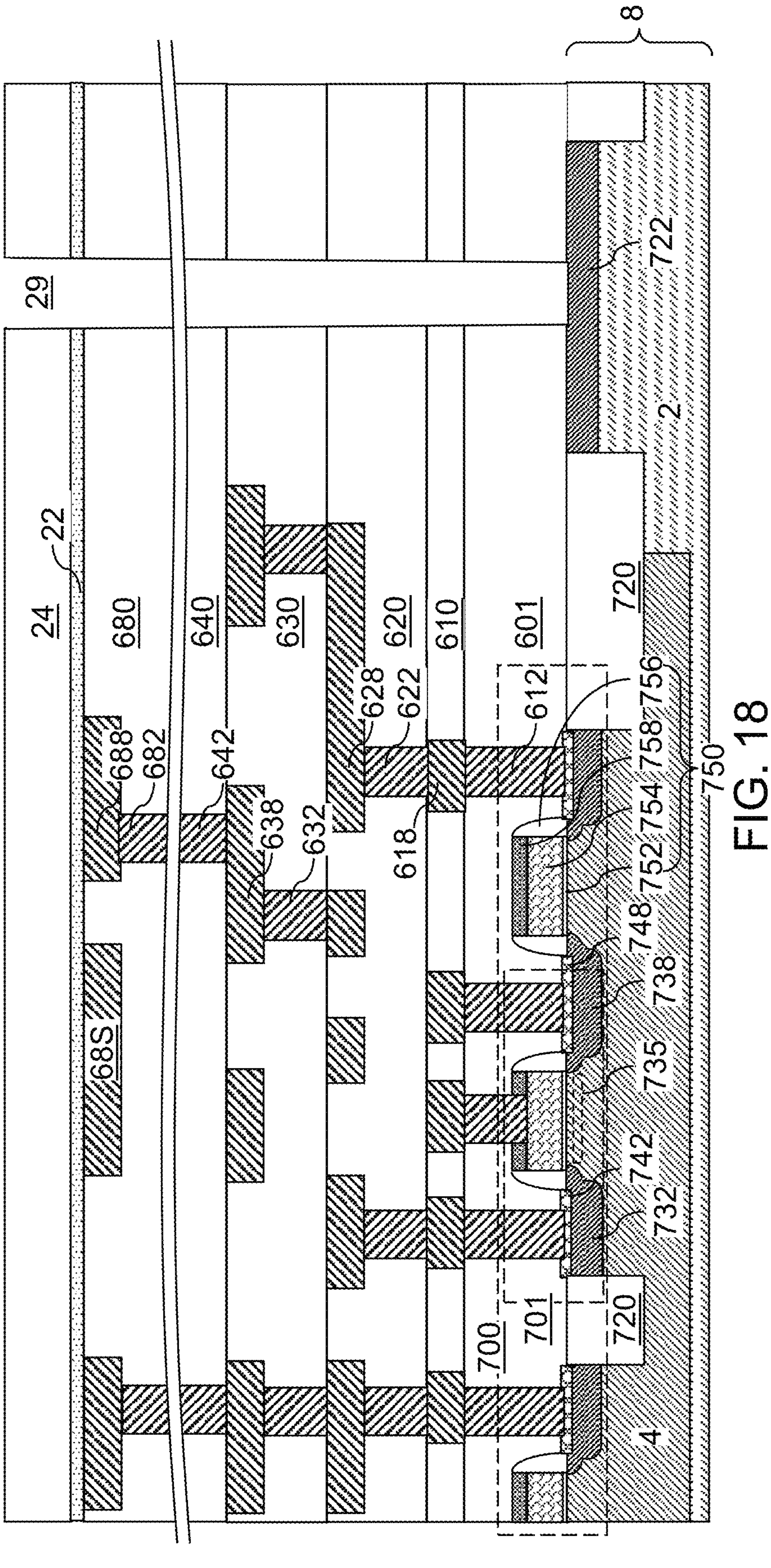
FIG. 18 is a vertical cross-sectional view of the fourth embodiment structure after formation of via openings according to an embodiment of the present disclosure.

Referring to FIG. 18, the processing steps described with reference to FIG. 2 may be performed with a modification in the depth of the via openings 29. Specifically, the depth of the via openings may be increased such that a top surface segment of the doped semiconductor region 722 is physically exposed at the bottom of each via opening 29. Thus, the via openings 29 may be formed through the insulating layer 24 and through each of the dielectric material layers (601, 610, 620, 630, 640, 680). The locations of the via openings 29 in a plan view (such as a top-down view) may be modified as needed to ensure that a top surface segment of a doped semiconductor region 722 is physically exposed at the bottom of each via opening 29.

Figure 19:
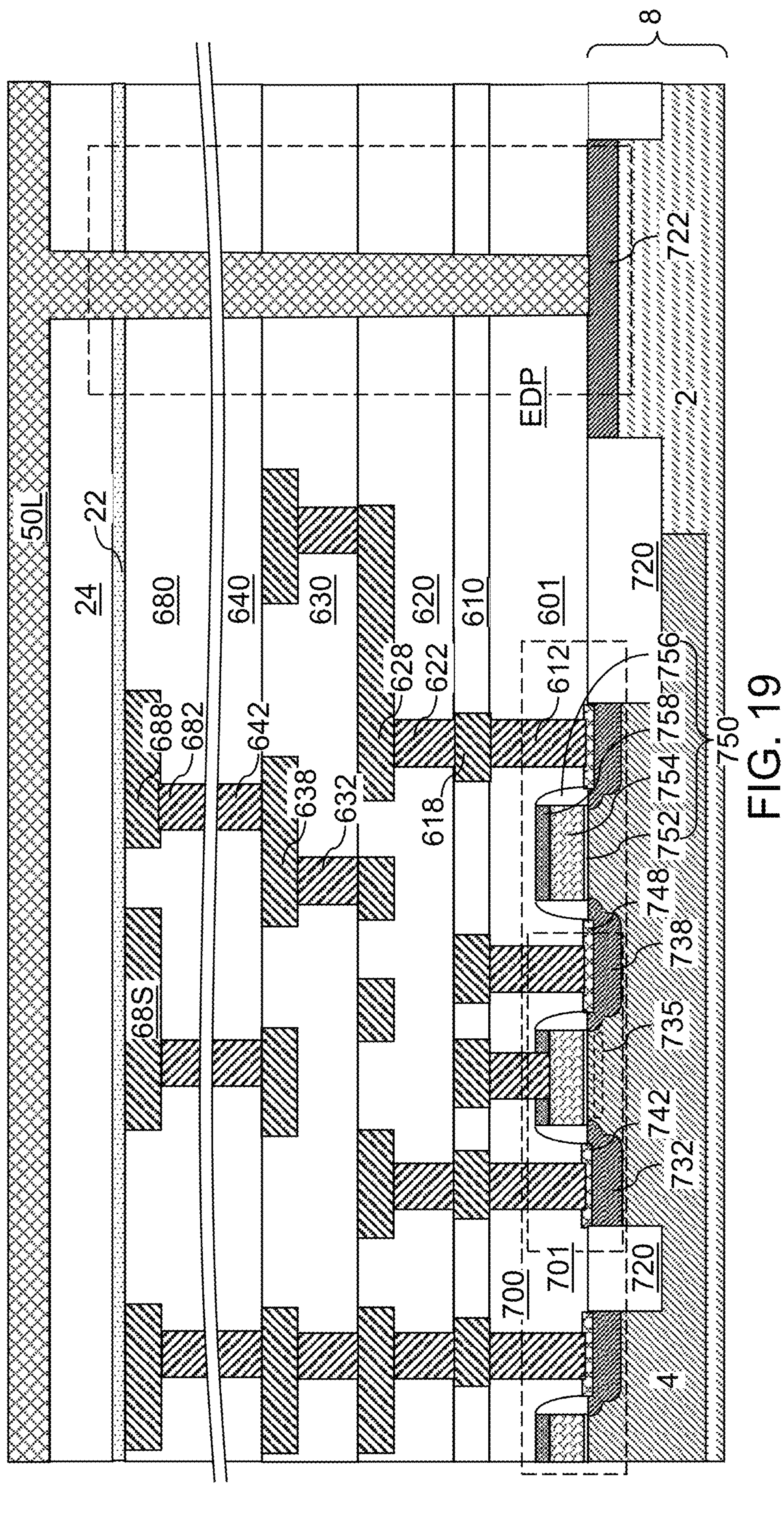
FIG. 19 is a vertical cross-sectional view of the fourth embodiment structure after deposition of a metal layer according to an embodiment of the present disclosure.

Referring to FIG. 19, the processing steps described with reference to FIG. 3 may be performed to form a metal layer 50L. The metal layer 50L is deposited directly on each physically exposed surface of the doped semiconductor region(s) 722.

Figure 20A:
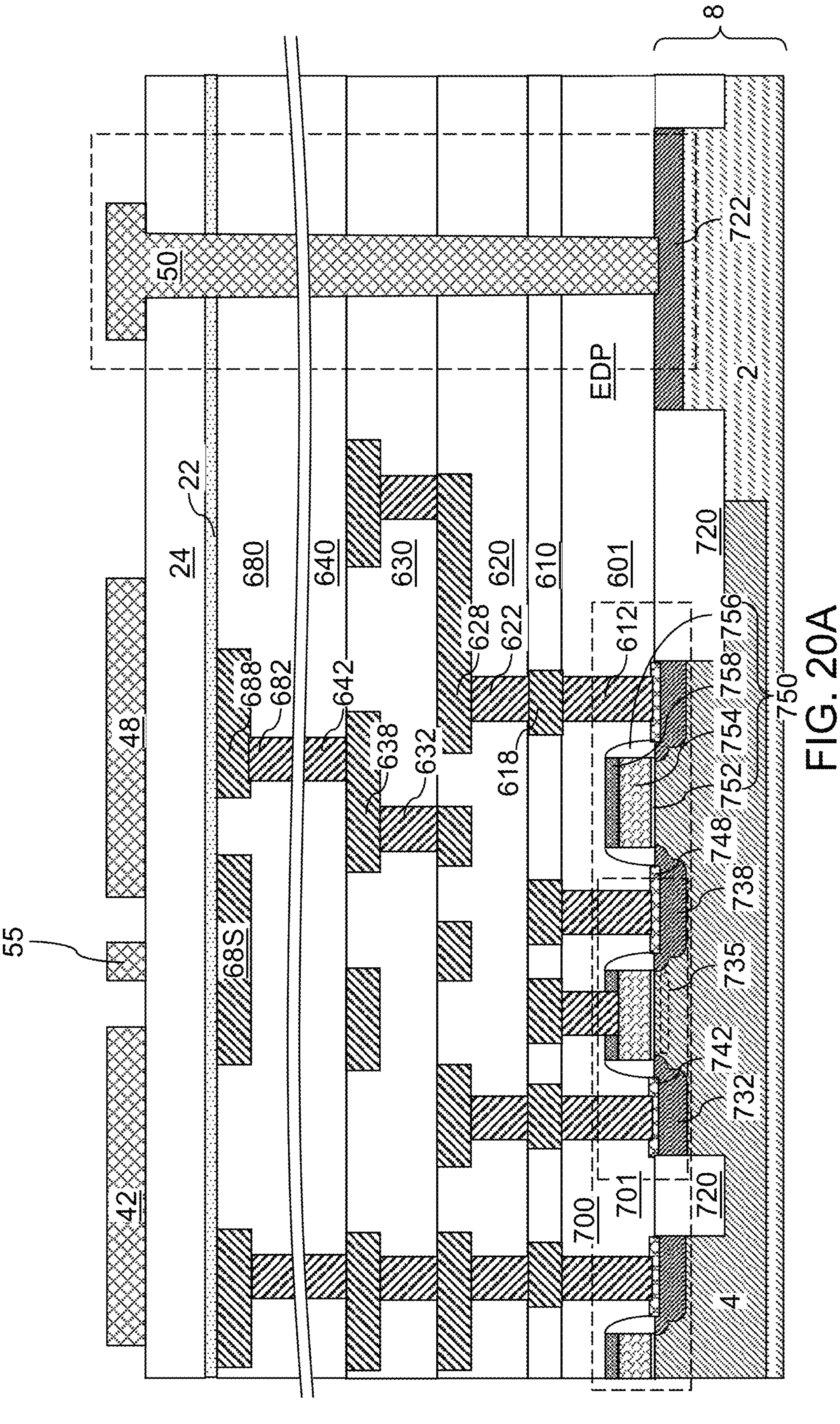
FIG. 20A is a vertical cross-sectional view of the fourth embodiment structure after formation of a heater element, a first electrode, a second electrode, and an electrostatic discharge metal structure according to embodiments of the present disclosure.
Figure 20B:
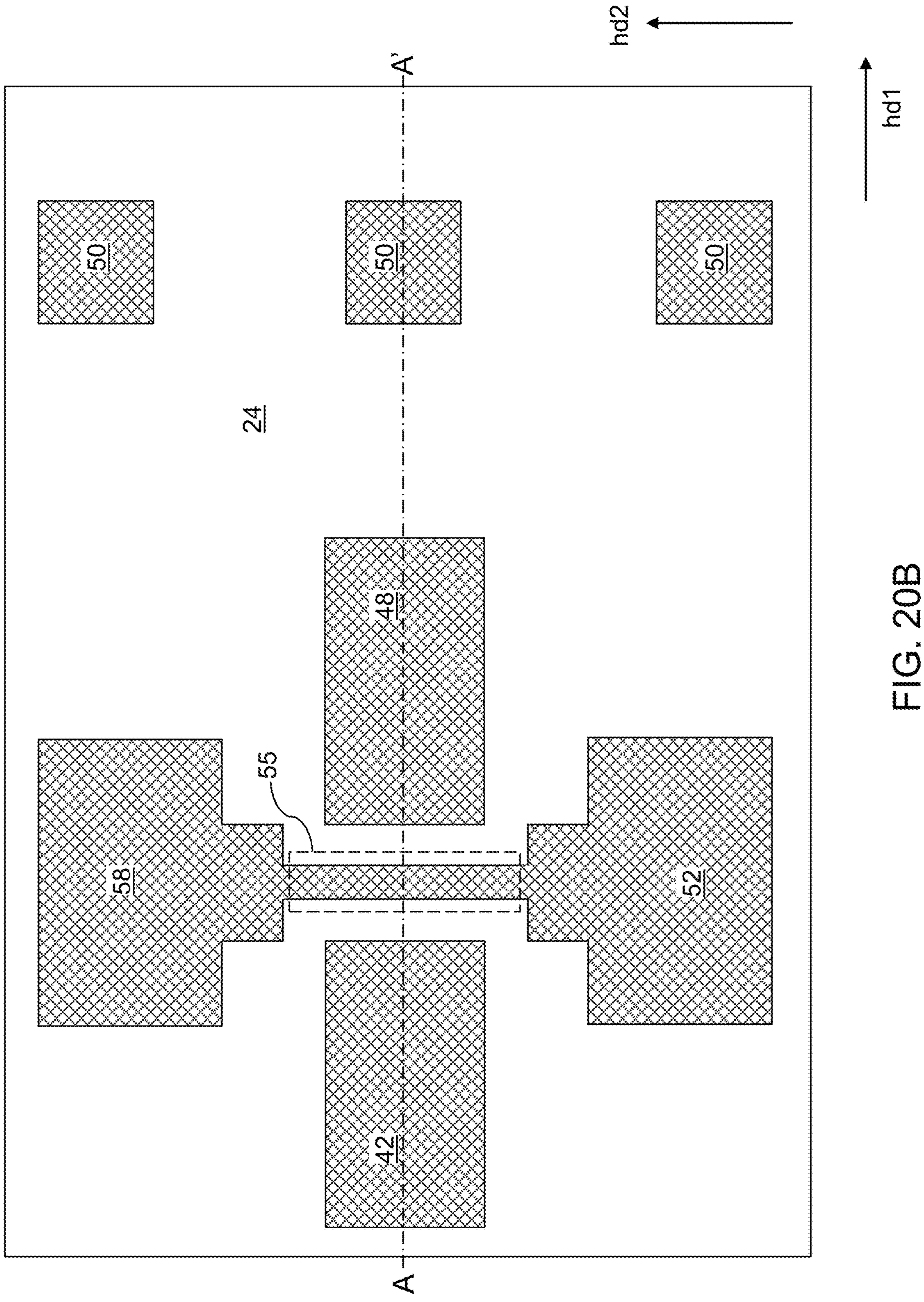
FIG. 20B is a top-down view of the fourth embodiment structure of FIG. 20A.

Referring to FIGS. 20A and 20B, the processing steps described with reference to FIGS. 4A and 4B may be performed to pattern the metal layer 50L into electrostatic discharge metal structures 50, a heater element (52, 55, 58), a first electrode 42, and a second electrode 48. In this embodiment, each electrostatic discharge metal structure 50 may vertically extend through the insulating layer 24 and each of the dielectric material layers (601, 610, 620, 630, 640, 680), and may comprise a bottom surface that contacts a respective doped semiconductor region 722. In this embodiment, the top surface of each electrostatic discharge metal structure 50 may be formed within a horizontal plane including the top surfaces of the heater element (52, 55, 58), the first electrode 42, and the second electrode 48.

Figure 21A:
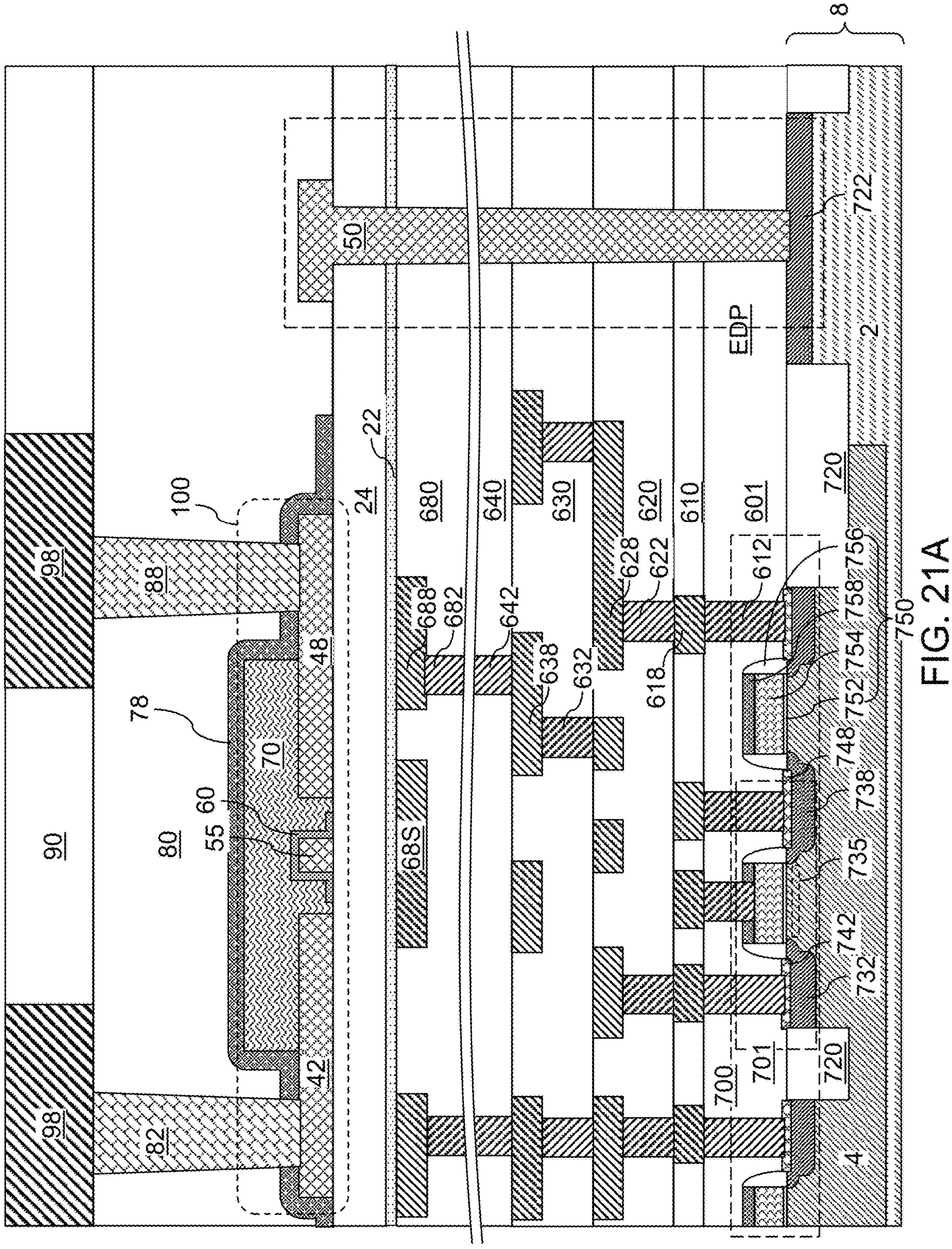
FIG. 21A is a vertical cross-sectional view of the fourth embodiment structure after formation of a line-level dielectric layer and metal line structures according to an embodiment of the present disclosure.
Figure 21B:
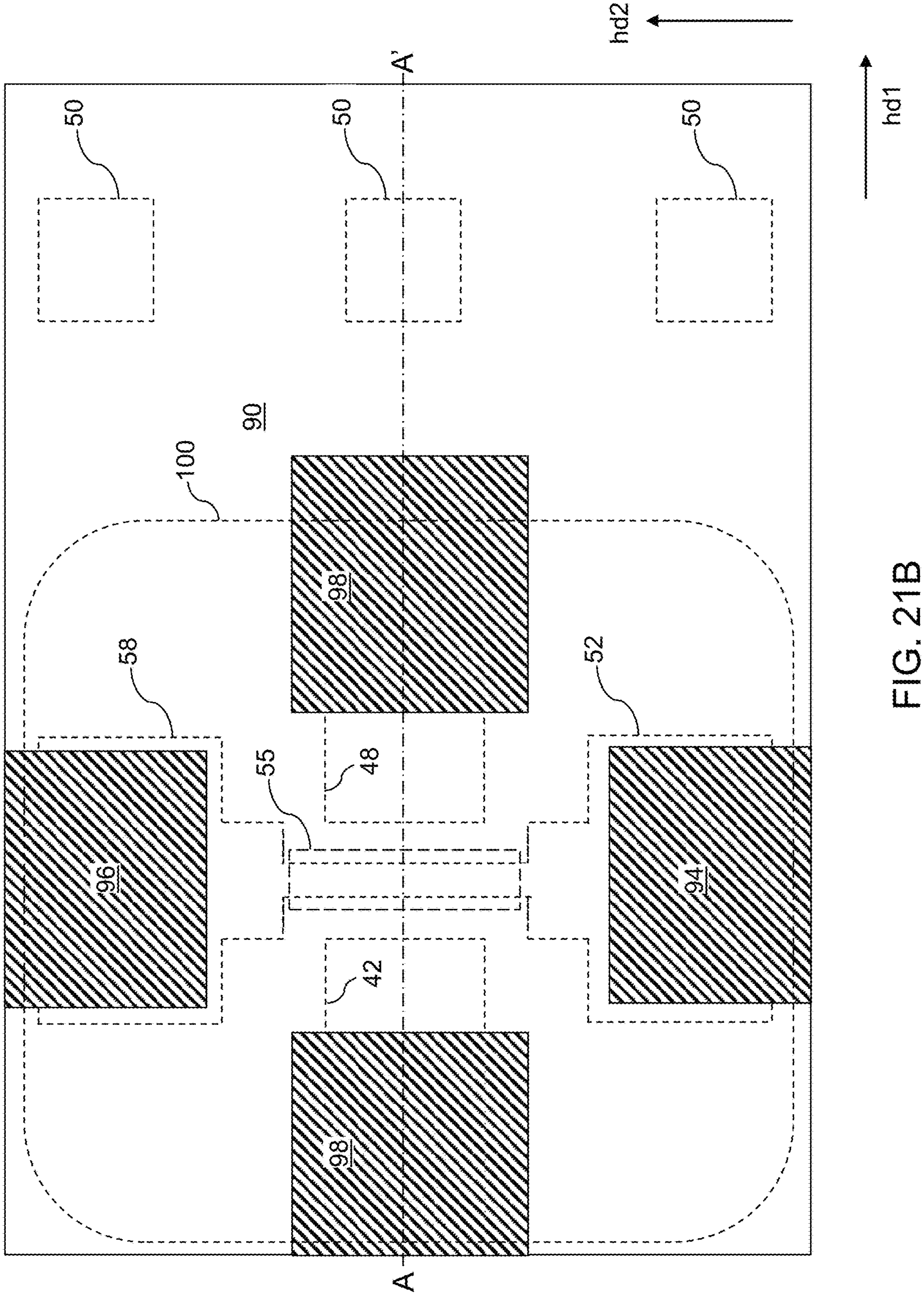
FIG. 21B is a top-down view of the fourth embodiment structure of FIG. 21A.

Referring to FIGS. 21A and 21B, the processing steps described with reference to FIGS. 5-11 may be performed to provide an RF switching circuit including phase change memory switches 100.

Figure 22A:
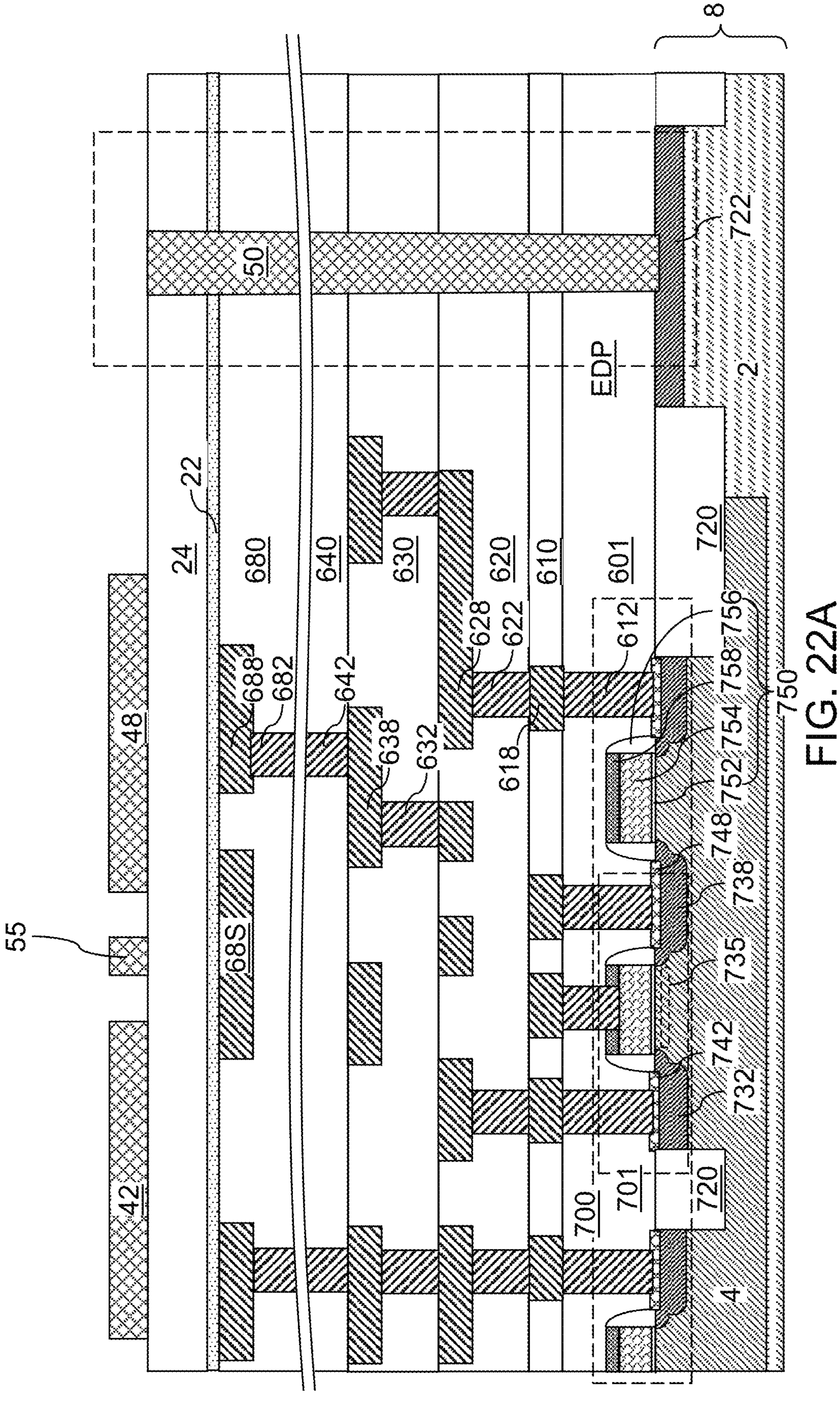
FIG. 22A is a vertical cross-sectional view of a fifth embodiment structure after formation of a heater element, a first electrode, a second electrode, and an electrostatic discharge metal structure according to embodiments of the present disclosure.
Figure 22B:
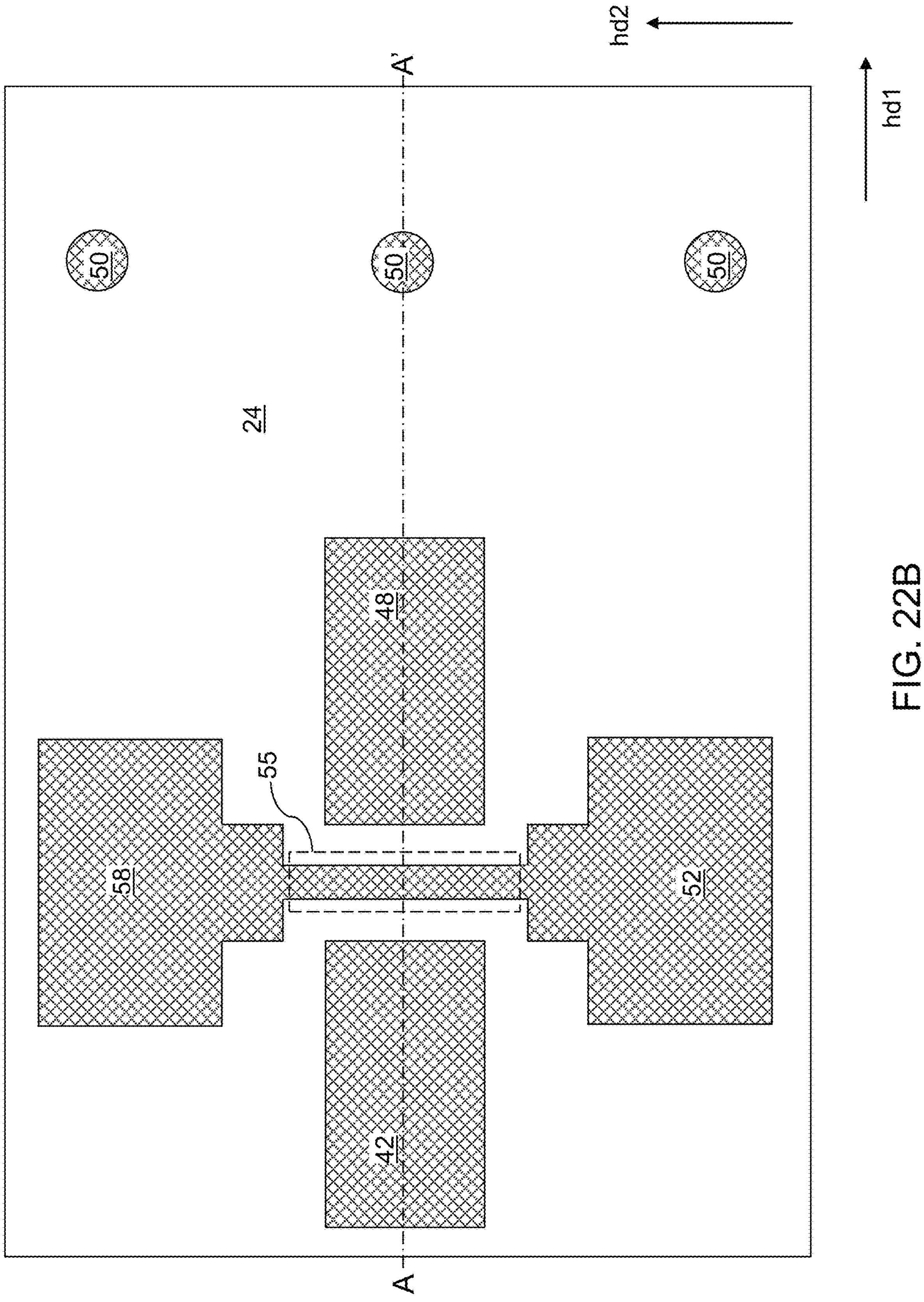
FIG. 22B is a top-down view of the fifth embodiment structure of FIG. 22A.

Referring to FIGS. 22A and 22B, a fifth embodiment structure of the present disclosure may be derived from the fourth embodiment structure illustrated in FIGS. 20A and 20B by alternating the pattern of the patterned etch mask layer that is used to pattern the metal layer 50L. Specifically, the patterned etch mask layer does not cover the areas of the via openings 29 during the anisotropic etch process that patterns the metal layer 50L. Thus, portions of the metal layer 50L that overlie the horizontal plane that contains the top surface of the insulating layer 24 are removed from the region in which the electrostatic discharge metal structures 50 are formed. In this embodiment, the top surface of each electrostatic discharge metal structure 50 may be formed within the horizontal plane that contains the bottom surface of the heater element (52, 55, 58).

Figure 23A:
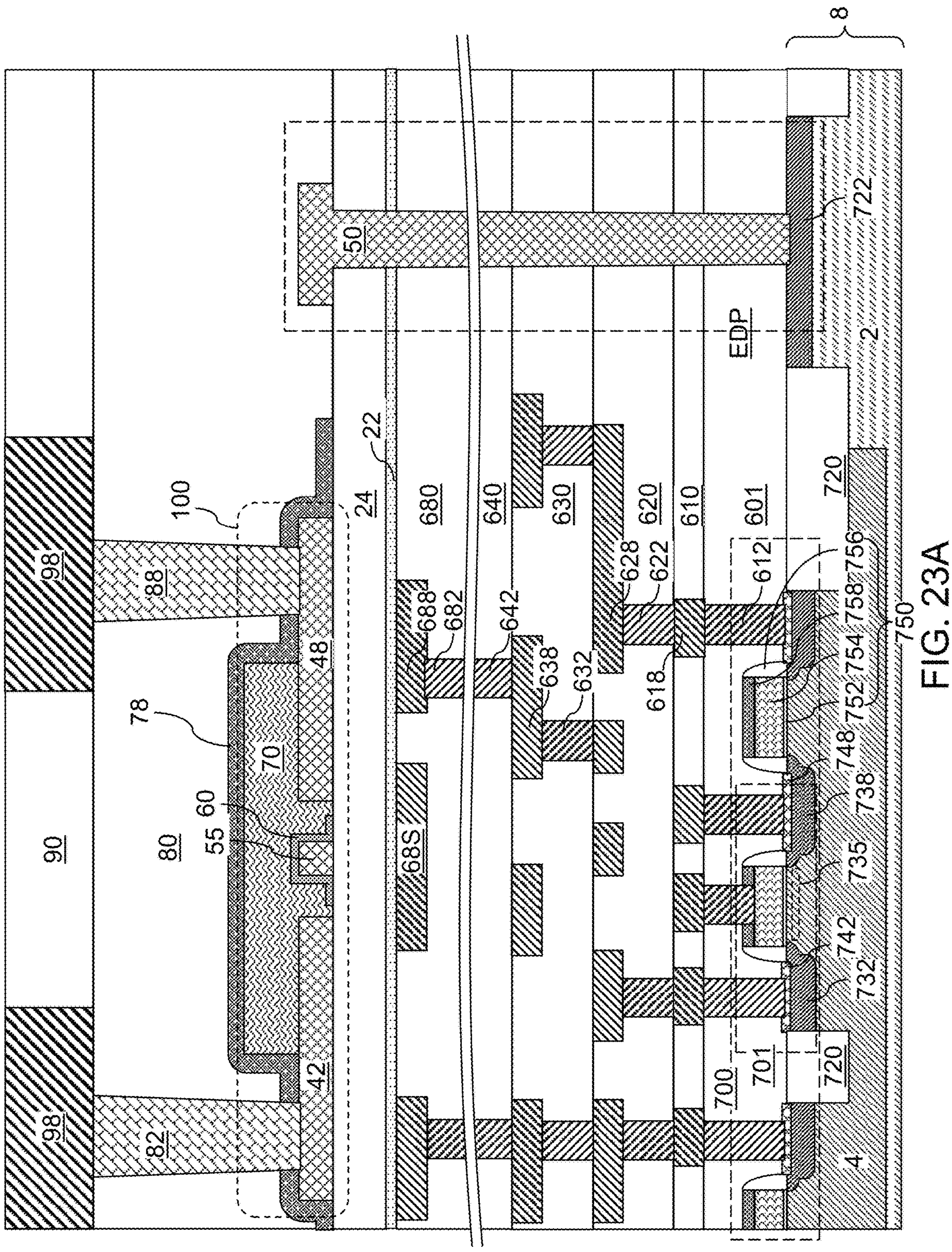
FIG. 23A is a vertical cross-sectional view of the fifth embodiment structure after formation of a line-level dielectric layer and metal line structures according to an embodiment of the present disclosure.
Figure 23B:
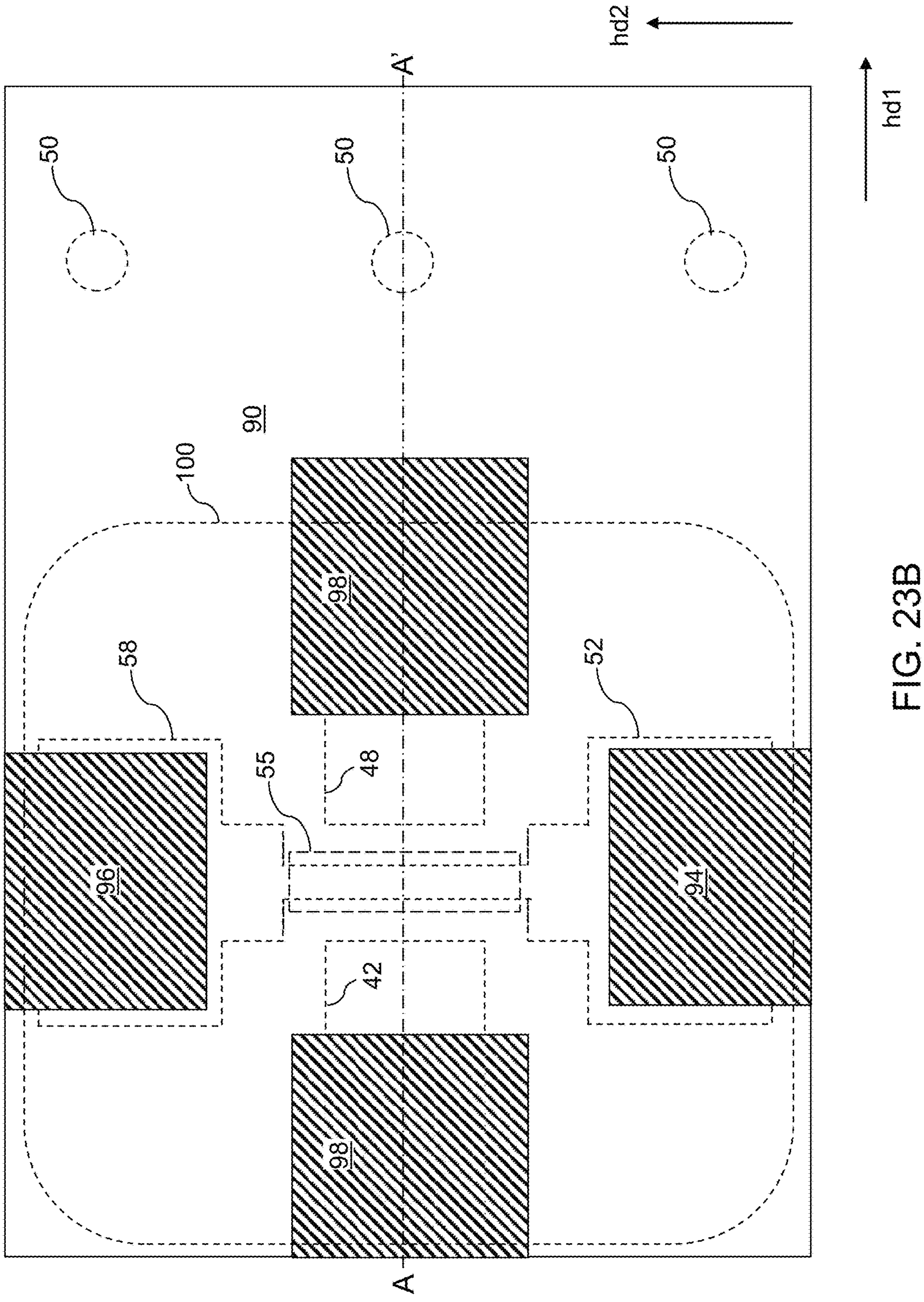
FIG. 23B is a top-down view of the fifth embodiment structure of FIG. 23A.

Referring to FIGS. 23A and 23B, the processing steps described with reference to FIGS. 5-11 may be performed to provide an RF switching circuit including phase change memory switches 100.

Figure 24A:
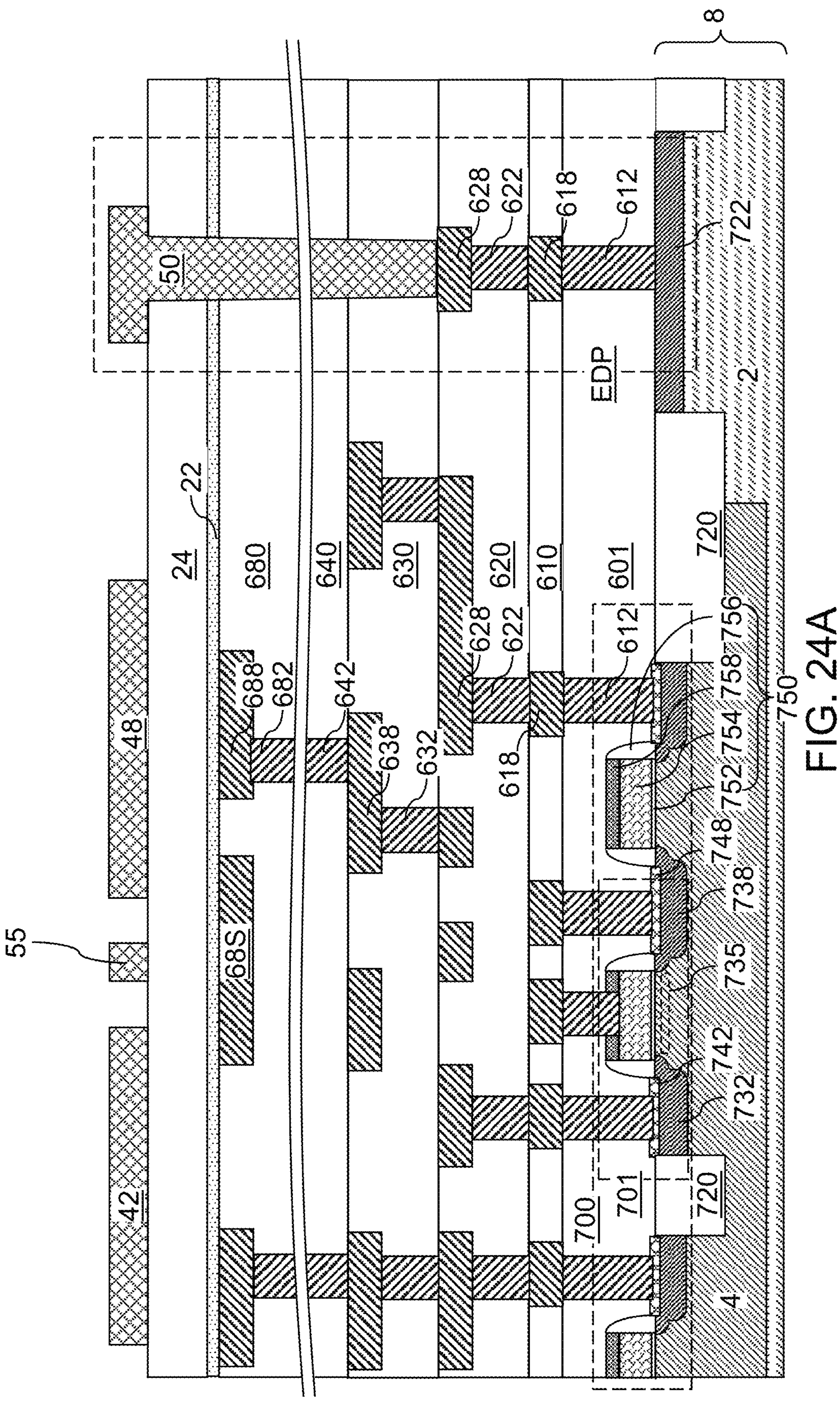
FIG. 24A is a vertical cross-sectional view of a sixth embodiment structure after formation of a heater element, a first electrode, a second electrode, and an electrostatic discharge metal structure according to embodiments of the present disclosure.
Figure 24B:
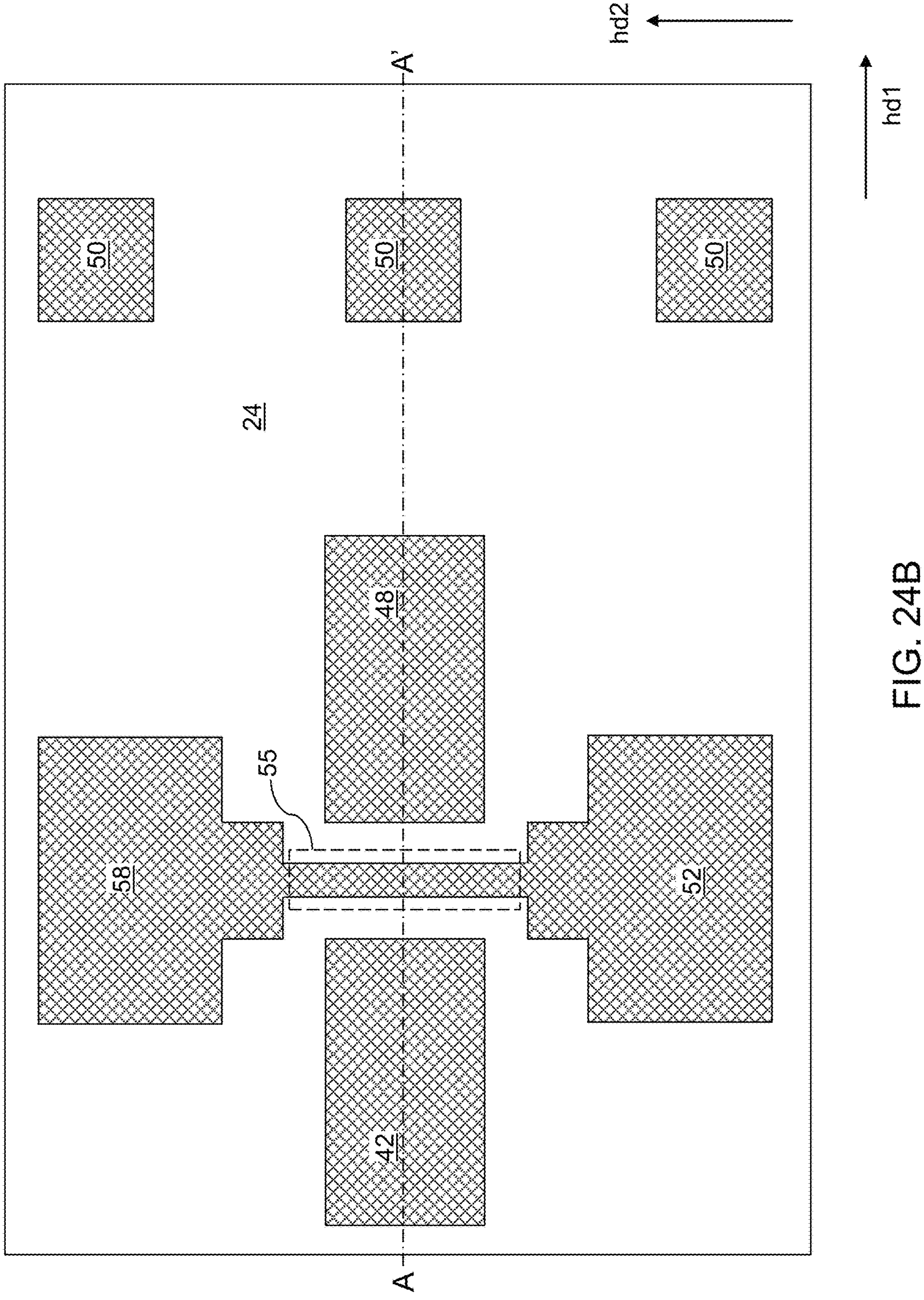
FIG. 24B is a top-down view of the sixth embodiment structure of FIG. 24A.

Referring to FIGS. 24A and 24B, a sixth embodiment structure of the present disclosure may be derived from the first embodiment structure illustrated in FIGS. 4A and 4B by removing one or more, but not all, of the metal interconnect structures within a subset of the metal interconnect structures (612, 618, 622, 628, 632, 638, 642, 682, 688) that is electrically connected to the doped semiconductor region 722. Thus, the electrostatic discharge path EDP as provided in the dielectric material layers (601, 610, 620, 630, 640, 680) in the sixth embodiment structure includes a bottom-most metal interconnect structure (such as a device contact via structure 612) but does not include a metal interconnect structure that is formed at the topmost level of the dielectric material layers (601, 610, 620, 630, 640, 680) (such as an eighth metal line structure 688). The locations of each via opening 29 (or a set of multiple via openings 29 if sets of multiple via openings 29 are formed as described with reference to FIGS. 15A and 15B) may be selected such that each via opening 29 is formed on a top surface segment of one of the metal interconnect structures (612, 618, 622, 628, 632, 638, 642, 682) within a contiguous set of metal interconnect structures (612, 618, 622, 628, 632, 638, 642, 682) that forms an electrostatic discharge path EDP.

In one embodiment, each electrostatic discharge metal structure 50 may be formed with a top surface that is formed in the horizontal plane including the top surfaces of the heater element (52, 55, 58), the first electrode 42, and the second electrode 48. In one embodiment, the top surface of one of the metal interconnect structures (612, 618, 622, 628, 632, 638, 642, 682, 688) (such as an eighth metal line structure 688) in an electrostatic discharge path EDP is located below a horizontal plane that contains a top surface of a topmost layer of the dielectric material layers (601, 610, 620, 630, 640, 680), such as the eighth interconnect-level dielectric material layer 680.

Figure 25A:
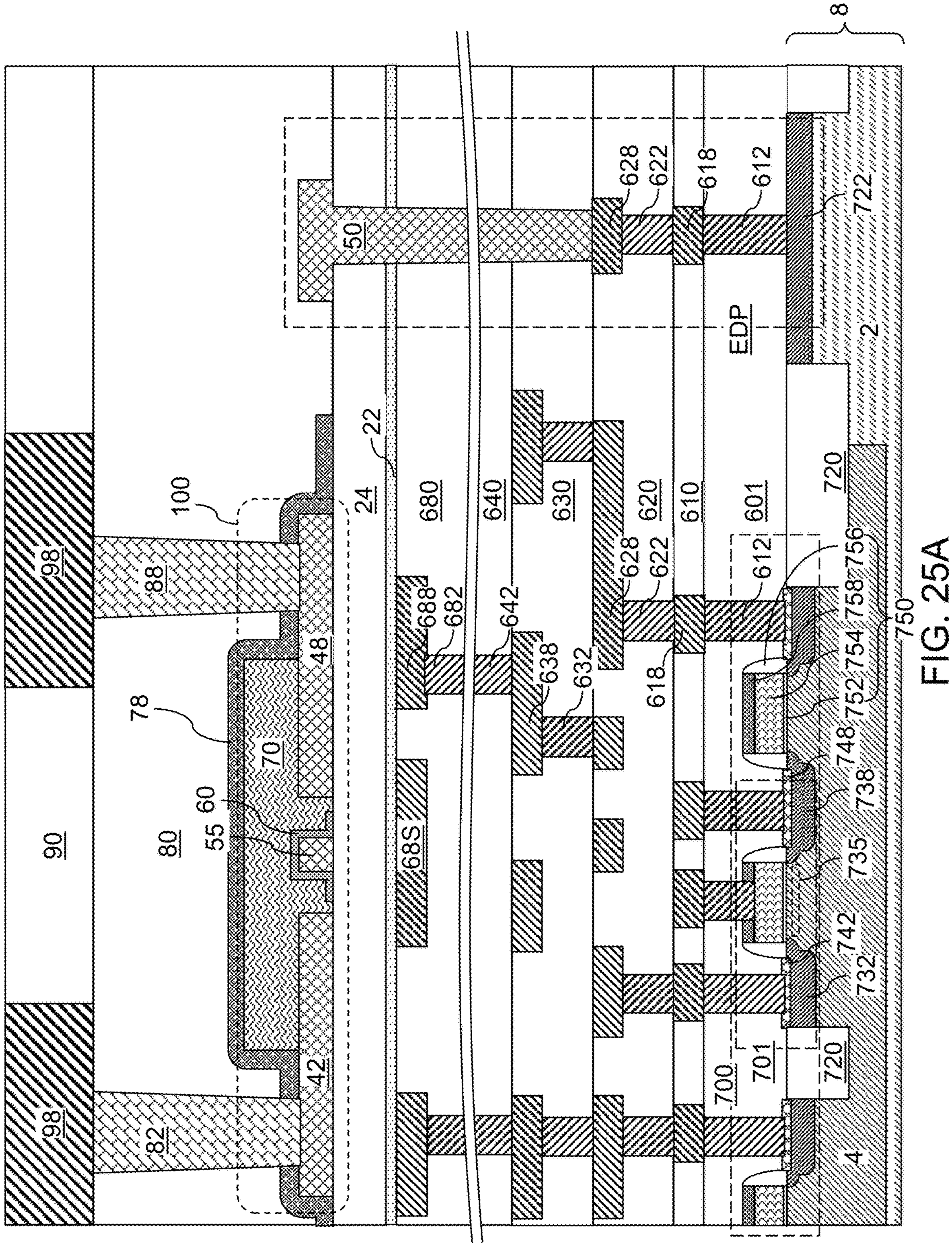
FIG. 25A is a vertical cross-sectional view of the sixth embodiment structure after formation of a line-level dielectric layer and metal line structures according to an embodiment of the present disclosure.
Figure 25B:
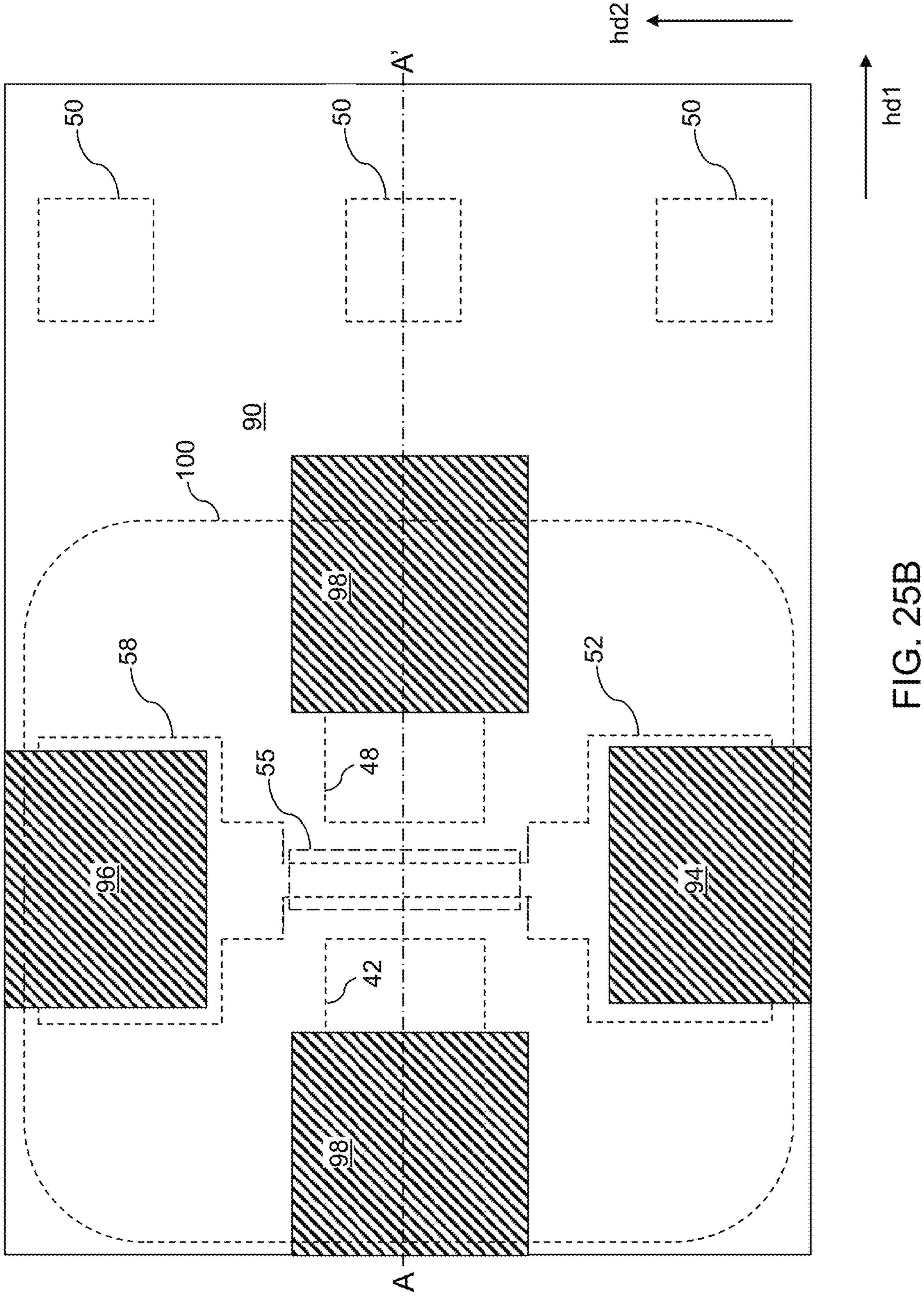
FIG. 25B is a top-down view of the sixth embodiment structure of FIG. 25A.

Referring to FIGS. 25A and 25B, the processing steps described with reference to FIGS. 5-11 may be performed to provide an RF switching circuit including phase change memory switches 100.

Figure 26A:
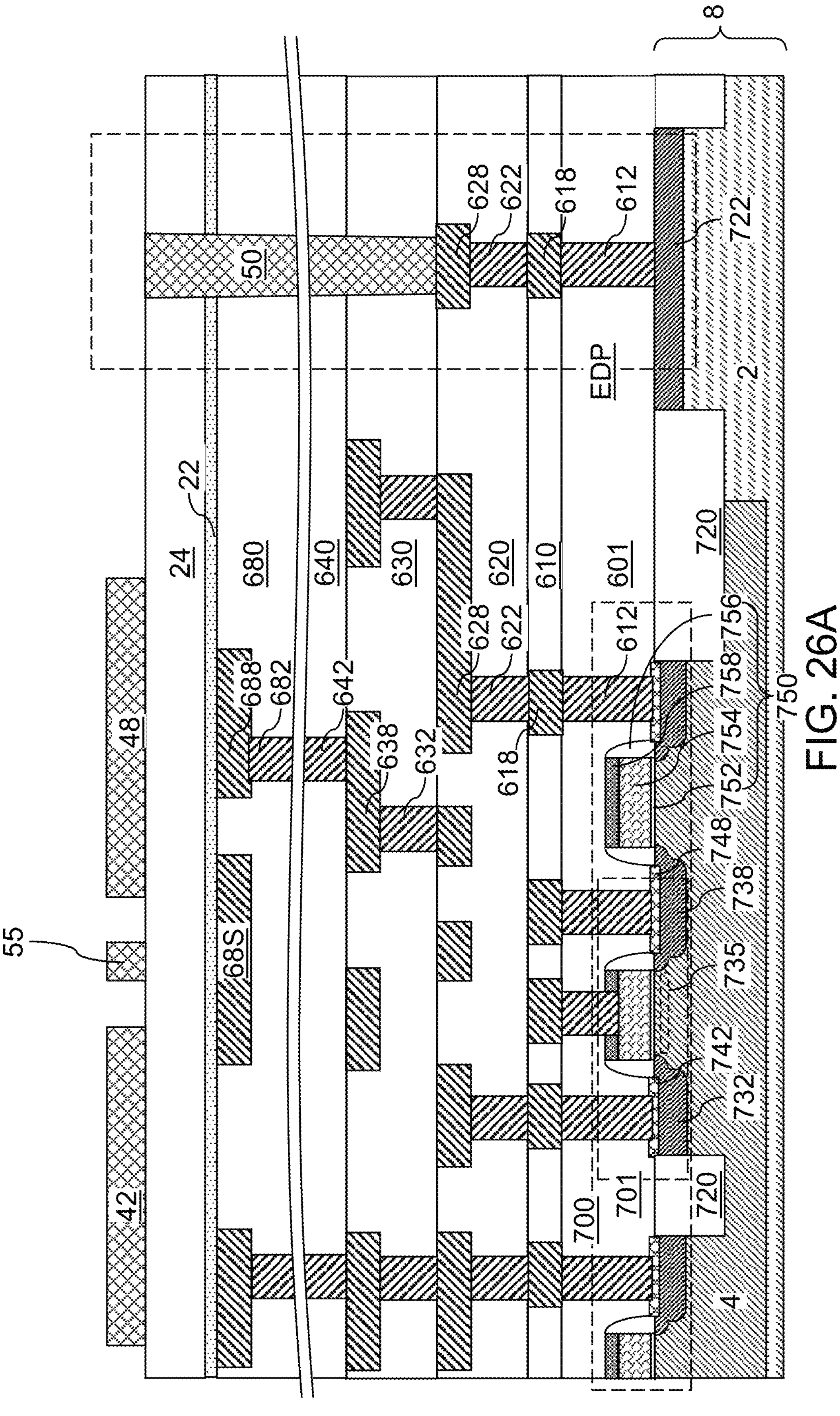
FIG. 26A is a vertical cross-sectional view of a seventh embodiment structure after formation of a heater element, a first electrode, a second electrode, and an electrostatic discharge metal structure according to embodiments of the present disclosure.
Figure 26B:
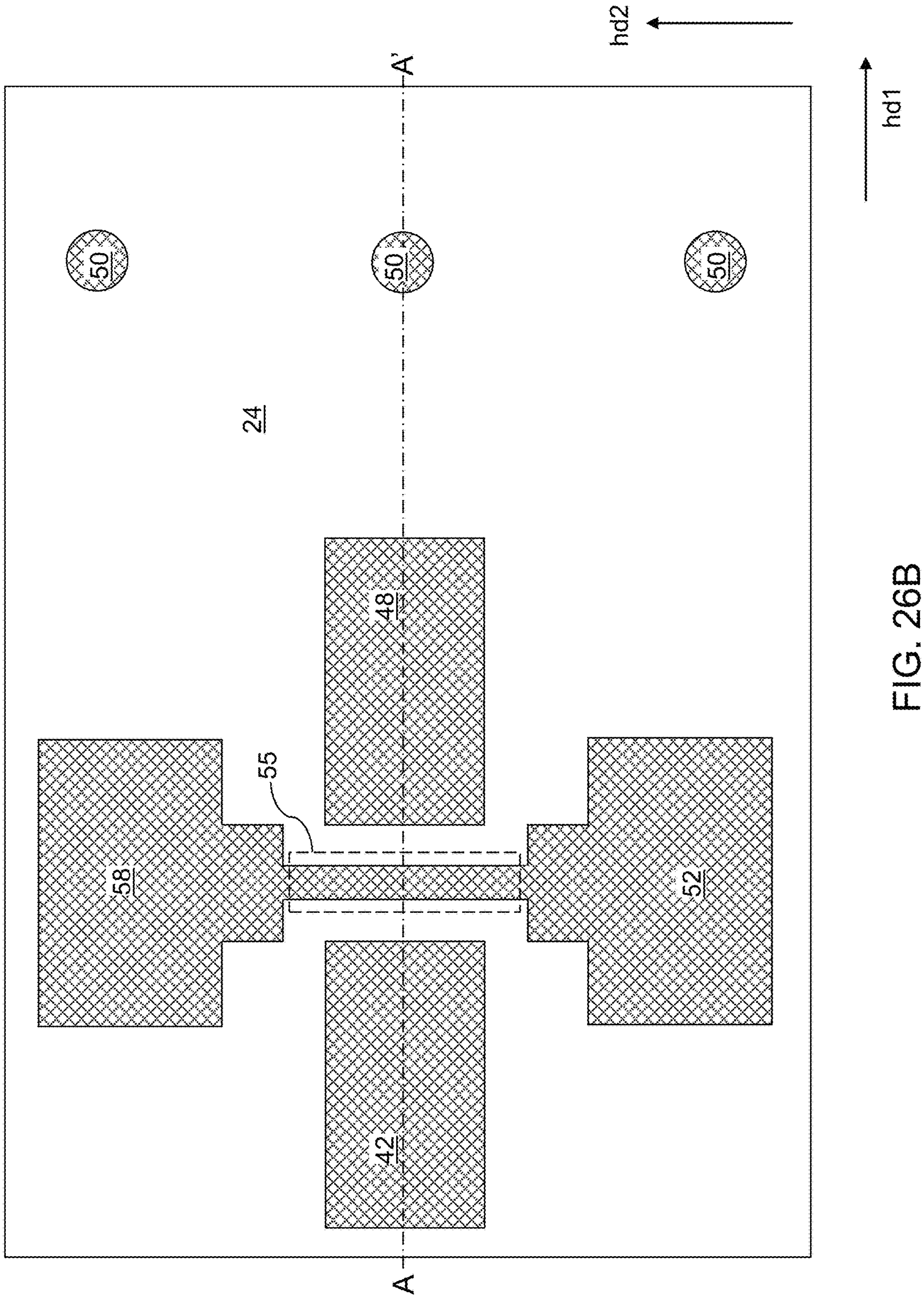
FIG. 26B is a top-down view of the seventh embodiment structure of FIG. 26A.

Referring to FIGS. 26A and 26B, a seventh embodiment structure of the present disclosure may be derived from the sixth embodiment structure illustrated in FIGS. 24A and 24B by alternating the pattern of the patterned etch mask layer that is used to pattern the metal layer 50L. Specifically, the patterned etch mask layer does not cover the areas of the via openings 29 during the anisotropic etch process that patterns the metal layer 50L. Thus, portions of the metal layer 50L that overlie the horizontal plane that contains the top surface of the insulating layer 24 are removed from the region in which the electrostatic discharge metal structures 50 are formed. In this embodiment, the top surface of each electrostatic discharge metal structure 50 may be formed within the horizontal plane that contains the bottom surface of the heater element (52, 55, 58).

Figure 27A:
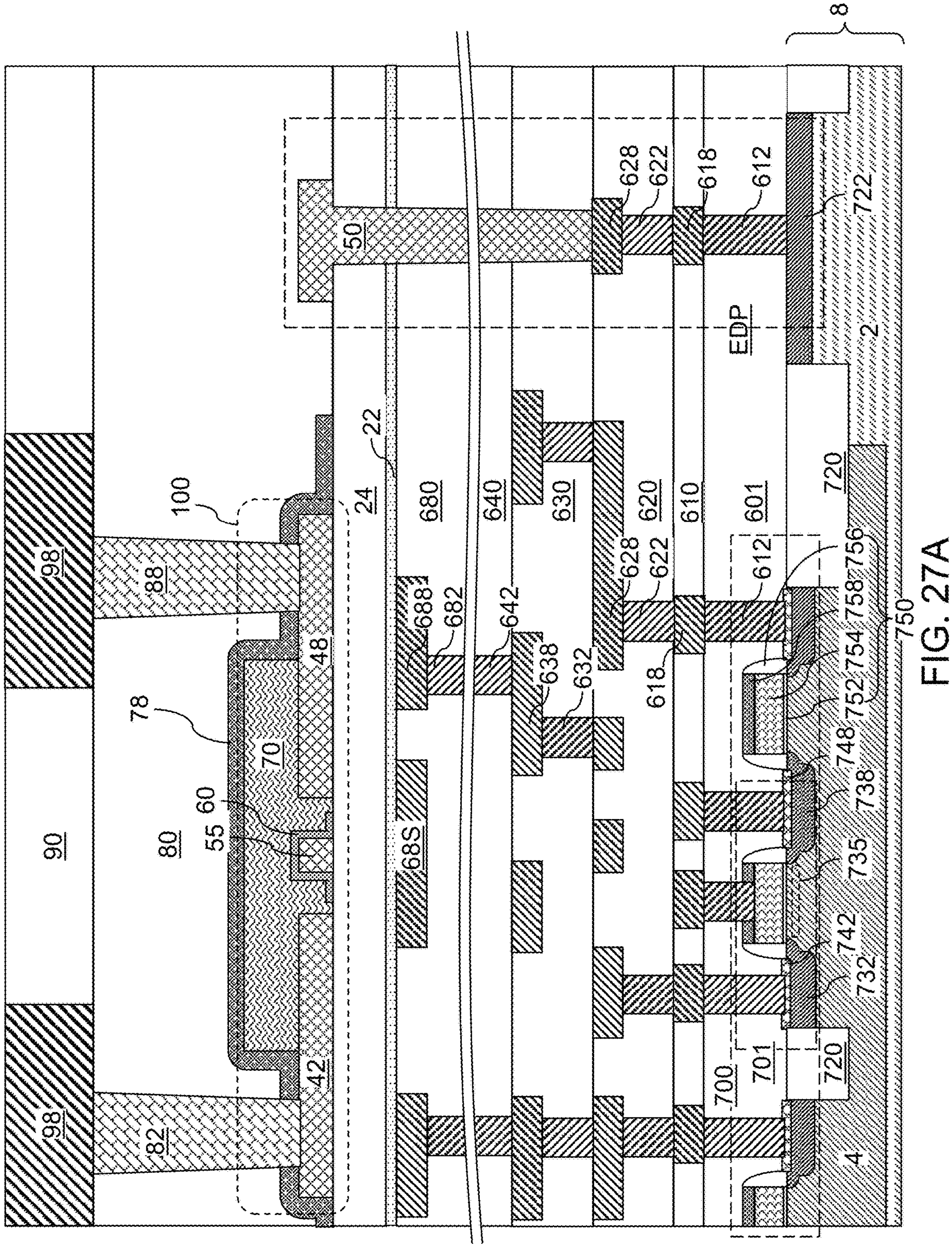
FIG. 27A is a vertical cross-sectional view of the seventh embodiment structure after formation of a line-level dielectric layer and metal line structures according to an embodiment of the present disclosure.
Figure 27B:
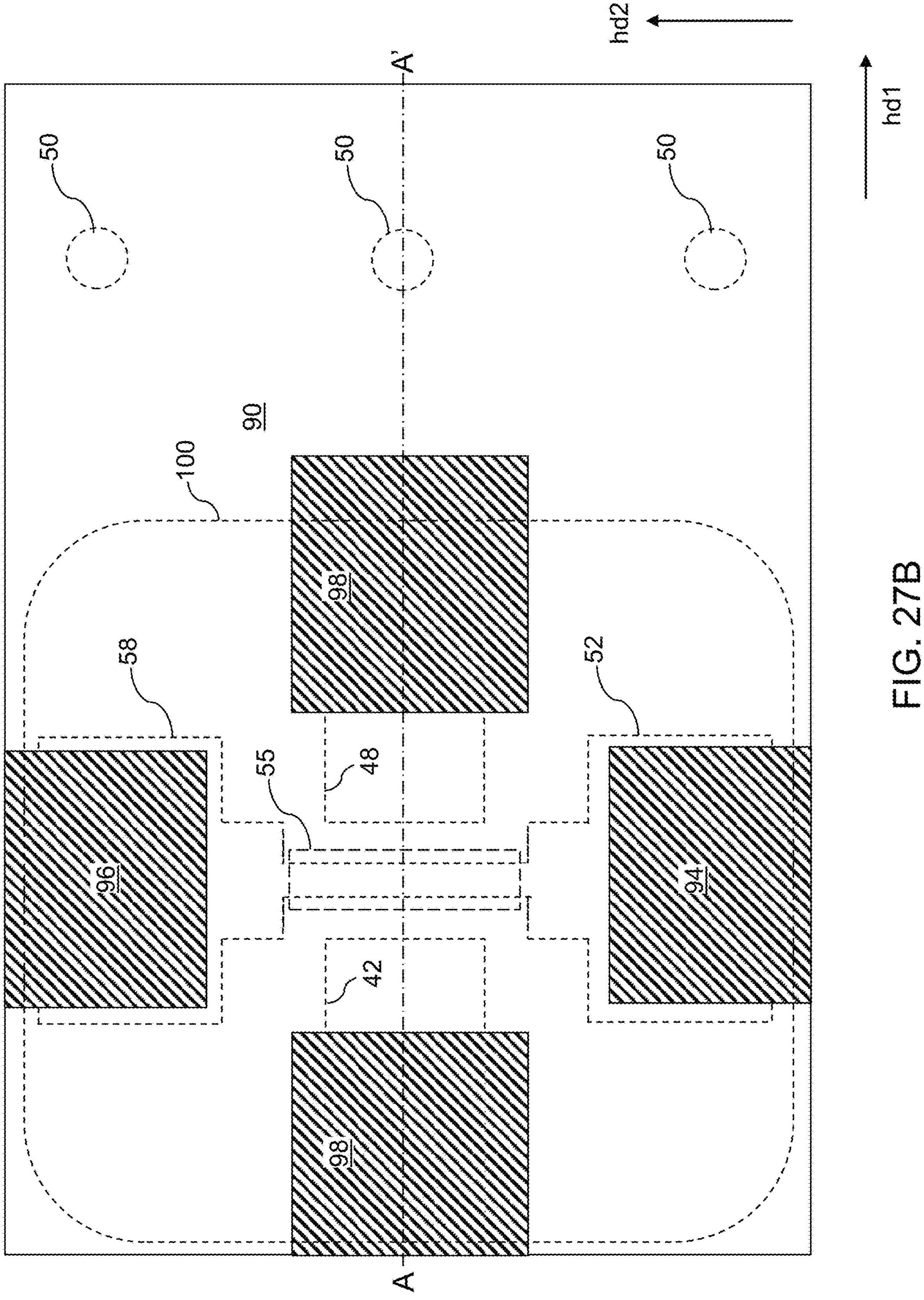
FIG. 27B is a top-down view of the seventh embodiment structure of FIG. 27A.

Referring to FIGS. 27A and 27B, the processing steps described with reference to FIGS. 5-11 may be performed to provide an RF switching circuit including phase change memory switches 100.

Figure 28:
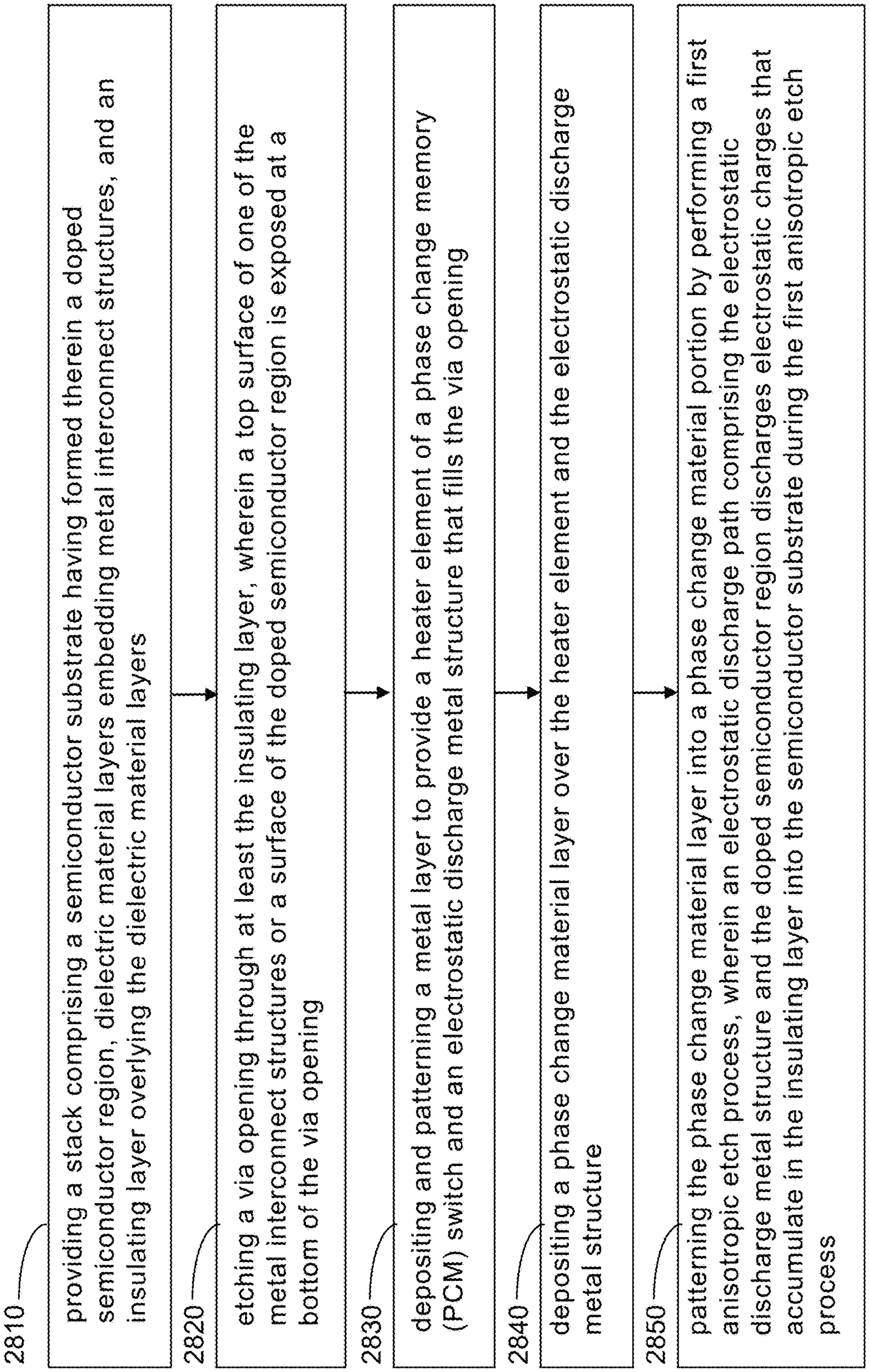
FIG. 28 is a first flowchart that illustrates general processing steps for manufacturing a device structure according to embodiments of the present disclosure.

FIG. 28 is a first flowchart that illustrates general processing steps for manufacturing a device structure according to embodiments of the present disclosure.

Referring to step 2810 and FIGS. 1, 13A and 13B, 15A and 15B, 17, 22A and 22B, 24A and 24B, and 26A and 26B, a stack comprising a semiconductor substrate 8 embedding a doped semiconductor region 722, dielectric material layers (601, 610, 620, 630, 640, 680) having metal interconnect structures (612, 618, 622, 628, 632, 638, 642, 682, 688) formed therein, and an insulating layer 24 overlying the dielectric material layers (601, 610, 620, 630, 640, 680) may be provided.

Referring to step 2820 and FIGS. 2, 13A and 13B, 15A and 15B, 18, 22A and 22B, 24A and 24B, and 26A and 26B, a via opening 29 may be etched through at least the insulating layer 24. A top surface of one of the metal interconnect structures (612, 618, 622, 628, 632, 638, 642, 682, 688) or a surface of the doped semiconductor region 722 is exposed at a bottom of the via opening 29.

Referring to step 2830 and FIGS. 3, 4A, 4B, 13A and 13B, 15A and 15B, 20A and 20B, 22A and 22B, 24A and 24B, and 26A and 26B, a metal layer 50L may be deposited and patterned to provide a heater element (52, 55, 58) of a phase change memory (PCM) switch 100 and an electrostatic discharge metal structure 50 that fills the via opening 29.

Referring to step 2840 and FIGS. 5-7, 14A and 14B, 16A and 16B, 21A and 21B, 23A and 23B, 25A and 25B, and 27A and 27B, a phase change material layer 70L may be deposited over the heater element (52, 55, 58) and the electrostatic discharge metal structure 50.

Referring to step 2850 and FIGS. 8A-11, 14A and 14B, 16A and 16B, 21A and 21B, 23A and 23B, 25A and 25B, and 27A and 27B, the phase change material layer 70L may be patterned into a phase change material portion 70 by performing a first anisotropic etch process. An electrostatic discharge path EDP comprising the electrostatic discharge metal structure 50 and the doped semiconductor region 722 discharges electrostatic charges that accumulate in the insulating layer 24 into the semiconductor substrate 8 during the first anisotropic etch process.

In one embodiment, the top surface of said one of the metal interconnect structures (612, 618, 622, 628, 632, 638, 642, 682, 688) may be exposed at the bottom of the via opening 29; and the metal layer 50L may be deposited directly on the top surface of said one of the metal interconnect structures (612, 618, 622, 628, 632, 638, 642, 682, 688). In one embodiment, the surface of the doped semiconductor region 722 may be exposed at the bottom of the via opening 29; and the metal layer 50L may be deposited directly on the surface of the doped semiconductor region 722. In one embodiment, the method may also include the steps of: depositing a continuous thermally-conductive and electrically-insulating layer 60L over the heater element (52, 55, 58) and the electrostatic discharge metal structure 50; masking a portion of the continuous thermally-conductive and electrically-insulating layer 60L with a patterned etch mask; and etching an unmasked portion of the continuous thermally-conductive and electrically-insulating layer 60L by performing an additional anisotropic etch process, wherein the electrostatic discharge path discharges electrostatic charges that accumulate in the insulating layer into the semiconductor substrate 8 during the additional anisotropic etch process. In one embodiment, patterned portions of the metal layer 50L comprise a first electrode 42 of the PCM switch and a second electrode 48 of the PCM switch; and a strip portion 55 of the heater element (52, 55, 58) laterally extends between the first electrode 42 and the second electrode 48. In one embodiment, the method may include forming a thermally-conductive and electrically-insulating layer 60L over the heater element (52, 55, 58), wherein the phase change material layer 70L is deposited over the thermally-conductive and electrically-insulating layer 60L, the first electrode 42, the second electrode 48, and the electrostatic discharge metal structure 50. In one embodiment, the phase change material layer is deposited directly on a top surface and sidewalls of the first electrode, and directly on a top surface and sidewalls of the second electrode; the phase change material portion 70 covers a first segment of the top surface of the first electrode 42 and a first segment of the top surface of the second electrode 48; and a second segment of the top surface of the first electrode 42 and a second segment of the top surface of the second electrode 48 are not covered by the phase change material portion 70 after performing the first anisotropic etch process. In one embodiment, the method may include: depositing a continuous conformal dielectric capping layer over the phase change material portion 70, the first electrode 42, the second electrode 48, and the electrostatic discharge metal structure 50; and patterning the continuous conformal dielectric capping layer into a conformal dielectric capping layer 22 that covers the phase change material portion 70, the first electrode 42, and the second electrode 48, and does not cover the electrostatic discharge metal structure 50 by performing a second anisotropic etch process, wherein the electrostatic discharge path discharges electrostatic charges that accumulate in the insulating layer into the semiconductor substrate 8 during the second anisotropic etch process. In one embodiment, the method may include: depositing a via-level dielectric layer 80 over the conformal dielectric capping layer 22; forming via cavities through the via-level dielectric layer 80 and the conformal dielectric capping layer 22 over the first electrode 42, over the second electrode 48, over a first terminal portion of the heater element (52, 55, 58), and over a second terminal portion of the heater element (52, 55, 58) by performing a third anisotropic etch process, wherein the electrostatic discharge path discharges electrostatic charges that accumulate in the insulating layer into the semiconductor substrate 8 during the third anisotropic etch process; and forming contact via structures within the via cavities (82, 84, 86, 88).

Figure 29:
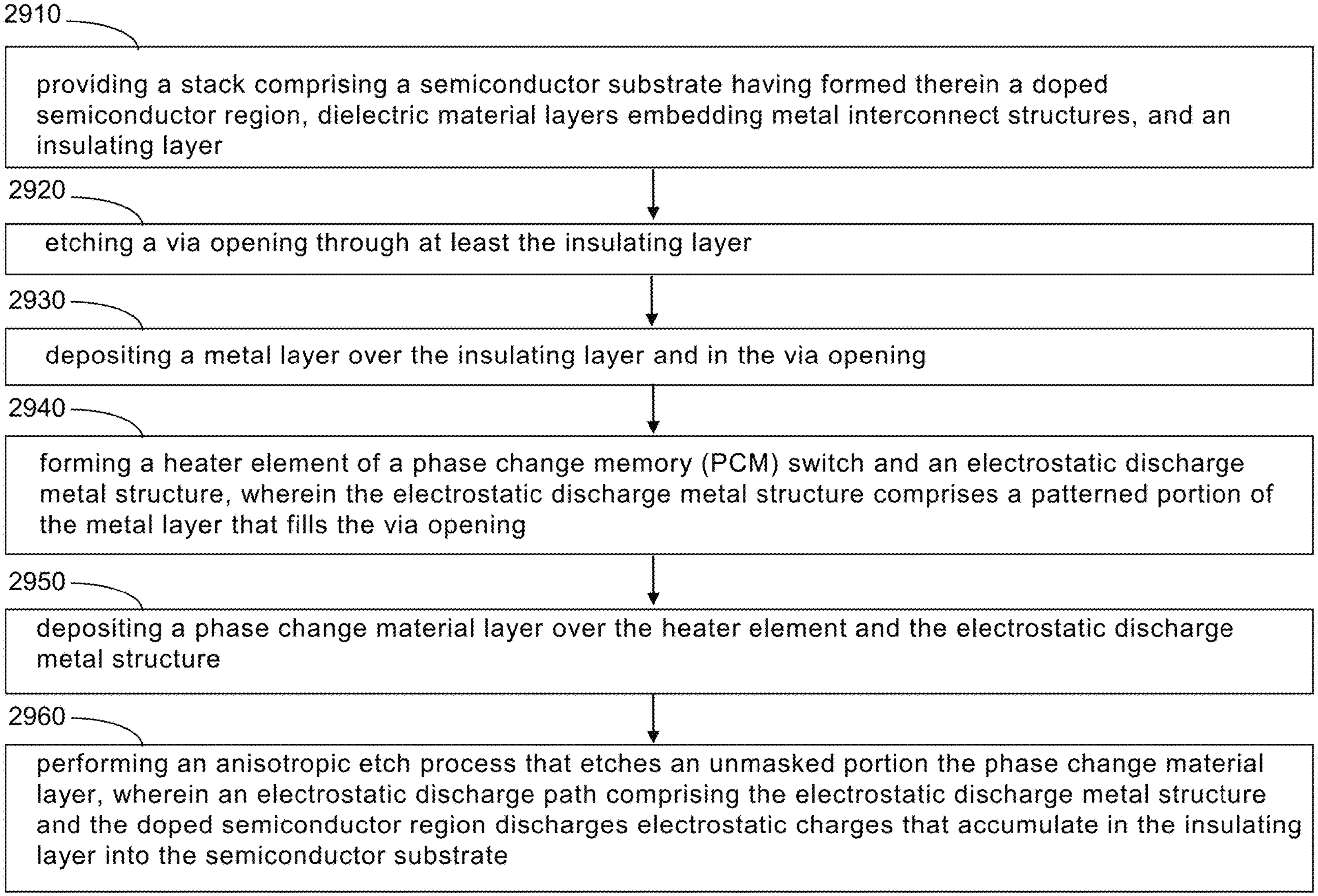
FIG. 29 is a second flowchart that illustrates general processing steps for manufacturing a device structure according to embodiments of the present disclosure.

FIG. 29 is a second flowchart that illustrates general processing steps for manufacturing a device structure according to embodiments of the present disclosure.

Referring to step 2910 and FIGS. 1, 13A and 13B, 15A and 15B, 17, 22A and 22B, 24A and 24B, and 26A and 26B, a stack comprising a semiconductor substrate 8 embedding a doped semiconductor region 722, dielectric material layers (601, 610, 620, 630, 640, 680) embedding metal interconnect structures (612, 618, 622, 628, 632, 638, 642, 682, 688), and an insulating layer 24 may be provided.

Referring to step 2920 and FIGS. 2, 13A and 13B, 15A and 15B, 18, 22A and 22B, 24A and 24B, and 26A and 26B, a via opening 29 may be etched through at least the insulating layer 24. A top surface of one of the metal interconnect structures (612, 618, 622, 628, 632, 638, 642, 682, 688) or a surface of the doped semiconductor region 722 is exposed at a bottom of the via opening 29.

Referring to step 2930 and FIGS. 3, 13A and 13B, 15A and 15B, 20A and 20B, 22A and 22B, 24A and 24B, and 26A and 26B, a metal layer 50L may be deposited over the insulating layer 24 and in the via opening 29.

Referring to step 2940 and FIGS. 4A, 4B, 13A and 13B, 15A and 15B, 20A and 20B, 22A and 22B, 24A and 24B, and 26A and 26B, a heater element (52, 55, 58) of a phase change memory (PCM) switch 100 and an electrostatic discharge metal structure 50 may be formed. The electrostatic discharge metal structure 50 comprises a patterned portion of the metal layer 50L that fills the via opening 29.

Referring to step 2950 and FIGS. 5-7, 14A and 14B, 16A and 16B, 21A and 21B, 23A and 23B, 25A and 25B, and 27A and 27B, a phase change material layer 70L may be deposited over the heater element (52, 55, 58) and the electrostatic discharge metal structure 50.

Referring to step 2960 and FIGS. 8A-11, 14A and 14B, 16A and 16B, 21A and 21B, 23A and 23B, 25A and 25B, and 27A and 27B, an anisotropic etch process that etches an unmasked portion of the phase change material layer 70L may be performed. An electrostatic discharge path EDP comprising the electrostatic discharge metal structure 50 and the doped semiconductor region 722 discharges electrostatic charges that accumulate in the insulating layer 24 into the semiconductor substrate 8.

Figure 30:
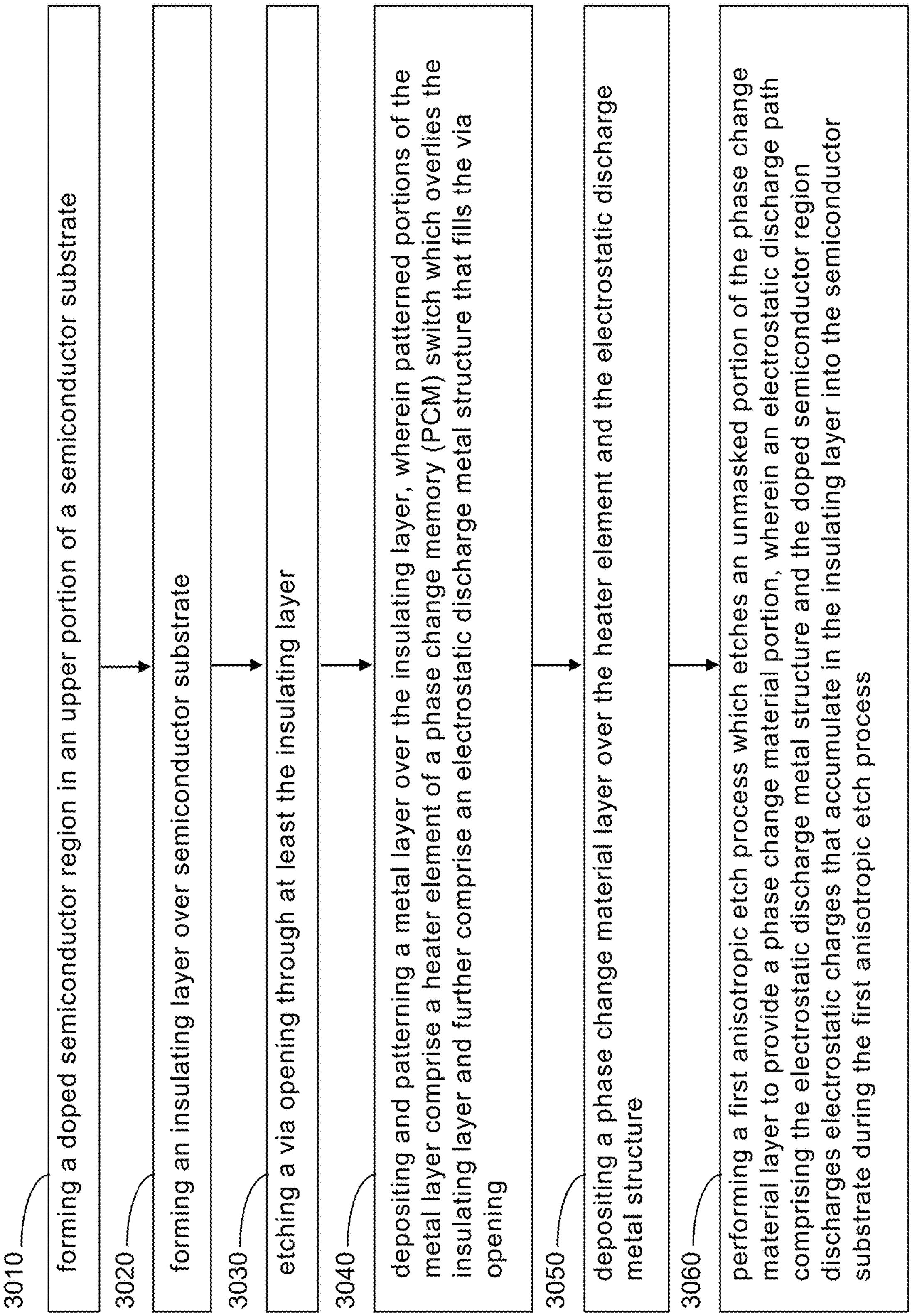
FIG. 30 is a third flowchart that illustrates general processing steps for manufacturing a device structure according to embodiments of the present disclosure.

FIG. 30 is a third flowchart that illustrates general processing steps for manufacturing a device structure according to embodiments of the present disclosure.

Referring to step 3010 and FIGS. 1, 13A and 13B, 15A and 15B, 17, 22A and 22B, 24A and 24B, and 26A and 26B, a doped semiconductor region 722 may be formed in an upper portion of a semiconductor substrate 8.

Referring to step 3020 and FIGS. 1, 13A and 13B, 15A and 15B, 17, 22A and 22B, 24A and 24B, and 26A and 26B, an insulating layer 24 may be deposited over semiconductor substrate 8.

Referring to step 3030 and FIGS. 2, 13A and 13B, 15A and 15B, 18, 22A and 22B, 24A and 24B, and 26A and 26B, a via opening 29 may be etched through at least the insulating layer 24.

Referring to step 3040 and FIGS. 3, 4A, 4B, 13A and 13B, 15A and 15B, 20A and 20B, 22A and 22B, 24A and 24B, and 26A and 26B, a metal layer 50L may be deposited and patterned over the insulating layer 24. Patterned portions of the metal layer 50L comprise a heater element (52, 55, 58) of a phase change memory (PCM) switch 100 which overlies the insulating layer 24 and further comprise an electrostatic discharge metal structure 50 that fills the via opening 29.

Referring to step 3050 and FIGS. 5-7, 14A and 14B, 16A and 16B, 21A and 21B, 23A and 23B, 25A and 25B, and 27A and 27B, a phase change material layer 70L may be deposited over the heater element (52, 55, 58) and the electrostatic discharge metal structure 50.

Referring to step 3060 and FIGS. 8A-11, 14A and 14B, 16A and 16B, 21A and 21B, 23A and 23B, 25A and 25B, and 27A and 27B, a first anisotropic etch process that etches an unmasked portion of the phase change material layer 70L may be performed to provide a phase change material portion 70. An electrostatic discharge path EDP comprising the electrostatic discharge metal structure 50 and the doped semiconductor region 722 discharges electrostatic charges that accumulate in the insulating layer 24 into the semiconductor substrate 8.

The three flowcharts shown in FIGS. 28, 29, and 30 do not represent three different inventions or three different methods of forming a device structure including at least one phase change memory switch 100. Rather, the three flowcharts shown in FIGS. 28, 29, and 30 illustrate exemplary combinations of features that may be manifested during a same processing scheme for forming a device structure including at least one phase change memory switch 100. Thus, it is possible to use all of the features described in the three flowcharts, to use only common features among the three flowcharts, or to selectively use features in one or more of the flowcharts.

Referring to all drawings and according to various embodiments of the present disclosure, a device structure is provided, which comprises: semiconductor devices 701 located on a semiconductor substrate 8; a doped semiconductor region 722 located in an upper portion of the semiconductor substrate 8; dielectric material layers (601, 610, 620, 630, 640, 680) located over the semiconductor devices 701 and having metal interconnect structures (612, 618, 622, 628, 632, 638, 642, 682, 688) formed therein; an insulating layer 24 formed over the dielectric material layers (601, 610, 620, 630, 640, 680); a phase change memory (PCM) switch 100 located over the insulating layer 24, wherein the phase change memory switch 100 comprises a heater element (52, 55, 58) comprising a second portion of a set of at least one metallic material; and an electrostatic discharge path EDP comprising the doped semiconductor region 722 and an electrostatic discharge metal structure 50 which vertically extends through the insulating layer 24, comprises a first portion of the set of at least one metallic material, and is electrically connected to the doped semiconductor region 722.

In one embodiment, a bottom surface of the heater element (52, 55, 58) contacts a segment of a top surface of the insulating layer 24; and the electrostatic discharge metal structure 50 has a same material composition as the heater element (52, 55, 58). In one embodiment, a top surface of the electrostatic discharge metal structure 50 is located within a horizontal plane including a top surface of the heater element (52, 55, 58). In one embodiment, a top surface of the electrostatic discharge metal structure 50 is located within a horizontal plane including a bottom surface of the heater element (52, 55, 58). In one embodiment, the electrostatic discharge metal structure 50 comprises: a plurality of via portions that vertically extend through the insulating layer 24; and a plate portion that overlies the insulating layer 24 and each of the plurality of via portions.

According to another aspect of the present disclosure, a device structure is provided, which comprises: semiconductor devices 701 located on a semiconductor substrate 8 which contains a doped semiconductor region 722 therein; an insulating layer 24 overlying the semiconductor devices 701; a phase change memory (PCM) switch 100 located over the insulating layer 24, wherein the PCM switch 100 comprises a heater element (52, 55, 58) comprising a second portion of a set of at least one metallic material and contacting a top surface of the insulating layer 24; and an electrostatic discharge path EDP comprising the electrostatic discharge metal structure 50 and the doped semiconductor region 722, wherein the electrostatic discharge metal structure 50 comprises a first portion of the set of at least one metallic material.

In one embodiment, the device structure comprises dielectric material layers (601, 610, 620, 630, 640, 680) located over the semiconductor devices 701 and underneath the insulating layer 24 and having formed therein metal interconnect structures (612, 618, 622, 628, 632, 638, 642, 682, 688) therein. In one embodiment, a bottom surface of the electrostatic discharge metal structure 50 contacts a top surface of one of the metal interconnect structures (612, 618, 622, 628, 632, 638, 642, 682, 688). In one embodiment, a top surface of said one of the metal interconnect structures (612, 618, 622, 628, 632, 638, 642, 682, 688) is located within a horizontal plane that contains a top surface of a topmost layer of the dielectric material layers (601, 610, 620, 630, 640, 680). In one embodiment, a top surface of said one of the metal interconnect structures (612, 618, 622, 628, 632, 638, 642, 682, 688) is located below a horizontal plane that contains a top surface of a topmost layer of the dielectric material layers (601, 610, 620, 630, 640, 680). In one embodiment, the electrostatic discharge metal structure 50 vertically extends through the dielectric material layers (601, 610, 620, 630, 640, 680) and comprises a bottom surface that contacts the doped semiconductor region 722.

In one embodiment, the PCM switch 100 comprises: a first electrode 42 comprising a third portion of the set of at least one metallic material and laterally spaced from the heater element (52, 55, 58); a second electrode 48 comprising a fourth portion of the set of at least one metallic material and laterally spaced from the heater element (52, 55, 58); and a strip portion 55 of the heater element (52, 55, 58) laterally extends between the first electrode 42 and the second electrode 48. In one embodiment, the device structure comprises a thermally-conductive and electrically-insulating layer 60 contacting a top surface and sidewalls of the strip portion 55 of the heater element (52, 55, 58), and not directly contacting the first electrode 42 or the second electrode 48. In one embodiment, the phase change material portion 70 contacts a first segment of the top surface of the first electrode 42 and a first segment of the top surface of the second electrode 48; the phase change material portion 70 contacts an entirety of a widthwise sidewall and first segments of lengthwise sidewalls of the first electrode 42 and contacts an entirety of a widthwise sidewall and first segments of lengthwise sidewalls of the second electrode 48; and the widthwise sidewalls of the first electrode 42 and the second electrode 48 are parallel to lengthwise sidewalls of the strip portion 55 of the heater element (52, 55, 58).

In one embodiment, the device structure comprises a conformal dielectric capping layer 78 contacting a top surface and sidewalls of the phase change material portion 70, a portion of a top surface of the first electrode 42, and a portion of a top surface of the second electrode 48, and not contacting the electrostatic discharge metal structure 50. In one embodiment, the device structure comprises: a via-level dielectric layer 80 overlying the conformal dielectric capping layer 78; and contact via structures (82, 88, 84, 86) vertically extending through the via-level dielectric layer 80 and the conformal dielectric capping layer 78 and contacting a respective structure that is selected from the first electrode 42, the second electrode 48, a first terminal portion 52 of the heater element (52, 55, 58), and a second terminal portion 58 of the heater element (52, 55, 58).

According to yet another aspect of the present disclosure, a device structure is provided, which comprises: semiconductor devices 701 located on a semiconductor substrate 8 which contains a doped semiconductor region 722 therein; dielectric material layers (601, 610, 620, 630, 640, 680) located over the semiconductor devices 701 and metal interconnect structures (612, 618, 622, 628, 632, 638, 642, 682, 688) formed therein; an insulating layer 24 overlying the dielectric material layers (601, 610, 620, 630, 640, 680); a phase change memory (PCM) switch 100 located over the insulating layer 24, wherein the PCM switch 100 comprises a heater element (52, 55, 58) comprising a second portion of a set of at least one metallic material and contacting a top surface of the insulating layer 24; and an electrostatic discharge path EDP comprising the electrostatic discharge metal structure 50 and the doped semiconductor region 722, wherein the electrostatic discharge metal structure 50 comprises a first portion of the set of at least one metallic material and has a top surface that is located within a first horizontal plane including a top surface of the heater element (52, 55, 58) or within a second horizontal plane including a bottom surface of the heater element (52, 55, 58).

In one embodiment, a bottom surface of the electrostatic discharge metal structure 50 contacts a top surface of one of the metal interconnect structures (612, 618, 622, 628, 632, 638, 642, 682, 688) or a surface of the doped semiconductor region 722. In one embodiment, the electrostatic discharge metal structure 50 comprises a plurality of via portions that vertically extends at least through the insulating layer 24 and further comprises a plate portion that overlies, and is adjoined to top ends of, the plurality of via portions. In one embodiment, the set of at least one metallic material consists essentially of at least one metallic material that is selected from tungsten, tantalum, molybdenum, niobium, rhenium, tungsten nitride, tantalum nitride, titanium nitride, and molybdenum nitride.

The various embodiments of the present disclosure may be used to provide an electrostatic discharge path EDP that may be used to collect electrostatic charges at the level of phase change memory switches 100, and to route the collected electrostatic charges to a semiconductor substrate 8. The electrostatic discharge path EDP may comprise an electrostatic discharge metal structure 50 having a same material composition as a heater element (52, 55, 58) of the phase change memory switch 100. The electrostatic discharge metal structures 50 of the present disclosure may be formed by a minimal addition of processing steps for forming the via openings 29, and may provide effective protection from plasma-induced damages for the various components of the phase change memory switch 100 and for the metal routing, such as the metal line structures 98 and the metal pad structures 99, for the phase change memory switch 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device structure, comprising:

providing a stack comprising semiconductor substrate having formed therein a doped semiconductor region, dielectric material layers having metal interconnect structures formed therein, and an insulating layer overlying the dielectric material layers;

etching a via opening through at least the insulating layer, wherein a top surface of one of the metal interconnect structures or a surface of the doped semiconductor region is exposed at a bottom of the via opening;

depositing and patterning a metal layer to provide a heater element of a phase change memory (PCM) switch and an electrostatic discharge metal structure that fills the via opening;

depositing a phase change material layer over the heater element and the electrostatic discharge metal structure; and patterning the phase change material layer into a phase change material portion by performing a first anisotropic etch process, wherein an electrostatic discharge path comprising the electrostatic discharge metal structure and the doped semiconductor region discharges electrostatic charges that accumulate in the insulating layer into the semiconductor substrate during the first anisotropic etch process.

2. The method of claim 1, wherein:

the top surface of said one of the metal interconnect structures is exposed at the bottom of the via opening; and the metal layer is deposited directly on the top surface of said one of the metal interconnect structures.

3. The method of claim 1, wherein:

the surface of the doped semiconductor region is exposed at the bottom of the via opening; and the metal layer is deposited directly on the surface of the doped semiconductor region.

4. The method of claim 1, further comprising:

depositing a continuous thermally-conductive and electrically-insulating layer over the heater element and the electrostatic discharge metal structure;

masking a portion of the continuous thermally-conductive and electrically-insulating layer with a patterned etch mask; and etching an unmasked portion of the continuous thermally-conductive and electrically-insulating layer by performing an additional anisotropic etch process, wherein the electrostatic discharge path discharges electrostatic charges that accumulate in the insulating layer into the semiconductor substrate during the additional anisotropic etch process.

5. The method of claim 1, wherein:

patterned portions of the metal layer comprise a first electrode of the PCM switch and a second electrode of the PCM switch; and a strip portion of the heater element laterally extends between the first electrode and the second electrode.

6. The method of claim 5, further comprising forming a thermally-conductive and electrically-insulating layer over the heater element, wherein the phase change material layer is deposited over the thermally-conductive and electrically-insulating layer, the first electrode, the second electrode, and the electrostatic discharge metal structure.

7. The method of claim 5, wherein:

the phase change material layer is deposited directly on a top surface and sidewalls of the first electrode, and directly on a top surface and sidewalls of the second electrode;

the phase change material portion covers a first segment of the top surface of the first electrode and a first segment of the top surface of the second electrode; and a second segment of the top surface of the first electrode and a second segment of the top surface of the second electrode are not covered by the phase change material portion after performing the first anisotropic etch process.

8. The method of claim 7, further comprising:

depositing a continuous conformal dielectric capping layer over the phase change material portion, the first electrode, the second electrode, and the electrostatic discharge metal structure; and patterning the continuous conformal dielectric capping layer into a conformal dielectric capping layer that covers the phase change material portion, the first electrode, and the second electrode, and does not cover the electrostatic discharge metal structure by performing a second anisotropic etch process, wherein the electrostatic discharge path discharges electrostatic charges that accumulate in the insulating layer into the semiconductor substrate during the second anisotropic etch process.

9. The method of claim 8, further comprising:

depositing a via-level dielectric layer over the conformal dielectric capping layer;

forming via cavities through the via-level dielectric layer and the conformal dielectric capping layer over the first electrode, over the second electrode, over a first terminal portion of the heater element, and over a second terminal portion of the heater element by performing a third anisotropic etch process, wherein the electrostatic discharge path discharges electrostatic charges that accumulate in the insulating layer into the semiconductor substrate during the third anisotropic etch process; and forming contact via structures within the via cavities.

10. The method of claim 1, wherein the metal layer consists essentially of a set of at least one metallic material that is selected from tungsten, tantalum, molybdenum, niobium, rhenium, tungsten nitride, tantalum nitride, titanium nitride, and molybdenum nitride.

11. The method of claim 1, further comprising etching at least one additional via opening through at least the insulating layer, whereby multiple top surface segments of the metal interconnect structures or multiple top surface segments of the doped semiconductor region are exposed, and wherein the electrostatic discharge metal structure comprises at least one additional patterned portion of the metal layer that fills the at least one additional via opening, and further comprises a plate portion which is another patterned portion of the metal layer that overlies the via opening and each of the at least one additional via opening.

12. A method of forming a device structure, comprising:

providing a stack comprising a semiconductor substrate embedding a doped semiconductor region, dielectric material layers having formed therein metal interconnect structures, and an insulating layer;

etching a via opening through at least the insulating layer;

depositing a metal layer overlying the insulating layer and in the via opening;

forming a heater element of a phase change memory (PCM) switch and an electrostatic discharge metal structure, wherein the electrostatic discharge metal structure comprises a patterned portion of the metal layer that fills the via opening;

depositing a phase change material layer over the heater element and the electrostatic discharge metal structure; and performing an anisotropic etch process that etches an unmasked portion of the phase change material layer, wherein an electrostatic discharge path comprising the electrostatic discharge metal structure and the doped semiconductor region discharges electrostatic charges that accumulate in the insulating layer into the semiconductor substrate.

13. The method of claim 12, further comprising forming a patterned etch mask layer over the metal layer such that the patterned etch mask layer comprises a portion that covers an area of the via opening, wherein a top surface of the electrostatic discharge metal structure is formed within a horizontal plane that contains a top surface of the heater element.

14. The method of claim 13, further comprising forming a patterned etch mask layer over the metal layer such that the patterned etch mask layer does not cover an area of the via opening, wherein a top surface of the electrostatic discharge metal structure is formed within a horizontal plane that contains a bottom surface of the heater element.

15. The method of claim 12, wherein:

the semiconductor substrate comprises a semiconductor material layer having a doping of a first conductivity type; and the doped semiconductor region has a doping of a second conductivity type that is an opposite of the first conductivity type and is formed directly on the semiconductor material layer to provide a p-n junction.

16. A device structure comprising:

semiconductor devices located on a semiconductor substrate;

a doped semiconductor region located in an upper portion of the semiconductor substrate;

dielectric material layers located over the semiconductor devices and metal interconnect structures formed therein;

an insulating layer overing the dielectric material layers;

a phase change memory (PCM) switch located over the insulating layer, wherein the phase change memory switch comprises a heater element comprising a second portion of a set of at least one metallic material; and an electrostatic discharge path comprising the doped semiconductor region and an electrostatic discharge metal structure which vertically extends through the insulating layer, comprises a first portion of the set of at least one metallic material, and is electrically connected to the doped semiconductor region.

17. The device structure of claim 16, wherein:

a bottom surface of the heater element contacts a segment of a top surface of the insulating layer; and the electrostatic discharge metal structure has a same material composition as the heater element.

18. The device structure of claim 16, wherein a top surface of the electrostatic discharge metal structure is located within a horizontal plane including a top surface of the heater element.

19. The device structure of claim 16, wherein a top surface of the electrostatic discharge metal structure is located within a horizontal plane including a bottom surface of the heater element.

20. The device structure of claim 16, wherein the electrostatic discharge metal structure comprises:

a plurality of via portions that vertically extend through the insulating layer; and a plate portion that overlies the insulating layer and each of the plurality of via portions.

* * * * *